(12) United States Patent
Won et al.

(10) Patent No.: US 11,719,816 B2
(45) Date of Patent: Aug. 8, 2023

(54) LIDAR DEVICE

(71) Applicant: SOS LAB Co., Ltd., Gwangju (KR)

(72) Inventors: Bumsik Won, Seoul (KR); Suwoo Noh, Gwangju (KR); Gyeonghwan Shin, Gwangju (KR)

(73) Assignee: SOS LAB Co., Ltd., Gwangju (KR)

( * ) Notice: Subject to any disclaimer, the term of this patent is extended or adjusted under 35 U.S.C. 154(b) by 0 days.

(21) Appl. No.: 17/745,574

(22) Filed: May 16, 2022

(65) Prior Publication Data

US 2023/0168376 A1 Jun. 1, 2023

(30) Foreign Application Priority Data

Nov. 30, 2021 (KR) .......................... 10-2021-0168211
Nov. 30, 2021 (KR) .......................... 10-2021-0168212
Nov. 30, 2021 (KR) .......................... 10-2021-0168213

(51) Int. Cl.
*G01S 17/10* (2020.01)
*H01L 31/107* (2006.01)
(Continued)

(52) U.S. Cl.
CPC .............. *G01S 17/10* (2013.01); *G01S 7/481* (2013.01); *G01S 7/484* (2013.01); *G01S 7/4811* (2013.01);
(Continued)

(58) Field of Classification Search
CPC ...... G01S 7/481; G01S 7/4811; G01S 7/4813; G01S 7/4814; G01S 7/4816; G01S 7/484;
(Continued)

(56) References Cited

U.S. PATENT DOCUMENTS 4,397,528 A * 8/1983 Kamata .................. G02B 7/105
359/702
2013/0114153 A1* 5/2013 Lu ......................... H04N 5/2257
359/819

(Continued)

FOREIGN PATENT DOCUMENTS

JP H0677608 A * 3/1994 ............... G06K 7/10
JP 2001228382 A 8/2001
(Continued)

OTHER PUBLICATIONS

PCT International Search Report and Written Opinion, PCT Application No. PCT/KR2021/017836, dated Aug. 26, 2022, 15 pages.

*Primary Examiner* — Yuqing Xiao
*Assistant Examiner* — Benjamin Richard Hebert
(74) *Attorney, Agent, or Firm* — Knobbe, Martens, Olson & Bear, LLP

(57) ABSTRACT

A light detection and ranging (LiDAR) device comprising: a laser emitting chip configured to emit laser, a laser detecting chip configured to detect laser, an emitting optic module configured to guide laser generated from the laser emitting chip to the outside of the LiDAR device, a detecting optic module configured to guide laser received from the outside of the LiDAR device to the laser detecting chip, an emitting optic holder located between the laser emitting chip and the emitting optic module, and an at least one emitting optic fixer located between the emitting optic holder and the emitting optic module, wherein the at least one emitting optic fixer is configured to fix a relative position between the laser emitting chip and the emitting optic module.

12 Claims, 69 Drawing Sheets

(51) Int. Cl.
   *G01S 7/4863*   (2020.01)
   *G01S 7/484*    (2006.01)
   *G01S 7/481*    (2006.01)
   *G02B 7/00*     (2021.01)
   *G02B 6/12*     (2006.01)

(52) U.S. Cl.
   CPC ............ *G01S 7/4863* (2013.01); *G02B 7/003* (2013.01); *H01L 31/107* (2013.01); *G02B 2006/12083* (2013.01); *G02B 2006/12102* (2013.01)

(58) Field of Classification Search
   CPC ........ G01S 7/486; G01S 7/4863; G01S 17/10; G02B 2006/12083; G02B 2006/12102; G02B 7/02; B24B 9/146; B29D 11/00807; H01L 31/107
   See application file for complete search history.

(56) References Cited

U.S. PATENT DOCUMENTS

| | | | | |
|---|---|---|---|---|
| 2019/0179028 A1* | 6/2019 | Pacala | .................... | H01S 5/146 |
| 2021/0181314 A1  | 6/2021 | Ye | | |
| 2022/0066129 A1* | 3/2022 | Chen | .................... | H03K 17/964 |

FOREIGN PATENT DOCUMENTS

| | | | | | |
|---|---|---|---|---|---|
| JP | 2007188516 A | * | 7/2007 | ............. | G06K 13/08 |
| KR | 10-0463289 B1 | | 12/2004 | | |
| KR | 10-2020-0067661 A | | 6/2020 | | |
| KR | 10-2021-0026083 A | | 3/2021 | | |
| WO | WO-2019082503 A1 | * | 5/2019 | ............. | G02B 7/021 |

\* cited by examiner

130

150

3100

3700

4710

4720

LIDAR DEVICE

CROSS-REFERENCE TO RELATED APPLICATIONS

This application claims priority to and the benefit of Korean Patent Application No. 10-2021-0168211, filed on Nov. 30, 2021, Korean Patent Application No. 10-2021-0168212, filed on Nov. 30, 2021, and Korean Patent Application No. 10-2021-0168213, filed on Nov. 30, 2021, the disclosure of which is incorporated herein by reference in their entirety.

TECHNICAL FIELD

The present invention relates to a light detection and ranging (LiDAR) device for measuring a distance using a laser, and more particularly, to a LiDAR device including a laser emitting module, a laser detecting module, an emitting optic module, a detecting optic module, an emitting optic holder, a detecting optic holder, and a plurality of fixers. In addition, the present invention relates to a LiDAR device including a laser emitting array and a laser detecting array and a method of processing data of the LiDAR device, and more particularly, to a LiDAR device in which a laser emitting array and a laser detecting array are disposed differently, and a method of processing data of the LiDAR device.

BACKGROUND

Recently, with interest in autonomous vehicles and driverless vehicles, light detection and ranging (LiDAR) has been in the spotlight. A LiDAR device is a device that acquires surrounding distance information using a laser, and due to advantages such as excellent precision and resolution and an ability to identify an object stereoscopically, the LiDAR device is being applied not only to automobiles but also to various fields such as drone and aircraft fields.

Meanwhile, in order to increase a measurement distance of a LiDAR device, it is necessary to increase the power of a laser emitting from a laser emitting unit included in the LiDAR device.

However, since a LiDAR device is a device for measuring a distance using a laser with straightness, there is a limitation in that a laser should output power in a range that does not affect the human eye.

Accordingly, various methods of further increasing the output power of a laser within such a limitation are being discussed in the related art.

In addition, in the case of an optic module (including a lens assembly) used in a solid-state LiDAR device, it may be important to make an alignment with a laser emitting module or a laser detecting module.

Furthermore, in the case of an optic module (including a lens assembly) used in a solid-state LiDAR device, it may be important to continuously maintain an alignment with a laser emitting module or a laser detecting module.

SUMMARY OF THE INVENTION

The present invention is directed to providing a light detection and ranging (LiDAR) device including a laser emitting array and a laser detecting array that are disposed differently.

The present invention is also directed to providing a method of processing data of a LiDAR device including a laser emitting array and a laser detecting array that are disposed differently.

The present invention is also directed to providing a LiDAR device in which the alignment between a laser emitting module and an emitting optic module is maintained and the alignment between a laser detecting module and a detecting optic module is maintained.

Technical solutions of the present invention may not be limited to the above, and other technical solutions which are not described herein should be clearly understood by those skilled in the art, to which the present invention belongs, from the present specification and the accompanying drawings.

According to an aspect of the present invention, there is provided a LiDAR device including a laser detecting array which includes a first detecting unit column and a second detecting unit column and a laser emitting array which includes a first emitting unit column and a second emitting unit column, wherein the first detecting unit column includes a first detecting unit, a second detecting unit adjacent to the first detecting unit in a column direction, and a third detecting unit adjacent to the second detecting unit in the column direction, the second detecting unit column includes a fourth detecting unit adjacent to the second detecting unit in a row direction, a fifth detecting unit adjacent to the fourth detecting unit in the column direction, and a sixth detecting unit adjacent to the fifth detecting unit in the column direction, the first emitting unit column includes a first emitting unit and a second emitting unit adjacent to the first emitting unit in the column direction, the second emitting unit column includes a third emitting unit and a fourth emitting unit adjacent to the third emitting unit in the column direction, the first emitting unit is disposed to correspond to the first detecting unit, the second emitting unit is disposed to correspond to the third detecting unit, the third emitting unit is disposed to correspond to the fourth detecting unit, the fourth emitting unit is disposed to correspond to the sixth detecting unit, and a distance between the first detecting unit and the second detecting unit is shorter than a distance between the first emitting unit and the second detecting unit.

According to another aspect of the present invention, there is a provided a LiDAR device including a laser detecting array which includes a plurality of detecting units and a laser emitting array which includes a plurality of emitting units, wherein each of the plurality of detecting units is disposed to correspond to one of intersections of rows and columns in a two-dimensional matrix having M rows and N columns, the plurality of emitting units are disposed in a two-dimensional matrix having K rows and L columns, each of the emitting units disposed in an $X^{th}$ row is disposed to correspond to one of intersections of the $X^{th}$ row and odd-numbered columns, and each of the emitting units disposed in an $(X+1)^{th}$ row is disposed to correspond to one of intersections of the $(X+1)^{th}$ row and even-numbered columns.

According to still another aspect of the present invention, there is provided a LiDAR device including a laser emitting array which includes a plurality of emitting units, a laser detecting array which includes a first detecting unit group including a first detecting unit and a second detecting unit group including a second detecting unit, and a processor which obtains a detection value corresponding to each of a plurality of detecting units included in the laser detecting array, the detection value including at least one value of a depth value and an intensity value, wherein the processor selects a first detection value corresponding to the first detecting unit, determines the first detection value to be a first type detection value when a first depth value included in the first detection value satisfies a first condition, and determines the first detection value to be a second type detection value when the first depth value satisfies a second condition, the processor selects a second detection value corresponding to the second detecting unit, determines the second detection value to be the first type detection value when a second depth value included in the second detection value satisfies a third condition, and determines the second detection value to be the second type detection value when the second depth value satisfies a fourth condition, the first condition and the third condition are different from each other, and the second condition and the fourth condition are different from each other.

According to yet another aspect of the present invention, there is provided a method of processing data of a LiDAR device including obtaining a plurality of detection values from a laser detecting array including a first detecting unit group which includes a first detecting unit and a second detecting unit group which includes a second detecting unit, when a first detection value corresponding to the first detecting unit satisfies a first condition, determining the first detection value to be a first type detection value, when the first detection value satisfies a second condition, determining the first detection value to be a second type detection value, when a second detection value corresponding to the second detecting unit satisfies a third condition, determining the second detection value to be the first type detection value, and when the second detection value satisfies a fourth condition, determining the second detection value to be a second type detection value, wherein the first condition and the third condition are different from each other, and the second condition and the fourth condition are different from each other.

According to yet another aspect of the present invention, there is provided a LiDAR device including a laser emitting chip configured to generate a laser, a laser detecting chip configured to detect a laser, an emitting optic module configured to guide the laser generated from the laser emitting chip to the outside of the LiDAR device, a detecting optic module configured to guide a laser received from the outside of the LiDAR device to the laser detecting chip, an emitting optic holder located between the laser emitting chip and the emitting optic module, and a first curing material and one or more emitting optic fixers which are located between the emitting optic holder and the emitting optic module and fix a relative positional relationship between the laser emitting chip and the emitting optic module, wherein the emitting optic holder includes one or more sliding grooves, and the one or more emitting optic fixers are located in the one or more sliding grooves of the emitting optic holder.

According to yet another aspect of the present invention, there is provided a LiDAR device including a laser emitting chip configured to generate a laser, a laser detecting chip configured to detect a laser, an emitting optic module configured to guide the laser generated from the laser emitting chip to the outside of the LiDAR device, wherein the emitting optic module includes a first lens assembly and a first lens assembly mounting tube, a detecting optic module configured to guide a laser received from the outside of the LiDAR device to the laser detecting chip, wherein the detecting optic module includes a second lens assembly and a second lens assembly mounting tube, an emitting optic holder including a first hole into which the first lens assembly mounting tube is inserted, wherein the first lens assembly mounting tube includes a first stopper configured to restrict a degree in which the first lens assembly mounting tube is inserted into the first hole, a detecting optic holder including a second hole into which the second lens assembly mounting tube is inserted, wherein the second lens assembly mounting tube includes a second stopper configured to restrict a degree in which the second lens assembly mounting tube is inserted into the second hole, three or more emitting optic fixers disposed between the first stopper and the emitting optic holder, and three or more detecting optic fixers disposed between the second stopper and the detecting optic holder, wherein the three or more emitting optic fixers maintain a relative positional relationship between the emitting optic module and the laser emitting chip, and the three or more detecting optic fixers maintain a relative positional relationship between the detecting optic module and the laser detecting chip.

The objects of the present invention are not limited to the above-described objects, and other objects which are not described herein should be clearly understood by those skilled in the art, to which the present invention belongs, from the following detailed description and the accompanying drawings.

DETAILED DESCRIPTION OF EXEMPLARY EMBODIMENTS

Figure 1:
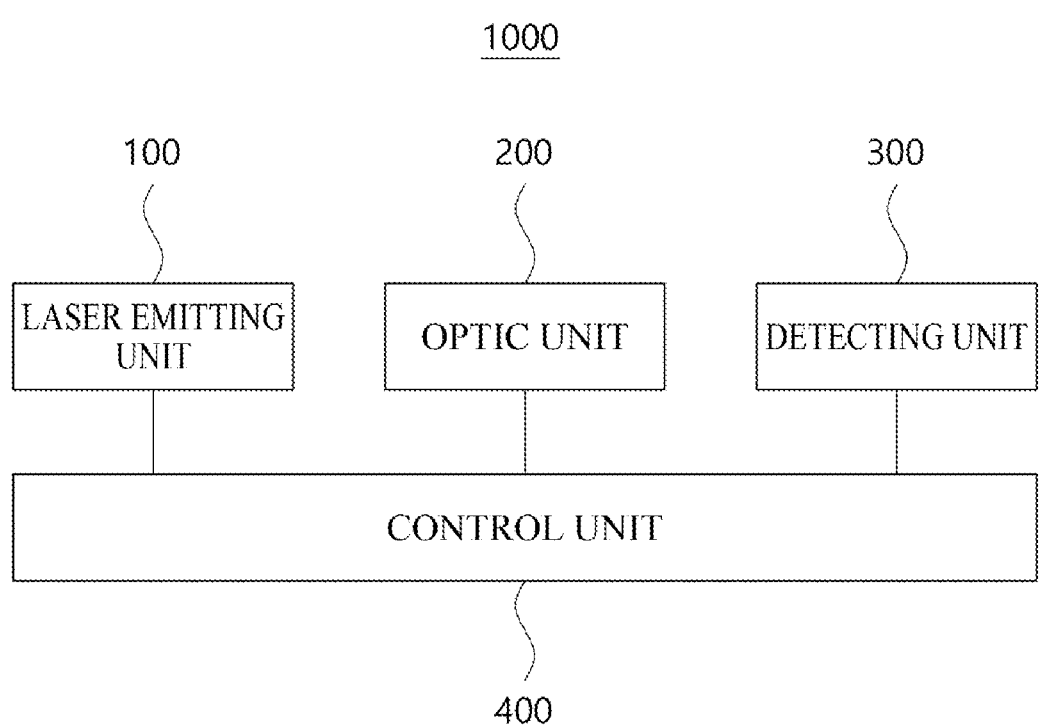
FIG. 1 is a diagram for describing a light detection and ranging (LiDAR) device according to one embodiment.

Embodiments described in this specification are made to clearly explain the scope of the present invention to those having ordinary skill in the art and are not intended to limit the present invention. It should be interpreted that the present invention may include substitutions and modifications within the technical scope of the present invention.

The terms used in this specification are selected from general terms, which are widely used currently, based on functions of components according to the embodiment of the present invention, and may have meanings varying according to the intentions of those skilled in the art, the customs in the related art, or advent of new technology. However, when a specified term is defined and used in an arbitrary sense, a meaning of the term will be described separately. Accordingly, the terms used in this specification should not be defined as simple names of the components but be defined based on the actual meaning of the terms and the whole context throughout the present specification.

In the present specification, the accompanying drawings are to facilitate the description of the present invention and the shape in the drawings may be exaggerated for the purpose of convenience of description so that the present invention should not be limited to the drawings.

In the present specification, the detailed descriptions of the generally known structure or function related to the present invention which make the subject matter of the present invention unclear, will be omitted if necessary.

According to one embodiment of the present invention, as a light detection and ranging (LiDAR) device, there may be provided a LiDAR device including a laser detecting array which includes a first detecting unit column and a second detecting unit column and a laser emitting array which includes a first emitting unit column and a second emitting unit column, wherein the first detecting unit column includes a first detecting unit, a second detecting unit adjacent to the first detecting unit in a column direction, and a third detecting unit adjacent to the second detecting unit in the column direction, the second detecting unit column includes a fourth detecting unit adjacent to the second detecting unit in a row direction, a fifth detecting unit adjacent to the fourth detecting unit in the column direction, and a sixth detecting unit adjacent to the fifth detecting unit in the column direction, the first emitting unit column includes a first emitting unit and a second emitting unit adjacent to the first emitting unit in the column direction, the second emitting unit column includes a third emitting unit and a fourth emitting unit adjacent to the third emitting unit in the column direction, the first emitting unit is disposed to correspond to the first detecting unit, the second emitting unit is disposed to correspond to the third detecting unit, the third emitting unit is disposed to correspond to the fourth detecting unit, the fourth emitting unit is disposed to correspond to the sixth detecting unit, and a distance between the first detecting unit and the second detecting unit is shorter than a distance between the first emitting unit and the second detecting unit.

Here, the laser emitting array may include a first area defined by an area between the first emitting unit and the second emitting unit, and the second detecting unit may be disposed in a second area of the laser detecting array which corresponds to the first area of the laser emitting array.

Here, the laser emitting array may include a third area defined by an area between the third emitting unit and the fourth emitting unit, and the fifth detecting unit may be disposed in a fourth area of the laser detecting array which corresponds to the third area of the laser emitting array.

Here, the first emitting unit column and the second emitting unit column may be disposed adjacent to each other in the row direction.

Here, a separation distance between the first emitting unit and the third emitting unit in the column direction may be the same as a separation distance between the first detecting unit and the second detecting unit in the column direction.

Here, a separation distance between the second emitting unit and the third emitting unit in the row direction may be the same as a separation distance between the second detecting unit and the fourth detecting unit in the row direction.

Here, each of the first to sixth detecting units may include at least one detecting element.

Here, the detecting element may be a single photon avalanche diode (SPAD).

Here, each of the first to fourth emitting units may include at least one emitting element.

Here, the emitting element may be a vertical cavity surface emitting laser (VCSEL).

According to another embodiment of the present invention, as a LiDAR device, there may be provided a LiDAR device including a laser detecting array which includes a plurality of detecting units and a laser emitting array which includes a plurality of emitting units, wherein each of the plurality of detecting units is disposed to correspond to one of intersections of rows and columns in a two-dimensional matrix having M rows and N columns, the plurality of emitting units are disposed in a two-dimensional matrix having K rows and L columns, each of the emitting units disposed in an $X^{th}$ row is disposed to correspond to one of intersections of the $X^{th}$ row and odd-numbered columns, and each of the emitting units disposed in an $(X+1)^{th}$ row is disposed to correspond to one of intersections of the $(X+1)^{th}$ row and even-numbered columns.

Here, M and K may be the same, and N and L may be the same.

Here, N and L may be the same, and M and K may be different from each other.

Here, M may be greater than K.

Here, a first laser emitting from a first emitting unit included in the laser emitting array and disposed at an intersection of the $X^{th}$ row and a $Y^{th}$ column may be detected by a first detecting unit included in the laser detecting array and disposed at an intersection of a $W^{th}$ row and a $Z^{th}$ column.

Here, the first laser emitting from the first emitting unit included in the laser emitting array and disposed at the intersection of the $X^{th}$ row and the $Y^{th}$ column may be detected by the first detecting unit included in the laser detecting array and disposed at the intersection of the $W^{th}$ row and the $Z^{th}$ column or a second detecting unit included in the laser detecting array and disposed at an intersection of a $(W+1)^{th}$ row and the $Z^{th}$ column.

Here, when the first laser emitting from the first emitting unit included in the laser emitting array and disposed at the intersection of the $X^{th}$ row and the $Y^{th}$ column is reflected from an object located in a first distance range, the first laser may be detected by the first detecting unit included in the laser detecting array and disposed at the intersection of the $W^{th}$ row and the $Z^{th}$ column. When the first laser is reflected from an object located in a second distance range, the first laser may be detected by the second detecting unit included in the laser detecting array and disposed at the intersection of the $(W+1)^{th}$ row and the $Z^{th}$ column.

Here, W may be the same as X, and Z may be the same as Y.

Here, the first distance range may include a first specific distance or more, and the second distance range may include a distance range between the first specific distance and a second specific distance.

Here, the first specific distance may be 15 m, and the second specific distance may be 7 m.

According to still another embodiment of the present invention, as a LiDAR device, there may be provided a LiDAR device including a laser emitting array which includes a plurality of emitting units, a laser detecting array which includes a first detecting unit group including a first detecting unit and a second detecting unit group including a second detecting unit, and a processor which obtains a detection value corresponding to each of a plurality of detecting units included in the laser detecting array, the detection value including at least one value of a depth value and an intensity value, wherein the processor selects a first detection value corresponding to the first detecting unit, determines the first detection value to be a first type detection value when a first depth value included in the first detection value satisfies a first condition, and determines the first detection value to be a second type detection value when the first depth value satisfies a second condition, the processor selects a second detection value corresponding to the second detecting unit, determines the second detection value to be the first type detection value when a second depth value included in the second detection value satisfies a third condition, and determines the second detection value to be the second type detection value when the second depth value satisfies a fourth condition, the first condition and the third condition are different from each other, and the second condition and the fourth condition are different from each other.

Here, the first condition and the fourth condition may be the same, and the second condition and the third condition may be the same.

Here, when the first detection value is determined to be the second type detection value, a first correction value may be generated with reference to a detection value corresponding to another detecting unit adjacent to the first detecting unit, and a first corrected detection value may be obtained based on the first correction value.

Here, at least one kernel may be used to generate the first correction value.

Here, in order to generate the first correction value, it is possible to use at least one kernel of a first kernel designed based on a distance between the detecting units, a second kernel designed based on an ambient value, and a third kernel designed based on a detection value.

Here, when the second detection value is determined to be the second type detection value, a second correction value may be generated with reference to a detection value corresponding to another detecting unit adjacent to the second detecting unit, and a second corrected detection value may be obtained based on the second correction value.

Here, when the first detection value is determined to be the first type detection value, the first detection value may be maintained, and when the second detection value is determined to be the first type detection value, the second detection value may be maintained.

Here, each of a plurality of detecting units included in the first detecting unit group is disposed to correspond to one of the plurality of emitting units included in the laser emitting array, and a plurality of detecting units included in the second detecting unit group may be disposed differently from the plurality of emitting units included in the laser emitting array.

Here, when the first detection value does not satisfy the first condition, the second condition may be satisfied, and when the second detection value does not satisfy the third condition, the fourth condition may be satisfied.

Here, each of the plurality of detecting units may include at least one detecting element.

Here, the detecting element may be an SPAD.

Here, each of the plurality of emitting units may include at least one emitting element.

Here, the emitting element may be a VCSEL.

Here, the first condition may include a first distance range, the first distance range may include a first specific distance or more, the second condition may include a second distance range, and the second distance range may include a distance range between the first specific distance and a second specific distance. The third condition may include a third distance range, the third distance range may include a distance range between a third specific distance and a fourth specific distance, the fourth condition may include a fourth distance range, and the fourth distance range may include the third specific distance or more.

Here, the first specific distance and the third specific distance may be 15 m, and the second specific distance and the fourth specific distance may be 7 m.

According to yet another embodiment of the present invention, as a method of processing data of a LiDAR device, there may be provided a method of processing data of a LiDAR device including obtaining a plurality of detection values from a laser detecting array including a first detecting unit group which includes a first detecting unit and a second detecting unit group which includes a second detecting unit, when a first detection value corresponding to the first detecting unit satisfies a first condition, determining the first detection value to be a first type detection value, when the first detection value satisfies a second condition, determining the first detection value to be a second type detection value, when a second detection value corresponding to the second detecting unit satisfies a third condition, determining the second detection value to be the first type detection value, and when the second detection value satisfies a fourth condition, determining the second detection value to be a second type detection value, wherein the first condition and the third condition are different from each other, and the second condition and the fourth condition are different from each other.

Here, the first condition and the fourth condition may be the same, and the second condition and the third condition may be the same.

Here, the method of processing data of a LiDAR device may further include, when the first detection value is determined to be the second type detection value, obtaining a first corrected detection value based on a first correction value generated with reference to a detection value corresponding to another detecting unit adjacent to the first detecting unit.

Here, the method of processing data of a LiDAR device may further include, when the second detection value is determined to be the second type detection value, obtaining a second corrected detection value based on a second correction value generated with reference to a detection value corresponding to another detecting unit adjacent to the second detecting unit.

Here, the method of processing data of a LiDAR device may further include, when the first detection value is determined to be the first type detection value, maintaining the first detection value, and when the second detection value is determined to be the first type detection value, maintaining the second detection value.

According to one embodiment of the present invention, as a LiDAR device, there may be provided a LiDAR device including a laser emitting chip configured to generate a laser, a laser detecting chip configured to detect a laser, an emitting optic module configured to guide the laser generated from the laser emitting chip to the outside of the LiDAR device, a detecting optic module configured to guide a laser received from the outside of the LiDAR device to the laser detecting chip, an emitting optic holder located between the laser emitting chip and the emitting optic module, and a first curing material and one or more emitting optic fixers which are located between the emitting optic holder and the emitting optic module and fix a relative positional relationship between the laser emitting chip and the emitting optic module, wherein the emitting optic holder includes one or more sliding grooves, and the one or more emitting optic fixers are located in the one or more sliding grooves of the emitting optic holder.

Here, at least a portion of the one or more emitting optic fixers may be impregnated with the first curing material.

Here, the one or more emitting optic fixers may include a first surface and a second surface opposite to the first surface, and a size of the first surface may be smaller than a size of the second surface.

Here, the first surface included in the one or more emitting optic fixers may be located closer to the emitting optic module than the second surface.

Here, the one or more emitting optic fixers may include a third surface located between the first surface and the second surface, and the third surface may be provided as an inclined surface.

Here, the first curing material may include an epoxy.

Here, the LiDAR device may further include a detecting optic holder located between the laser detecting chip and the detecting optic module.

Here, the emitting optic holder and the detecting optic holder may be integrally formed.

Here, the LiDAR device may further include a second curing material and one or more detecting optic fixers which are located between the detecting optic holder and the detecting optic module and fix a relative positional relationship between the laser detecting chip and the detecting optic module. The detecting optic holder may include one or more sliding grooves, and the one or more detecting optic fixers may be located in the one or more sliding grooves of the detecting optic holder.

Here, the number of the one or more emitting optic fixers may be the same as the number of the one or more detecting optic fixers.

Here, the one or more emitting optic fixers may include three or more emitting optic fixers.

Here, the one or more emitting optic fixers may include a first emitting optic fixer, a second emitting optic fixer, a third emitting optic fixer, and a fourth emitting optic fixer. A distance between the first emitting optic fixer and the second emitting optic fixer may be shorter than a distance between the second emitting optic fixer and the third emitting optic fixer, and a distance between the third emitting optic fixer and the fourth emitting optic fixer may be shorter than a distance between the first emitting optic fixer and the fourth emitting optic fixer.

Here, the laser emitting chip may include a laser emitting array, and the laser detecting chip may include a laser detecting array. The emitting optic module may include a first lens assembly and a first lens assembly mounting tube, and the detecting optic module may include a second lens assembly and a second lens assembly mounting tube.

Here, the laser emitting array may be provided as a VCSEL array, and the laser detecting array may be provided as an SPAD array.

According to another embodiment of the present invention, as a LiDAR device, there may be provided a LiDAR device including a laser emitting chip configured to generate a laser, a laser detecting chip configured to detect a laser, an emitting optic module configured to guide the laser generated from the laser emitting chip to the outside of the LiDAR device, wherein the emitting optic module includes a first lens assembly and a first lens assembly mounting tube, a detecting optic module configured to guide a laser received from the outside of the LiDAR device to the laser detecting chip, wherein the detecting optic module includes a second lens assembly and a second lens assembly mounting tube, an emitting optic holder including a first hole into which the first lens assembly mounting tube is inserted, wherein the first lens assembly mounting tube includes a first stopper configured to restrict a degree in which the first lens assembly mounting tube is inserted into the first hole, a detecting optic holder including a second hole into which the second lens assembly mounting tube is inserted, wherein the second lens assembly mounting tube includes a second stopper configured to restrict a degree in which the second lens assembly mounting tube is inserted into the second hole, three or more emitting optic fixers disposed between the first stopper and the emitting optic holder, and three or more detecting optic fixers disposed between the second stopper and the detecting optic holder, wherein the three or more emitting optic fixers maintain a relative positional relationship between the emitting optic module and the laser emitting chip, and the three or more detecting optic fixers maintain a relative positional relationship between the detecting optic module and the laser detecting chip.

Here, the emitting optic holder may include three or more sliding grooves, and each of the three or more emitting optic fixers may be located in each of the three or more sliding grooves of the emitting optic holder. The detecting optic holder may include three or more sliding grooves, and each of the three or more detecting optic fixers may be located in each of the three or more sliding grooves of the detecting optic holder.

Here, the emitting optic holder and the detecting optic holder may be integrally formed.

Hereinafter, a LiDAR device of the present disclosure will be described.

A LiDAR device is a device for detecting a distance to an object and the location of an object using a laser. For example, a LiDAR device may emit a laser beam. When the emitted laser beam is reflected by an object, the LiDAR device may receive the reflected laser beam and measure a distance between the object and the LiDAR device and the location of the object. In this case, the distance from the object and the location of the object may be expressed in a coordination system. For example, the distance from the object and the location of the object may be expressed in a spherical coordinate system $(r, \theta, \varphi)$. However, the present disclosure is not limited thereto, and the distance and location may be expressed in a Cartesian coordinate system $(X, Y, Z)$ or a cylindrical coordinate system $(r, \theta, z)$.

Also, the LiDAR device may use laser beams output from the LiDAR device and reflected by an object in order to measure a distance from the object.

The LiDAR device according to an embodiment may use a time of flight (TOF) of a laser beam, which is the time taken by a laser beam to be detected after being emitted, in order to measure the distance from the object. For example, the LiDAR device may measure the distance from the object using a difference between a time value based on an emitting time of an emitted laser beam and a time value based on a detection time of a detected laser beam reflected by the object.

Also, the LiDAR device may measure the distance from the object using a difference between a time value at which an emitted laser beam is detected immediately without reaching an object and a time value based on a detection time of a detected laser beam reflected by the object.

There may be a difference between a time point at which the LiDAR device transmits a trigger signal for emitting a laser beam using a control unit and an actual emission time point, which is a time when the laser beam is actually emitted from a laser beam output element. Actually, no laser beam is emitted in a period between the time point of the trigger signal and the actual emission time point. Thus, when the period is included in the ToF of the laser beam, precision may be decreased.

The actual emission time point of the laser beam may be used to improve the precision of the measurement of the TOF of the laser beam. However, it may be difficult to determine the actual emission time point of the laser beam. Therefore, a laser beam should be directly delivered to a detecting unit as soon as or immediately after the laser beam is emitted from the laser emitting element without reaching the object.

For example, an optic may be disposed on an upper portion of the laser emitting element, and thus the optic may enable a laser beam emitted from the laser emitting element to be detected by a detecting unit immediately without reaching an object. The optic may be a minor, a lens, a prism, a metasurface, or the like, but the present disclosure is not limited thereto. The optic may include one optic or a plurality of optics.

Also, for example, a detecting unit may be disposed on an upper portion of the laser emitting element, and thus a laser beam emitted from the laser emitting element may be detected by the detecting unit immediately without reaching an object. The detecting unit may be spaced a distance of 1 mm, 1 μm, 1 nm, or the like from the laser emitting element, but the present disclosure is not limited thereto. Alternatively, the detecting unit may be adjacent to the laser emitting element with no interval therebetween. An optic may be present between the detecting unit and the laser emitting element, but the present disclosure is not limited thereto.

Also, the LiDAR device according to an embodiment may use a triangulation method, an interferometry method, a phase shift measurement, and the like rather than the TOF method to measure a distance to an object, but the present disclosure is not limited thereto.

A LiDAR device according to an embodiment may be installed in a vehicle. For example, the LiDAR device may be installed on a vehicle's roof, hood, headlamp, bumper, or the like.

Also, a plurality of LiDAR devices according to an embodiment may be installed in a vehicle. For example, when two LiDAR devices are installed on a vehicle's roof, one LiDAR device is for monitoring an area in front of the vehicle, and the other one is for monitoring an area behind the vehicle, but the present disclosure is not limited thereto. Also, for example, when two LiDAR devices are installed on a vehicle's roof, one LiDAR device is for monitoring an area to the left of the vehicle, and the other one is for monitoring an area to the right of the vehicle, but the present disclosure is not limited thereto.

Also, the LiDAR device according to an embodiment may be installed in a vehicle. For example, when the LiDAR device is installed in a vehicle, the LiDAR device is for recognizing a driver's gesture while driving, but the present disclosure is not limited thereto. Also, for example, when the LiDAR device is installed inside or outside a vehicle, the LiDAR device is for recognizing a driver's face, but the present disclosure is not limited thereto.

A LiDAR device according to an embodiment may be installed in an unmanned aerial vehicle. For example, the LiDAR device may be installed in an unmanned aerial vehicle (UAV) System, a drone, a remotely piloted vehicle (RPV), an unmanned aircraft system (UAS), a remotely piloted air/aerial vehicle (RPAV), a remotely piloted aircraft system (RPAS), or the like.

Also, a plurality of LiDAR devices according to an embodiment may be installed in an unmanned aerial vehicle. For example, when two LiDAR devices are installed in an unmanned aerial vehicle, one LiDAR device is for monitoring an area in front of the unmanned aerial vehicle, and the other one is for monitoring an area behind the unmanned aerial vehicle, but the present disclosure is not limited thereto. Also, for example, when two LiDAR devices are installed in an unmanned aerial vehicle, one LiDAR device is for monitoring an area to the left of the aerial vehicle, and the other one is for monitoring an area to the right of the aerial vehicle, but the present disclosure is not limited thereto.

A LiDAR device according to an embodiment may be installed in a robot. For example, the LiDAR device may be installed in a personal robot, a professional robot, a public service robot, or other industrial robots or manufacturing robots.

Also, a plurality of LiDAR devices according to an embodiment may be installed in a robot. For example, when two LiDAR devices are installed in a robot, one LiDAR device is for monitoring an area in front of the robot, and the other one is for monitoring an area behind the robot, but the present disclosure is not limited thereto. Also, for example, when two LiDAR devices are installed in a robot, one LiDAR device is for monitoring an area to the left of the robot, and the other one is for monitoring an area to the right of the robot, but the present disclosure is not limited thereto.

Also, a LiDAR device according to an embodiment may be installed in a robot. For example, when the LiDAR device is installed in a robot, the LiDAR device is for recognizing a human face, but the present disclosure is not limited thereto.

Also, a LiDAR device according to an embodiment may be installed for industrial security. For example, the LiDAR device may be installed in a smart factory for the purpose of industrial security.

Also, a plurality of LiDAR devices according to an embodiment may be installed in a smart factory for the purpose of industrial security. For example, when two LiDAR devices are installed in a smart factory, one LiDAR device is for monitoring an area in front of the smart factory, and the other one is for monitoring an area behind the smart factory, but the present disclosure is not limited thereto. Also, for example, when two LiDAR devices are installed in a smart factory, one LiDAR device is for monitoring an area to the left of the smart factory, and the other one is for monitoring an area to the right of the smart factory, but the present disclosure is not limited thereto.

Also, a LiDAR device according to an embodiment may be installed for industrial security. For example, when the LiDAR device is installed for industrial security, the LiDAR device is for recognizing a human face, but the present disclosure is not limited thereto.

Various embodiments of elements of the LiDAR device will be described in detail below.

FIG. 1 is a diagram illustrating a LiDAR device according to an embodiment.

Referring to FIG. 1, a LiDAR device 1000 according to an embodiment may include a laser emitting unit 100.

In this case, the laser emitting unit 100 according to an embodiment may emit a laser beam.

Also, the laser emitting unit 100 may include one or more laser emitting elements. For example, the laser emitting unit 100 may include a single laser emitting element and may include a plurality of laser emitting elements. Also, when the laser emitting unit 100 includes a plurality of laser emitting elements, the plurality of laser emitting elements may constitute one array.

Also, the laser emitting unit 100 may include a laser diode (LD), a solid-state laser, a high power laser, a light-emitting diode (LED), a vertical-cavity surface-emitting laser (VCSEL), an external cavity diode laser (ECDL), and the like, but the present disclosure is not limited thereto.

Also, the laser emitting unit 100 may output a laser beam of a certain wavelength. For example, the laser emitting unit 100 may output a laser beam with a wavelength of 905 nm or a laser beam with a wavelength of 1550 nm. Also, for example, the laser emitting unit 100 may output a laser beam with a wavelength of 940 nm. Also, for example, the laser emitting unit 100 may output a laser beam with a plurality of wavelengths ranging between 800 nm and 1000 nm. Also, when the laser emitting unit 100 includes a plurality of laser emitting elements, some of the plurality of laser emitting elements may output a laser beam with a wavelength of 905 nm, and the others may output a laser beam with a wavelength of 1500 nm.

Referring to FIG. 1 again, the LiDAR device 1000 according to an embodiment may include an optic unit 200.

Herein, the optic unit may be variously expressed as a steering unit, a scanning unit, etc., but the present disclosure is not limited thereto.

In this case, the optic unit 200 according to an embodiment may change a flight path of a laser beam. For example, the optic unit 200 may change a flight path of a laser beam such that a laser beam emitted from the laser emitting unit 100 is directed to a scanning region. Also, for example, the optic unit 200 may change a flight path of laser beam such that a laser beam reflected by an object located in the scanning region is directed to a detecting unit.

In this case, the optic unit 200 according to an embodiment may change a flight path of laser beam by reflecting a laser beam. For example, the optic unit 200 may change flight path of a laser beam by reflecting a laser beam emitted from the laser emitting unit 100 such that the laser beam is directed to the scanning region. Also, for example, the optic unit 200 may change a flight path of laser beam such that a laser beam reflected by an object located in the scanning region is directed to the detecting unit.

Also, the optic unit 200 according to an embodiment may include various optic means to reflect laser beams. For example, the optic unit 200 may include a mirror, a resonance scanner, a micro-electromechanical system (MEMS) mirror, a voice coil motor (VCM), a polygonal mirror, a rotating mirror, or a galvano mirror, and the like, but the present disclosure is not limited thereto.

Also, the optic unit 200 according to an embodiment may change a flight path of laser beam by refracting laser beams. For example, the optic unit 200 may change a flight path of laser beam by refracting a laser beam emitted from the laser emitting unit 100 such that the laser beam is directed to the scanning region. Also, for example, the optic unit 200 may change a flight path of laser beam such that a laser beam reflected by an object located in the scanning region is directed to the detecting unit.

Also, the optic unit 200 according to an embodiment may include various optic means to refract laser beams. For example, the optic unit 200 may include lenses, prisms, microlenses, or microfluidic lenses, but the present disclosure is not limited thereto.

Also, the optic unit 200 according to an embodiment may change a flight path of laser beam by changing the phase of a laser beam. For example, the optic unit 200 may change a flight path of laser beam by changing the phase of a laser beam emitted from the laser emitting unit 100 such that the laser beam is directed to the scanning region. Also, for example, the optic unit 200 may change a flight path of laser beam such that a laser beam reflected by an object located in the scanning region is directed to the detecting unit.

Also, the optic unit 200 according to an embodiment may include various optic means to change the phase of a laser beam. For example, the optic unit 200 may include an optical phased array (OPA), a metalens, a metasurface, or the like, but the present disclosure is not limited thereto.

Also, the optic unit 200 according to an embodiment may include one or more optic means. Also, for example, the optic unit 200 may include a plurality of optic means.

Referring to FIG. 1 again, the LiDAR device 1000 according to an embodiment may include a detecting unit 300.

Herein, the detecting unit may be variously expressed as a light receiving unit, a sensor unit, etc., but the present disclosure is not limited thereto.

In this case, the detecting unit 300 according to an embodiment may detect laser beams. For example, the detecting unit may detect a laser beam reflected by an object located in the scanning region.

Also, the detecting unit 300 according to an embodiment may receive a laser beam and generate an electric signal based on the received laser beam. For example, the detecting unit 300 may detect a laser beam reflected by an object located in the scanning region and generate an electric signal based on the received laser beam. Also, for example, the detecting unit 300 may receive a laser beam reflected by an object located in the scanning region through one or more optical means and generate an electric signal based on the received laser beam. Also, for example, the detecting unit 300 may receive a laser beam reflected by an object located in the scanning region through an optical filter and generate an electric signal based on the received laser beam.

Also, the detecting unit 300 according to an embodiment may detect the laser beam based on the generated electric signal. For example, the detecting unit 300 may detect the laser beam by comparing the magnitude of the generated electric signal to a predetermined threshold, but the present disclosure is not limited thereto. Also, for example, the detecting unit 300 may detect the laser beam by comparing the rising edge, falling edge, or the median of the rising edge and the falling edge of the generated electric signal to a predetermined threshold, but the present disclosure is not limited thereto. Also, for example, the detecting unit 300 may detect the laser beam by comparing the peak value of the generated electric signal to a predetermined threshold, but the present disclosure is not limited thereto.

Also, the detecting unit 300 according to an embodiment may include various detecting elements. For example, the detecting unit 300 may include a PN photodiode, a phototransistor, a PIN photodiode, an avalanche photodiode (APD), a single-photon avalanche diode (SPAD), silicon photomultipliers (SiPM), a time-to-digital converter (TDC), a comparator, a complementary metal-oxide-semiconductor (CMOS), a charge-coupled device (CCD), or the like, but the present disclosure is not limited thereto.

For example, the detecting unit 300 may be a two-dimensional (2D) SPAD array, but the present disclosure is not limited thereto. Also, for example, the SPAD array may include a plurality of SPAD units, and each SPAD unit may include a plurality of SPAD pixels.

In this case, the detecting unit 300 may generate a histogram by accumulating a plurality of data sets based on output signals of the detecting elements N times using the 2D SPAD array. For example, the detecting unit 300 may use the histogram to detect a reception time point of a laser beam that is reflected by an object and received.

For example, the detecting unit 300 may use the histogram to determine the peak time point of the histogram as the reception time point at which the laser beam reflected by the object is received, but the present disclosure is not limited thereto. Also, for example, the detecting unit 300 may use the histogram to determine a time point at which the histogram is greater than or equal to a predetermined value as the reception time point at which the laser beam reflected by the object is received, but the present disclosure is not limited thereto.

Also, the detecting unit 300 according to an embodiment may include one or more detecting elements. For example, the detecting unit 300 may include a single detecting element and may also include a plurality of detecting elements.

Also, the detecting unit 300 according to an embodiment may include one or more optical elements. For example, the detecting unit 300 may include an aperture, a microlens, a converging lens, a diffuser, or the like, but the present disclosure is not limited thereto.

Also, the detecting unit 300 according to an embodiment may include one or more optical filters. The detecting unit 300 may detect a laser beam reflected by an object through an optical filter. For example, the detecting unit 300 may include a band-pass filter, a dichroic filter, a guided-mode resonance filter, a polarizer, a wedge filter, or the like, but the present disclosure is not limited thereto.

Referring to FIG. 1 again, the LiDAR device 1000 according to an embodiment may include a processor 400.

Herein, the processor may be variously expressed as a processor or the like, but the present disclosure is not limited thereto.

In this case, the processor 400 according to an embodiment may control the operation of the laser emitting unit 100, the optic unit 200, or the detecting unit 300.

Also, the processor 400 according to an embodiment may control the operation of the laser emitting unit 100.

For example, the processor 400 may control an emission time point of a laser emitting from the laser emitting unit 100. Also, the processor 400 may control the power of the laser emitting from the laser emitting unit 100. Also, the processor 400 may control the pulse width of the laser emitting from the laser emitting unit 100. Also, the processor 400 may control the cycle of the laser emitting from the laser emitting unit 100. Also, when the laser emitting unit 100 includes a plurality of laser emitting elements, the processor 400 may control the laser emitting unit 100 to operate some of the plurality of laser emitting elements.

Also, the processor 400 according to an embodiment may control the operation of the optic unit 200.

For example, the processor 400 may control the operating speed of the optic unit 200. In detail, the optic unit 200 may control the rotational speed of a rotating mirror when including the rotating mirror and may control the repetition cycle of a MEMS mirror when including the MEMS mirror, but the present disclosure is not limited thereto.

Also, for example, the processor 400 may control the operation status of the optic unit 200. In detail, the optic unit 200 may control the operation angle of a MEMS mirror when including the MEMS mirror, but the present disclosure is not limited thereto.

Also, the processor 400 according to an embodiment may control the operation of the detecting unit 300.

For example, the processor 400 may control the sensitivity of the detecting unit 300. In detail, the processor 400 may control the sensitivity of the detecting unit 300 by adjusting a predetermined threshold, but the present disclosure is not limited thereto.

Also, for example, the processor 400 may control the operation of the detecting unit 300. In detail, the processor 400 may control the turn-on and -off of the detecting unit 300, and when including a plurality of detecting elements, the processor 400 may control the operation of the detecting unit 300 to operate some of the plurality of detecting elements.

Also, the processor 400 according to an embodiment may determine a distance from the LiDAR device 1000 to an object located in a scanning region based on a laser beam detected by the detecting unit 300.

For example, the processor 400 may determine the distance to the object located in the scanning region based on a time point at which the laser beam is emitted from the laser emitting unit 100 and a time point at which the laser beam is detected by the detecting unit 300. Also, for example, the processor 400 may determine the distance to the object located in the scanning region based on a time point at which a laser beam emitted from the laser beam is detected by the detecting unit 300 immediately without reaching the object and a time point at which a laser beam reflected by the object is sensed by the detecting unit 300.

There may be a difference between a time point at which the LiDAR device 1000 transmits a trigger signal for emitting a laser beam using a processor 400 and an actual emission time point, which is a time when the laser beam is actually emitted from a laser emitting element. Actually, no laser beam is emitted in a period between the time point of the trigger signal and the actual emission time point. Thus, when the period is included in the ToF of the laser beam, precision may be decreased.

The actual emission time point of the laser beam may be used to improve the precision of the measurement of the TOF of the laser beam. However, it may be difficult to determine the actual emission time point of the laser beam. Therefore, a laser beam should be detected to the detecting unit 300 as soon as or immediately after the laser beam is emitted from a laser emitting element without reaching an object.

For example, an optic may be disposed on an upper portion of the laser emitting element, and thus the optic may enable a laser beam emitted from the laser emitting element to be detected by the detecting unit 300 directly without reaching an object. The optic may be a mirror, a lens, a prism, a metasurface, or the like, but the present disclosure is not limited thereto. The optic may include one optic or a plurality of optics.

Also, for example, the detecting unit 300 may be disposed on an upper portion of the laser emitting element, and thus a laser beam emitted from the laser emitting element may be detected by the detecting unit 300 directly without reaching an object. The detecting unit 300 may be spaced a distance of 1 mm, 1 µm, 1 nm, or the like from the laser emitting element, but the present disclosure is not limited thereto. Alternatively, the detecting unit 300 may be adjacent to the laser emitting element with no interval therebetween. An optic may be present between the detecting unit 300 and the laser emitting element, but the present disclosure is not limited thereto.

In detail, the laser emitting unit 100 may emit a laser beam, and the processor 400 may acquire a time point at which the laser beam is emitted from the laser emitting unit 100. When the laser beam emitted from the laser emitting unit 100 is reflected by an object located in the scanning region, the detecting unit 300 may detect a laser beam reflected by the object, and the processor 400 may acquire a time point at which the laser beam is detected by the detecting unit 300 and may determine a distance to the object located in the scan region based on the emission time point and the detection time point of the laser beam.

Also, in detail, the laser beam may be emitted from the laser emitting unit 100, and the laser beam emitted from the laser emitting unit 100 may be detected by the detecting unit 300 directly without reaching the object located in the scanning region. In this case, the processor 400 may acquire a time point at which the laser beam is detected without reaching the object. When the laser beam emitted from the laser emitting unit 100 is reflected by the object located in the scanning region, the detecting unit 300 may detect the laser beam reflected by the object, and the processor 400 may acquire the time point at which the laser beam is detected by the detecting unit 300. In this case, the processor 400 may determine the distance to the object located in the scanning region based on the detection time point of the laser beam that does not reach the object and the detection time point of the laser beam that is reflected by the object.

Figure 2:
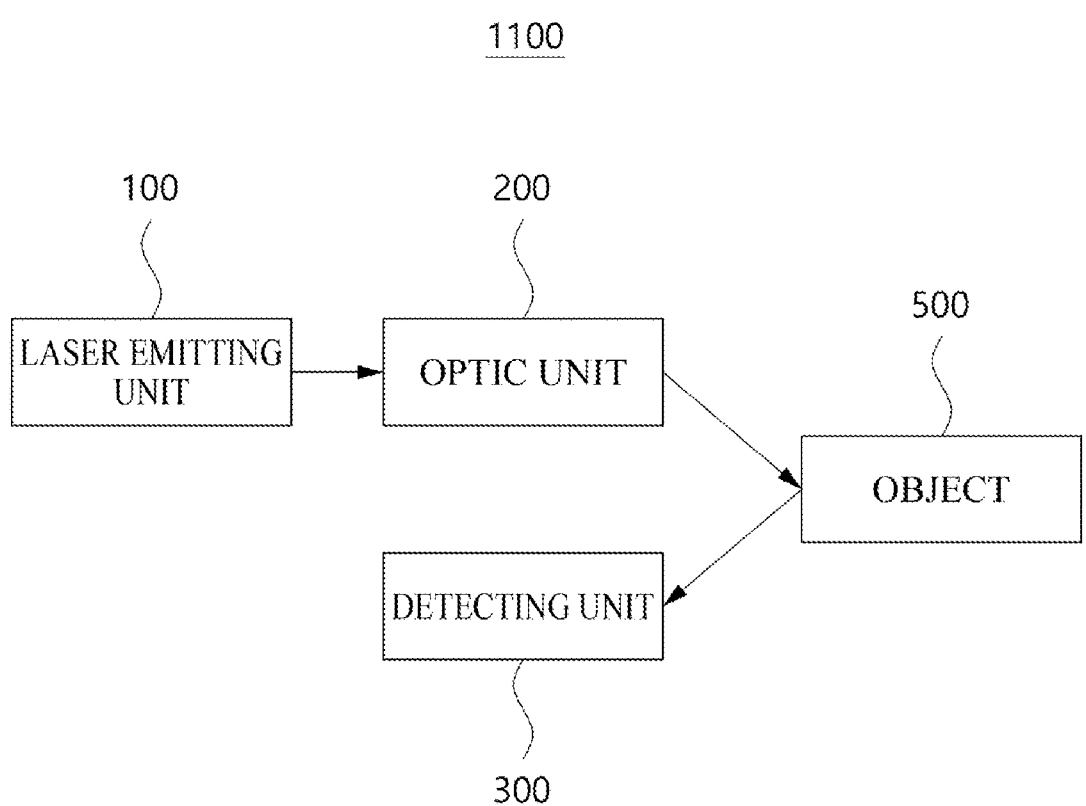
FIG. 2 is a diagram for describing a LiDAR device according to one embodiment.

FIG. 2 is a diagram showing a LiDAR device according to an embodiment.

Referring to FIG. 2, a LiDAR device 1100 according to an embodiment may include a laser emitting unit 100, an optic unit 200, and a detecting unit 300.

The laser emitting unit 100, the optic unit 200, and the detecting unit 300 have been described with reference to FIG. 1, and thus a detailed description thereof will be omitted.

A laser beam emitted from the laser emitting unit 100 may pass through the optic unit 200. In addition, the laser beam passing through the optic unit 200 may be irradiated toward an object 500. Further, the laser beam reflected from the object 500 may be received by the detecting unit 300.

Figure 3:
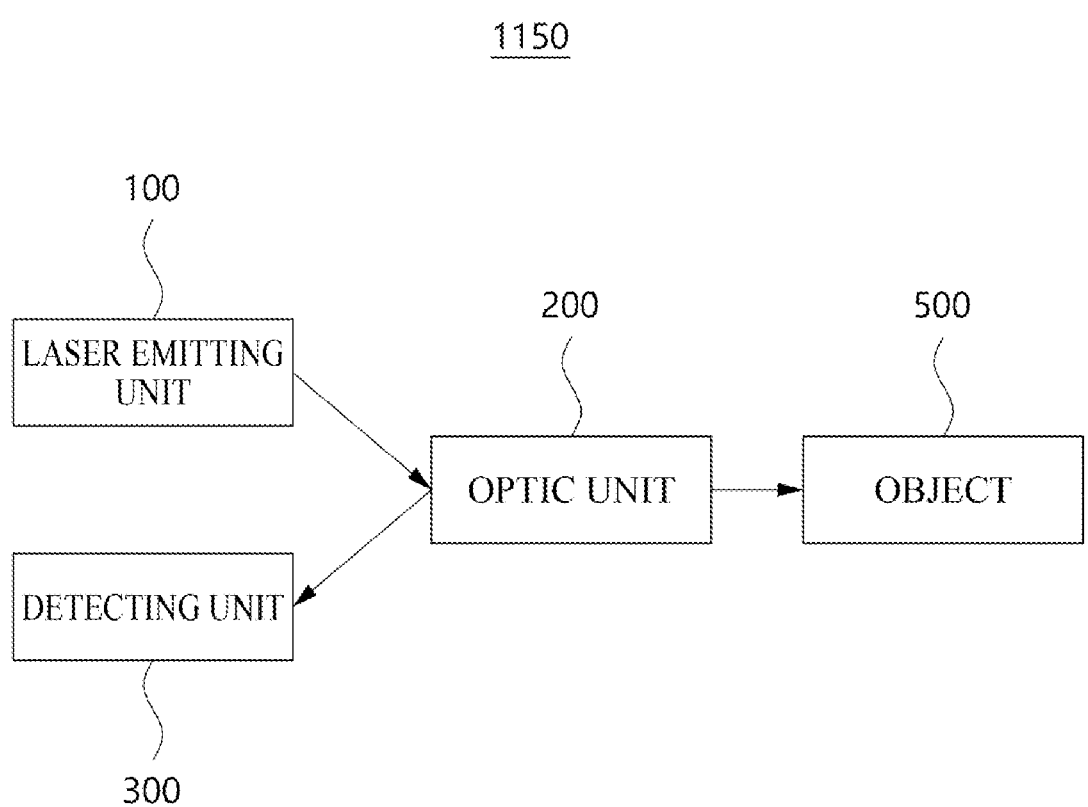
FIG. 3 is a diagram for describing a LiDAR device according to another embodiment.

FIG. 3 is a diagram illustrating a LiDAR device according to another embodiment.

Referring to FIG. 3, a LiDAR device 1150 according to another embodiment may include a laser emitting unit 100, an optic unit 200, and a detecting unit 300.

The laser emitting unit 100, the optic unit 200, and the detecting unit 300 have been described with reference to FIG. 1, and thus detailed descriptions thereof will be omitted.

A laser beam emitted from the laser emitting unit 100 may pass through the optic unit 200. In addition, the laser beam passing through the optic unit 200 may be irradiated toward an object 500. In addition, the laser beam reflected from the object 500 may pass through the optic unit 200 again.

At this point, the optic unit, through which the laser beam before being irradiated to the object has passed, and the optic unit, through which the laser beam that is reflected from the object has passed, may be physically the same optic unit, but may be physically different optic units.

The laser beam passing through the optic unit 200 may be received by the detecting unit 300.

Hereinafter, various embodiments of a laser emitting unit including a vertical-cavity-surface-emitting laser (VCSEL) will be described in detail.

Figure 4:
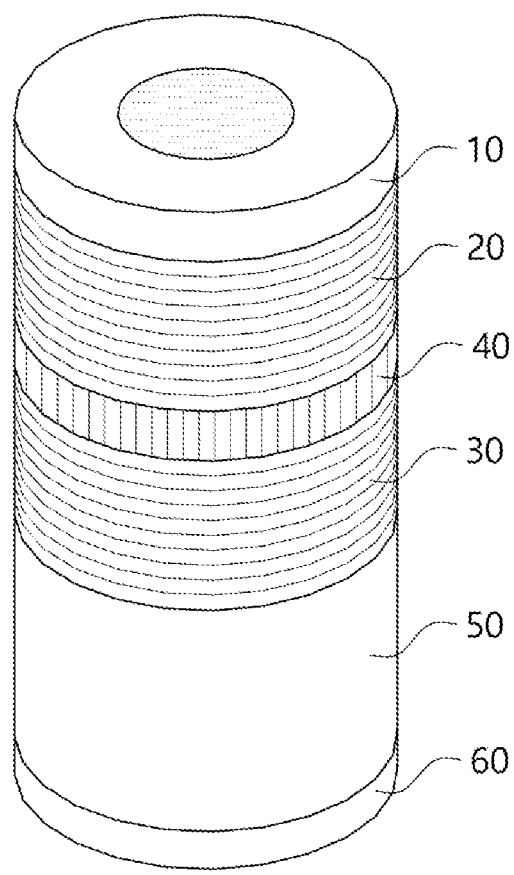
FIG. 4 is a diagram illustrating a laser emitting unit according to one embodiment.

FIG. 4 is a diagram showing a laser beam output unit according to an embodiment.

Referring to FIG. 4, a laser emitting unit 100 according to an embodiment may include a VCSEL emitter 110.

The VCSEL emitter 110 according to an embodiment may include an upper metal contact 10, an upper distributed Bragg reflector (DBR) layer 20, an active layer 40 (quantum well), a lower DBR layer 30, a substrate 50, and a lower metal contact 60.

Also, the VCSEL emitter 110 according to an embodiment may emit a laser beam perpendicularly to an upper surface. For example, the VCSEL emitter 110 may emit a laser beam perpendicularly to the surface of the upper metal contact 10. Also, for example, the VCSEL emitter 110 may emit a laser beam perpendicularly to the active layer 40.

The VCSEL emitter 110 according to an embodiment may include the upper DBR layer 20 and the lower DBR layer 30.

The upper DBR layer 20 and the lower DBR layer 30 according to an embodiment may include a plurality of reflective layers. For example, the plurality of reflective layers may be arranged such that a reflective layer with high reflectance alternates with a reflective layer with low reflectance. In this case, the thickness of the plurality of reflective layers may be a quarter of the wavelength of the laser beam emitted from the VCSEL emitter 110.

Also, the upper DBR layer 20 and the lower DBR layer 30 according to an embodiment may be doped in n-type or p-type. For example, the upper DBR layer 20 may be doped in p-type, and the lower DBR layer 30 may be doped in n-type. Alternatively, for example, the upper DBR layer 20 may be doped in n-type, and the lower DBR layer 30 may be doped in p-type.

Also, according to an embodiment, the substrate 50 may be disposed between the lower DBR layer 30 and the lower metal contact 60. The substrate 50 may be a p-type substrate when the lower DBR layer 30 is doped in p-type, and the substrate 50 may be an n-type substrate when the lower DBR layer 30 is doped in n-type.

The VCSEL emitter 110 according to an embodiment may include the active layer 40.

The active layer 40 according to an embodiment may be disposed between the upper DBR layer 20 and the lower DBR layer 30.

The active layer 40 according to an embodiment may include a plurality of quantum wells that generate laser beams. The active layer 40 may emit laser beams.

The VCSEL emitter 110 according to an embodiment may include a metal contact for electrical connection to a power source or the like. For example, the VCSEL emitter 110 may include the upper metal contact 10 and the lower metal contact 60.

Also, the VCSEL emitter 110 according to an embodiment may be electrically connected to the upper DBR layer 20 and the lower DBR layer 30 through the metal contact.

For example, when the upper DBR layer 20 is doped in p-type and the lower DBR layer 30 is doped in n-type, p-type power may be supplied to the upper metal contact 10 to electrically connect the VCSEL emitter 110 to the upper DBR layer 20, and n-type power may be supplied to the lower metal contact 60 to electrically connect the VCSEL emitter 110 to the lower DBR layer 30.

Also, for example, when the upper DBR layer 20 is doped in n-type and the lower DBR layer 30 is doped in p-type, n-type power may be supplied to the upper metal contact 10 to electrically connect the VCSEL emitter 110 to the upper DBR layer 20, and p-type power may be supplied to the lower metal contact 60 to electrically connect the VCSEL emitter 110 to the lower DBR layer 30.

The VCSEL emitter 110 according to an embodiment may include an oxidation area. The oxidation area may be disposed on an upper portion of the active layer.

The oxidation area according to an embodiment may have electrical insulation. For example, an electrical flow to the oxidation area may be restricted. For example, an electrical connection to the oxidation area may be restricted.

Also, the oxidation area according to an embodiment may serve as an aperture. In detail, since the oxidation area has electrical insulation, a beam generated from the active layer 40 may be emitted to only areas other than the oxidation area.

The laser emitting unit according to an embodiment may include a plurality of VCSEL emitters 110.

Also, the laser emitting unit according to an embodiment may turn on the plurality of VCSEL emitters 110 at once or individually.

The laser emitting unit according to an embodiment may emit laser beams of various wavelengths. For example, the laser emitting unit may emit a laser beam with a wavelength of 905 nm. Also, for example, the laser emitting unit may emit a laser beam with a wavelength of 1550 nm.

Also, the wavelength of the laser beam emitted from the laser emitting unit according to an embodiment may vary depending on the surrounding environment. For example, as the temperature of the surrounding environment increases, the wavelength of the laser beam emitted from the laser emitting unit may increase. Alternatively, for example, as the temperature of the surrounding environment decreases, the wavelength of the laser beam emitted from the laser emitting unit may decrease. The surrounding environment may include temperature, humidity, pressure, dust concentration, ambient light amount, altitude, gravity, acceleration, and the like, but the present disclosure is not limited thereto.

The laser emitting unit may emit a laser beam perpendicularly to a support surface. Alternatively, the laser emitting unit may emit a laser beam perpendicularly to an emission surface.

Figure 5:
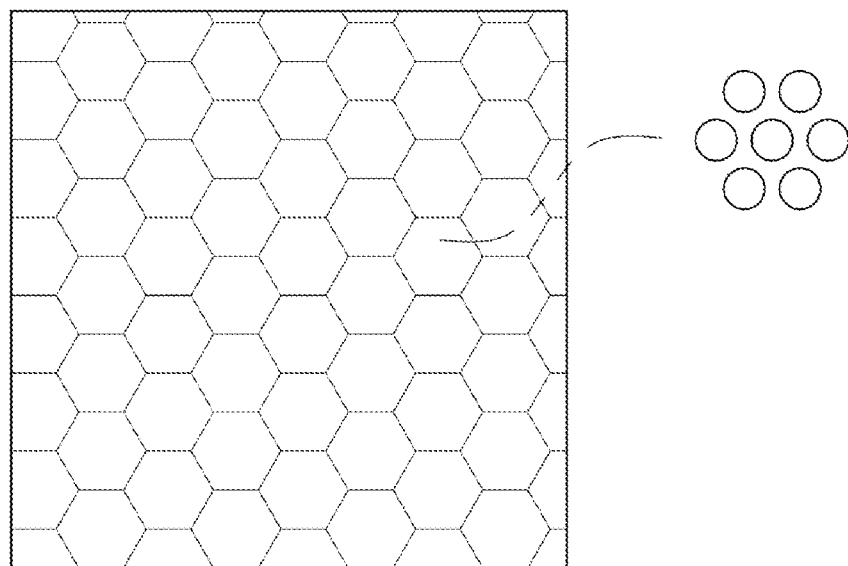
FIG. 5 shows diagrams illustrating a vertical cavity surface emitting laser (VCSEL) unit according to one embodiment.

FIG. 5 is a diagram showing a VCSEL unit according to an embodiment.

Referring to FIG. 5, a laser emitting unit 100 according to an embodiment may include a VCSEL unit 130.

The VCSEL unit 130 according to an embodiment may include a plurality of VCSEL emitters 110. For example, the plurality of VCSEL emitters 110 may be arranged in a honeycomb structure, but the present disclosure is not limited thereto. In this case, one honeycomb structure may include seven VCSEL emitters 110, but the present disclosure is not limited thereto.

Also, the VCSEL emitters 110 included in the VCSEL unit 130 according to an embodiment may be oriented in the same direction. For example, 400 VCSEL emitters 110 included in one VCSEL unit 130 may be oriented in the same direction.

Also, the VCSEL unit 130 may be distinguished by the direction in which the laser beam is emitted. For example, when N VCSEL emitters 110 emit laser beams in a first direction and M VCSEL emitters 110 emit laser beams in a second direction, the N VCSEL emitters 110 may be distinguished as first VCSEL units, and the M VCSEL emitters 110 may be distinguished as second VCSEL units.

Also, the VCSEL unit 130 according to an embodiment may include a metal contact. For example, the VCSEL unit 130 may include a p-type metal and an n-type metal. Also, for example, a plurality of VCSEL emitters 110 included in the VCSEL unit 130 share the metal contact.

Figure 6:
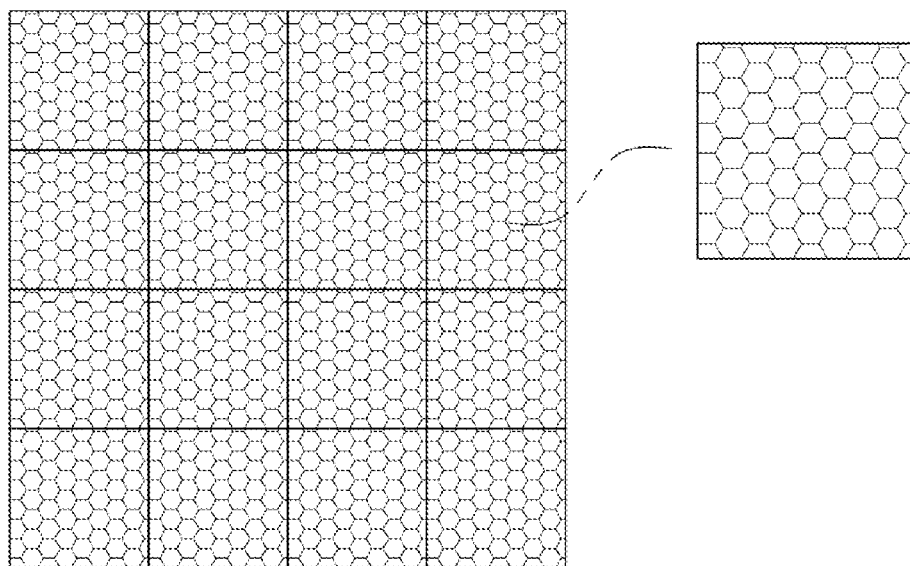
FIG. 6 shows diagrams illustrating a VCSEL array according to one embodiment.

FIG. 6 is a diagram showing a VCSEL array according to an embodiment.

Referring to FIG. 6, a laser emitting unit 100 according to an embodiment may include a VCSEL array 150. FIG. 6 shows 8×8 VCSEL arrays, but the present disclosure is not limited thereto.

The VCSEL array 150 according to an embodiment may include a plurality of VCSEL units 130. For example, the plurality of VCSEL units 130 may be arranged in a matrix structure, but the present disclosure is not limited thereto.

For example, the plurality of VCSEL units 130 may be an N×N matrix, but the present disclosure is not limited thereto.

Also, for example, the plurality of VCSEL units 130 may be an N×M matrix, but the present disclosure is not limited thereto.

Also, the VCSEL array 150 according to an embodiment may include a metal contact. For example, the VCSEL array 150 may include a p-type metal and an n-type metal. In this case, the plurality of VCSEL units 130 may share the metal contacts or may have respective metal contacts rather than sharing the metal contacts.

Figure 7:
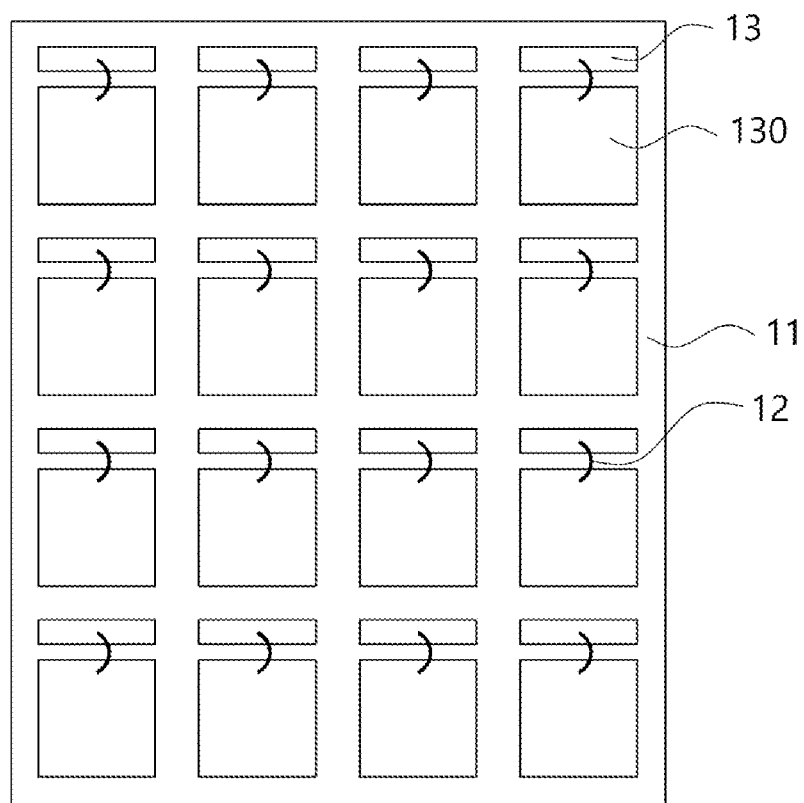
FIG. 7 is a side view illustrating a VCSEL array and a metal contact according to one embodiment.

FIG. 7 is a diagram showing a VCSEL array and a metal contact according to an embodiment.

Referring to FIG. 7, a laser emitting unit 100 according to an embodiment may include a VCSEL array 151. FIG. 7 shows 4×4 VCSEL arrays, but the present disclosure is not limited thereto. The VCSEL array 151 may include a first metal contact 11, a wire 12, a second metal contact 13, and a VCSEL unit 130.

The VCSEL array 151 according to an embodiment may include a plurality of VCSEL units 130 arranged in a matrix structure. In this case, the plurality of VCSEL units 130 may be connected to the metal contacts independently. For example, the plurality of VCSEL units 130 may be connected to the first metal contact 11 together because the VCSEL units 130 share the first metal contact 11. However, the plurality of VCSEL units 130 may be connected to the second metal contact independently because the VCSEL units 130 do not share the second metal contact 13. Also, for example, the plurality of VCSEL units 130 may be connected to the first metal contact 11 directly and may be connected to the second metal contact 13 through wires 12. In this case, the number of wires 12 required may be equal to the number of VCSEL units 130. For example, when the VCSEL array 151 includes a plurality of VCSEL units 130 arranged in an N×M matrix structure, the number of wires 12 may be N*M.

Also, the first metal contact 11 and the second metal contact 13 according to an embodiment may be different from each other. For example, the first metal contact 11 may be an n-type metal, and the second metal contact 13 may be a p-type metal. On the contrary, the first metal contact 11 may be a p-type metal, and the second metal contact 13 may be an n-type metal.

Figure 8:
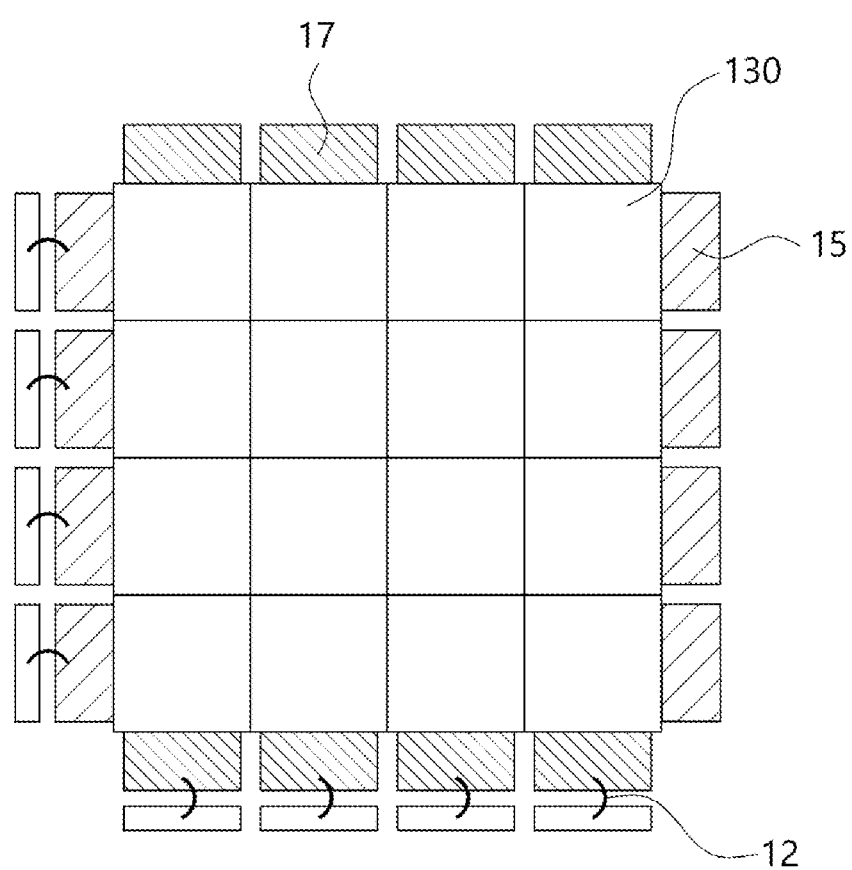
FIG. 8 is a diagram illustrating a VCSEL array according to one embodiment.

FIG. 8 is a diagram showing a VCSEL array according to an embodiment.

Referring to FIG. 8, a laser emitting unit 100 according to an embodiment may include a VCSEL array 153. FIG. 8 shows 4×4 VCSEL arrays, but the present disclosure is not limited thereto.

The VCSEL array 153 according to an embodiment may include a plurality of VCSEL units 130 arranged in a matrix structure. In this case, the plurality of VCSEL units 130 may share a metal contact or may have respective metal contacts rather than sharing a metal contact. For example, the plurality of VCSEL units 130 may share a first metal contact 15 in units of rows. Also, for example, the plurality of VCSEL units 130 may share a second metal contact 17 in units of columns.

Also, the first metal contact 15 and the second metal contact 17 according to an embodiment may be different from each other. For example, the first metal contact 15 may be an n-type metal, and the second metal contact 17 may be a p-type metal. On the contrary, the first metal contact 15 may be a p-type metal, and the second metal contact 17 may be an n-type metal.

Also, the VCSEL unit 130 according to an embodiment may be electrically connected to the first metal contact 15 and the second metal contact 17 through wires 12.

The VCSEL array 153 according to one embodiment may operate to be addressable. For example, the plurality of VCSEL units 130 included in the VCSEL array 153 may operate independently of the other VCSEL units.

For example, when power is supplied to the first metal contact 15 in a first row and the second metal contact 17 in a first column, the VCSEL unit in a first row and first column may operate. In addition, for example, when power is supplied to the first metal contact 15 in the first row and the second metal contacts 17 in the first and third columns, the VCSEL unit in the first row and first column and the VCSEL unit in the first row and third column may operate.

According to one embodiment, the VCSEL units 130 included in the VCSEL array 153 may operate with a predetermined pattern.

For example, the VCSEL units 130 may operate with a predetermined pattern, such as, after the VCSEL unit in the first row and first column operates, the VCSEL unit in a first row and second column, the VCSEL unit in the first row and third column, the VCSEL unit in a first row and fourth column, the VCSEL unit in a second row and first column, the VCSEL unit in a second row and second column, and the like operate in this order, and the VCSEL unit in a fourth row and fourth column operates at the last.

Further, for example, the VCSEL units 130 may operate with a predetermined pattern, such as, after the VCSEL unit in the first row and first column operates, the VCSEL unit in the second row and first column, the VCSEL unit in a third row and first column, the VCSEL unit in a fourth row and first column, the VCSEL unit in the first row and second column, the VCSEL unit in the second row and second column, and the like operate in this order, and the VCSEL unit in the fourth row and fourth column operates at the last.

According to another embodiment, the VCSEL units 130 included in the VCSEL array 153 may operate with an irregular pattern. Alternatively, the VCSEL units 130 included in the VCSEL array 153 may operate without having a pattern.

For example, VCSEL units 130 may operate randomly. When the VCSEL units 130 operate randomly, interference between the VCSEL units 130 may be prevented.

There may be various methods of directing a laser beam emitted from a laser emitting unit to an object. Among the methods, a flash scheme uses a laser beam spreading toward an object through the divergence of the laser beam. In order to direct a laser beam to an object located at a remote distance, the flash scheme requires a high-power laser beam. The high-power laser beam requires a high voltage to be applied, thereby increasing power. Also, the high-power laser beam may damage human eyes, and thus there is a limit to the distance that can be measured by a LiDAR device using the flash scheme.

A scanning scheme is a scheme for directing a laser beam emitted from a laser emitting unit in a specific direction. The scanning scheme can reduce laser power loss by causing a laser beam to travel in a specific direction. Since the laser power loss can be reduced, the scanning scheme may have a longer distance that can be measured by a LiDAR device than the flash scheme even when the same laser power is used. Also, since the scanning scheme has lower laser power required to measure the same distance than the flash scheme, it is possible to improve safety for human eyes.

Laser beam scanning may include collimation and steering. For example, the laser beam scanning may collimate a laser beam and then steer the collimated laser beam. Also, for example, the laser beam scanning may steer a laser beam and then collmate the steered laser beam.

Various embodiments of an optic unit including a Beam Collimation and Steering Component (BCSC) will be described in detail below.

Figure 9:
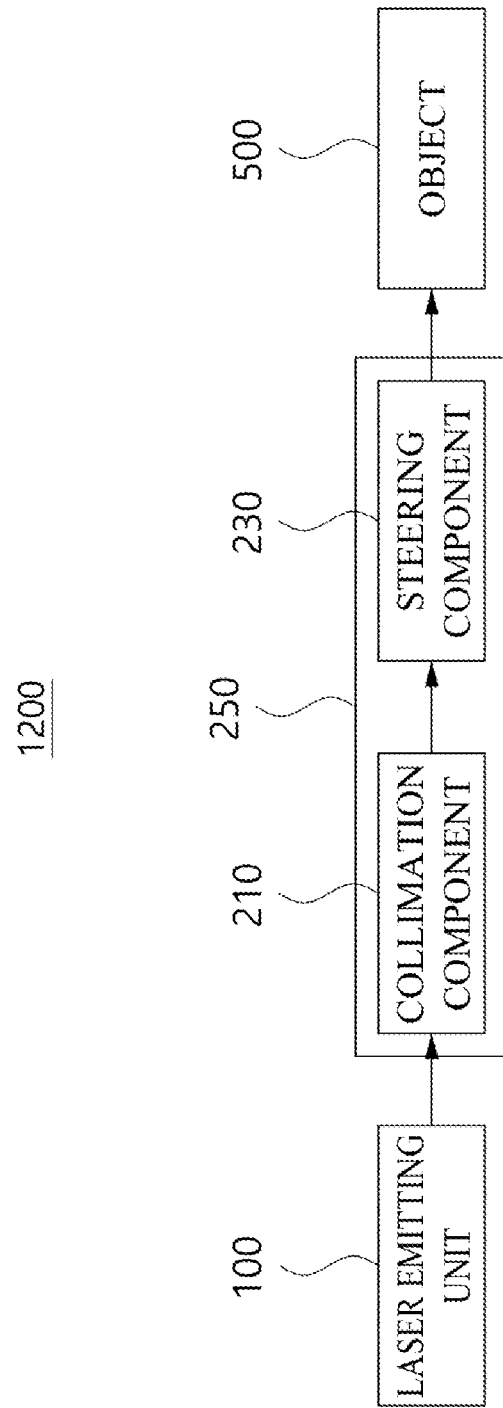
FIG. 9 is a diagram for describing a LiDAR device according to one embodiment.

FIG. 9 is a diagram illustrating a LiDAR device according to an embodiment.

Referring to FIG. 9, a LiDAR device 1200 according to an embodiment may include a laser emitting unit 100 and an optic unit. In this case, the optic unit may include a BCSC 250. Also, the BCSC 250 may include a collimation component 210 and a steering component 230.

The BCSC 250 according to an embodiment may be configured as follows. The collimation component 210 may collimate a laser beam first, and then the collimated laser beam may be steered through the steering component 230. Alternatively, the steering component 230 may steer a laser beam first, and then the steered laser beam may be collimated through the collimation component 210.

Also, an optical path of the LiDAR device 1200 according to an embodiment is as follows. A laser beam emitted from the laser emitting unit 100 may be directed to the BCSC 250. The laser beam directed to the BCSC 250 may be collimated by the collimation component 210 and directed to the steering component 230. The laser beam directed to the steering component 230 may be steered and directed to an object. The laser beam directed to the object 500 may be reflected by the object 500 and directed to the detecting unit.

Even though laser beams emitted from the laser emitting unit have directivity, there may be some degree of divergence as the laser beams go straight. Due to the divergence, the laser beams emitted from the laser emitting unit may not be incident on the object, or even if the laser beams are incident, a very small number of laser beams may be incident.

When the degree of divergence of the laser beams is large, the amount of laser beam incident on the object decreases, and the amount of laser beam reflected by the object and directed to the detecting unit becomes very small due to the divergence. Thus, a desired measurement result may not be obtained. Alternatively, when the degree of divergence of the laser beams is large, a distance that can be measured by a LiDAR device may decrease, and thus a distant object may not be subjected to measurement.

Accordingly, by reducing the degree of divergence of a laser beam emitted from a laser emitting unit before the laser beam is incident on an object, it is possible to improve the efficiency of a LiDAR device. A collimation component of the present disclosure can reduce the degree of divergence of a laser beam. A laser beam having passed through the collimation component may become parallel light. Alternatively, a laser beam having passed through the collimation component may have a degree of divergence ranging from 0.4 degrees to 1 degree.

When the degree of divergence of a laser beam is reduced, the amount of light incident on an object may be increased. When the amount of light incident on an object is increased, the amount of light reflected by the object may be increased and thus it is possible to efficiently receive the laser beam. Also, when the amount of light incident on an object is increased, it is possible to measure an object at a great distance with the same beam power compared to before the laser beam is collimated.

Figure 10:
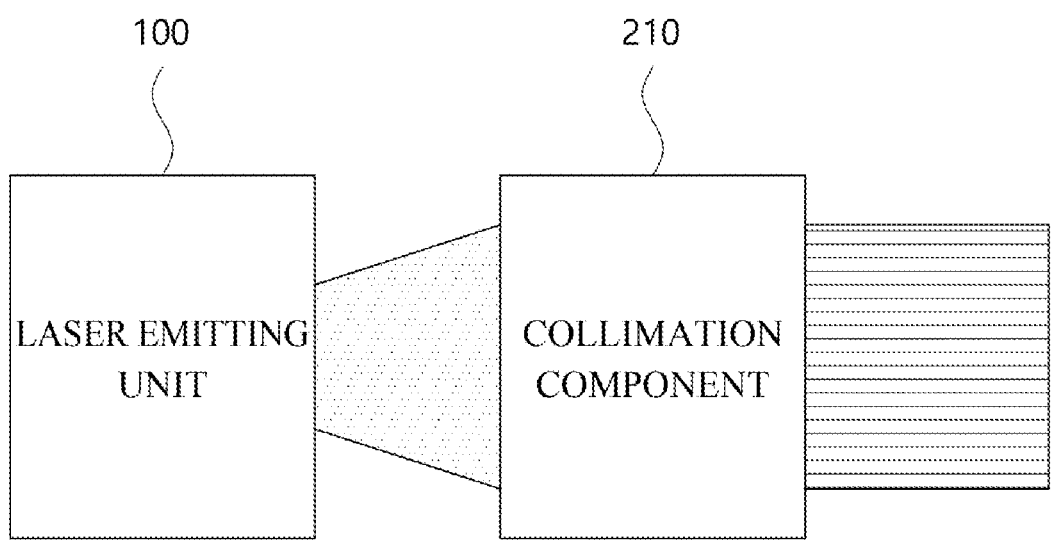
FIG. 10 is a diagram for describing a collimation component according to one embodiment.

FIG. 10 is a diagram illustrating a collimation component according to an embodiment.

Referring to FIG. 10, a collimation component 210 according to an embodiment may be disposed in a direction in which a laser beam emitted from a laser emitting unit 100 emits. The collimation component 210 may adjust the degree of divergence of a laser beam. The collimation component 210 may reduce the degree of divergence of a laser beam.

For example, the angle of divergence of a laser beam emitted from the laser emitting unit 100 may range from 16 degrees to 30 degrees. In this case, after the laser beam emitted from the laser emitting unit 100 passes through the collimation component 210, the angle of divergence of the laser beam may range from 0.4 degrees to 1 degree.

Figure 11:
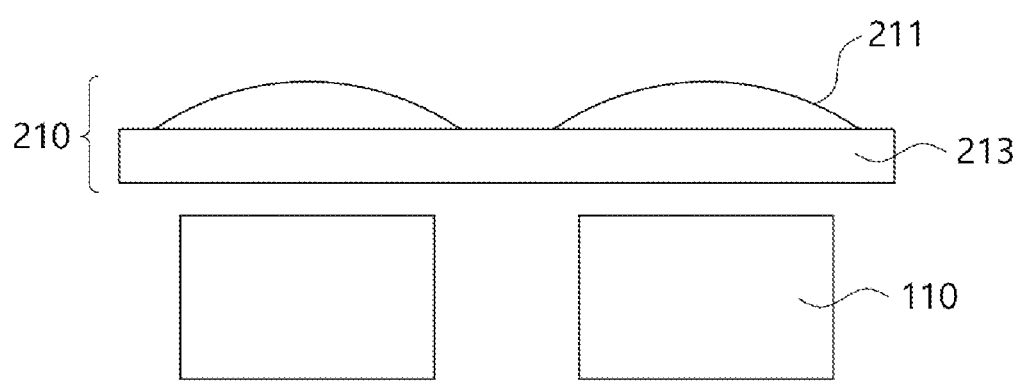
FIG. 11 is a diagram for describing a collimation component according to one embodiment.

FIG. 11 is a diagram illustrating a collimation component according to an embodiment.

Referring to FIG. 11, a collimation component 210 according to an embodiment may include a plurality of microlenses 211 and a substrate 213.

The microlenses may have a diameter of millimeters (mm), micrometers (μm), nanometers (nm), picometers (pm), but the present disclosure is not limited thereto.

The plurality of microlenses 211 according to an embodiment may be disposed on the substrate 213. The plurality of microlenses 211 and the substrate 213 may be disposed above a plurality of VCSEL emitters 110. In this case, one of the plurality of microlenses 211 may correspond to one of the plurality of VCSEL emitters 110, but the present disclosure is not limited thereto.

Also, the plurality of microlenses 211 according to an embodiment may collimate a laser beams emitted from the plurality of VCSEL emitters 110. In this case, a laser beam emitted from one of the plurality of VCSEL emitters 110 may be collimated by one of the plurality of microlenses 211. For example, the angle of divergence of a laser beam emitted from one of the plurality of VCSEL emitters 110 may be decreased after the laser beam passes through one of the plurality of microlenses 211.

Also, the plurality of microlenses according to an embodiment may be a gradient index lens, a micro-curved lens, an array lens, a Fresnel lens, or the like.

Also, the plurality of microlenses according to an embodiment may be manufactured by a method such as molding, ion exchange, diffusion polymerization, sputtering, and etching.

Also, the plurality of microlenses according to an embodiment may have a diameter ranging from 130 μm to 150 μm. For example, the diameter of the plurality of lenses may be 140 μm. Also, the plurality of microlenses may have a thickness ranging from 400 μm to 600 μm. For example, the thickness of the plurality of microlenses may be 500 μm.

Figure 12:
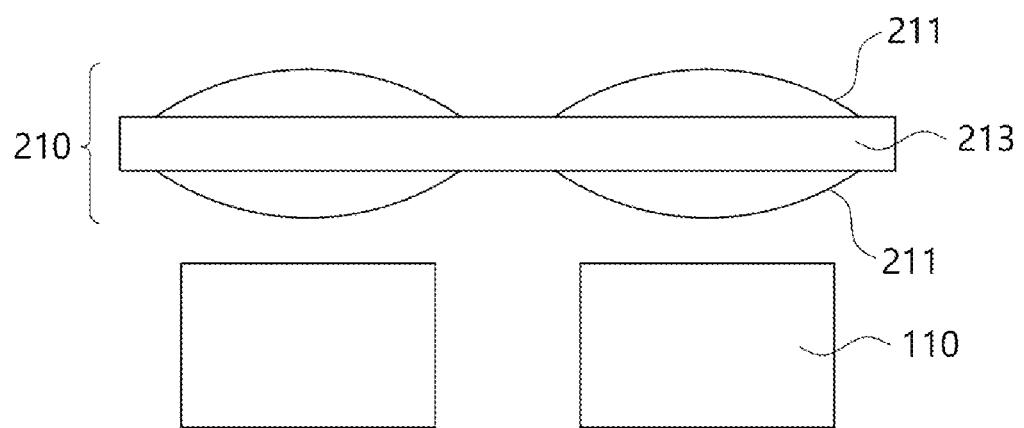
FIG. 12 is a diagram for describing a collimation component according to one embodiment.

FIG. 12 is a diagram illustrating a collimation component according to an embodiment.

Referring to FIG. 12, a collimation component 210 according to an embodiment may include a plurality of microlenses 211 and a substrate 213.

The plurality of microlenses 211 according to an embodiment may be disposed on the substrate 213. For example, the plurality of microlenses 211 may be disposed on the front surface and the rear surface of the substrate 213. In this case, the optical axis of microlenses 211 disposed on the front surface of the substrate 213 may match the optical axis of microlenses 211 disposed on the rear surface of the substrate 213.

Figure 13:
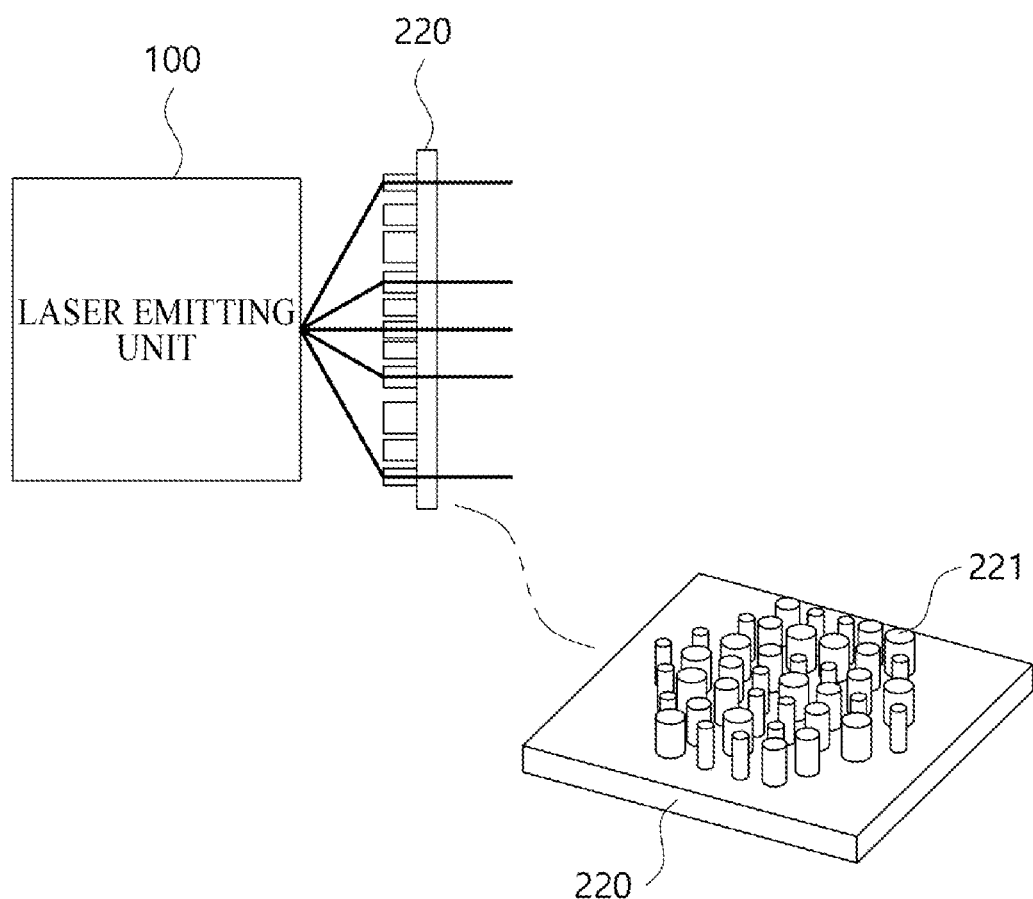
FIG. 13 shows diagrams for describing a collimation component according to one embodiment.

FIG. 13 is a diagram illustrating a collimation component according to an embodiment.

Referring to FIG. 13, the collimation component according to an embodiment may include a metasurface 220.

The metasurface 220 according to an embodiment may include a plurality of nanopillars 221. For example, the plurality of nanopillars 221 may be disposed on one side of the metasurface 220. Also, for example, the plurality of nanopillars 221 may be disposed on both sides of the metasurface 220.

The plurality of nanopillars 221 may have a subwavelength size. For example, a pitch between the plurality of nanopillars 221 may be less than the wavelength of a laser beam emitted from the laser emitting unit 100. Alternatively, the width, diameter, and height of the nanopillars 221 may be less than the size of the wavelength of the laser beam.

By adjusting the phase of a laser beam emitted from the laser emitting unit 100, the metasurface 220 may refract the laser beam. The metasurface 220 may refract laser beams emitted from the laser emitting unit 100 in various directions.

The metasurface 220 may collimate a laser beam emitted from the laser emitting unit 100. Also, the metasurface 220 may reduce the angle of divergence of a laser beam emitted from the laser emitting unit 100. For example, the angle of divergence of a laser beam emitted from the laser emitting unit 100 may range from 15 degrees to 30 degrees, and the angle of divergence of a laser beam having passed the metasurface 220 may range from 0.4 degrees to 1.8 degrees.

The metasurface 220 may be disposed on the laser emitting unit 100. For example, the metasurface 220 may be disposed to the side of the emission surface of the laser emitting unit 100.

Alternatively, the metasurface 220 may be deposited on the laser emitting unit 100. The plurality of nanopillars 221 may be formed on an upper portion of the laser emitting unit 100. The plurality of nanopillars 221 may form various nanopatterns on the laser emitting unit 100.

The nanopillars 221 may have various shapes. For example, the nanopillars 221 may have a cylindrical shape, a polygonal column shape, a conical shape, a polypyramid shape, or the like. Furthermore, the nanopillars 221 may have an irregular shape.

Figure 14:
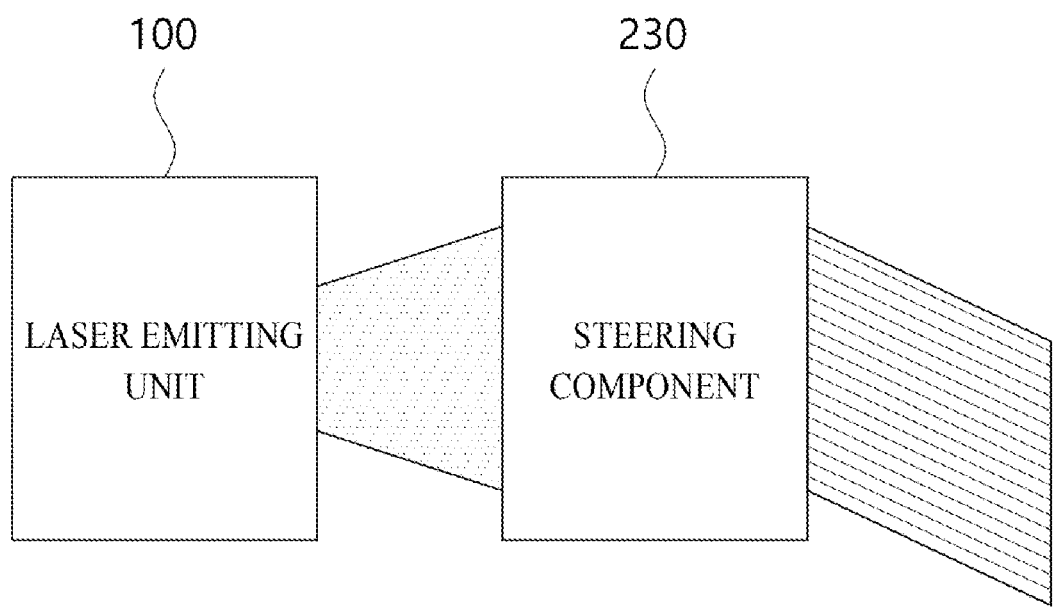
FIG. 14 is a diagram for describing a steering component according to one embodiment.

FIG. 14 is a diagram illustrating a steering component according to an embodiment.

Referring to FIG. 14, a steering component 230 according to an embodiment may be disposed in a direction in which a laser beam emitted from a laser emitting unit 100 travels. The steering component 230 may adjust the direction of a laser beam. The steering component 230 may adjust an angle between a laser beam and an optical axis of a laser light source.

For example, the steering component 230 may steer the laser beam such that the angle between the laser beam and the optical axis of the laser light source ranges from 0 degrees to 30 degrees. Alternatively, for example, the steering component 230 may steer the laser beam such that the angle between the laser beam and the optical axis of the laser light source ranges from −30 degrees to 0 degrees.

Figure 15:
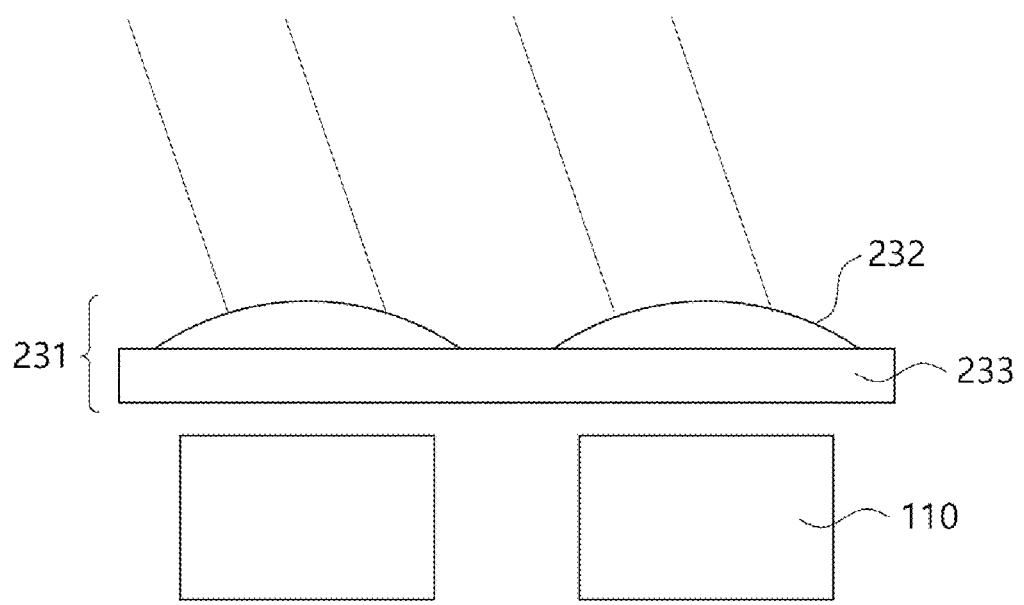
FIGS. 15 and 16 are diagrams for describing a steering component according to one embodiment.
Figure 16:
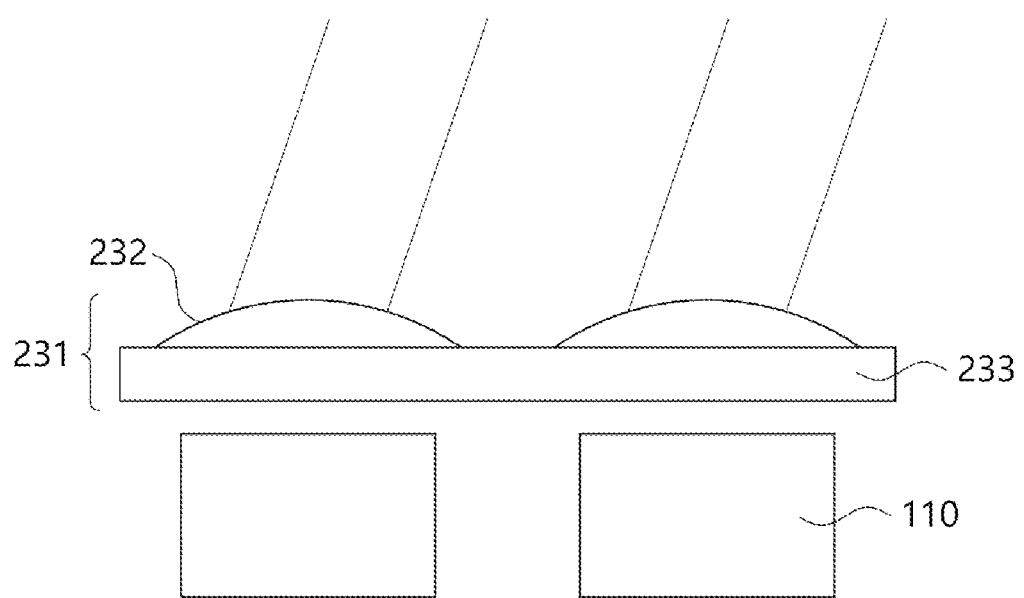

FIGS. 15 and 16 are diagrams illustrating a steering component according to an embodiment.

Referring to FIGS. 14 and 15, a steering component 231 according to an embodiment may include a plurality of microlenses 232 and a substrate 233.

The plurality of microlenses 232 according to an embodiment may be disposed on the substrate 233. The plurality of microlenses 232 and the substrate 233 may be disposed above a plurality of VCSEL emitters 110. In this case, one of the plurality of microlenses 232 may correspond to one of the plurality of VCSEL emitters 110, but the present disclosure is not limited thereto.

Also, the plurality of microlenses 232 according to an embodiment may steer laser beams emitted from the plurality of VCSEL emitters 110. In this case, a laser beam emitted from one of the plurality of VCSEL emitters 110 may be steered by one of the plurality of microlenses 232.

In this case, the optical axis of the microlens 232 may not match the optical axis of the VCSEL emitter 110. For example, referring to FIG. 14, when the optical axis of the VCSEL emitter 110 is inclined to the right with respect to the optical axis of the microlens 232, a laser beam emitted from the VCSEL emitter 110 through the microlens 232 may be directed to the left. Also, for example, referring to FIG. 15, when the optical axis of the VCSEL emitter 110 is inclined to the left with respect to the optical axis of the microlens 232, a laser beam emitted from the VCSEL emitter 110 through the microlens 232 may be directed to the right.

Also, as a distance between the optical axis of the microlens 232 and the optical axis of the VCSEL emitter 110 increases, the degree of steering of the laser beam may increase. For example, an angle between a laser beam and an optical axis of a laser light source may be larger when the distance between the optical axis of the microlens 232 and the optical axis of the VCSEL emitter 110 is 10 µm than when the distance is 1 µm.

Figure 17:
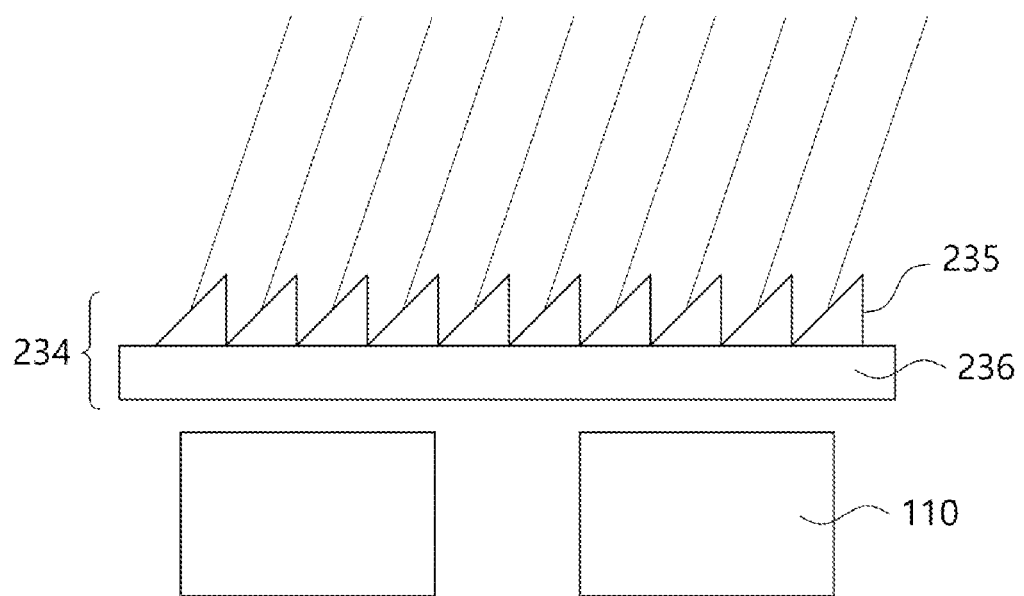
FIG. 17 is a diagram for describing a steering component according to one embodiment.

FIG. 17 is a diagram illustrating a steering component according to an embodiment.

Referring to FIG. 17, a steering component 234 according to an embodiment may include a plurality of microprisms 235 and a substrate 236.

The plurality of microprisms 235 according to an embodiment may be disposed on the substrate 236. The plurality of microprisms 235 and the substrate 236 may be disposed above a plurality of VCSEL emitters 110. In this case, one of the plurality of microprisms 235 may correspond to one of the plurality of VCSEL emitters 110, but the present disclosure is not limited thereto.

Also, the plurality of microprisms 235 according to an embodiment may steer laser beams emitted from the plurality of VCSEL emitters 110. For example, the plurality of microprisms 235 may change an angle between a laser beam and an optical axis of a laser light source.

In this case, as the angle of a microprism 235 decreases, the angle between the laser beam and the optical axis of the laser light source increases. For example, a laser beam may be steered 35 degrees when the angle of the microprism 235 is 0.05 degrees and may be steered by 15 degrees when the angle of the microprism 235 is 0.25 degrees.

Also, the plurality of microprisms 235 according to an embodiment may include a Porro prism, an Amici roof prism, a pentaprism, a Dove prism, a retroreflector prism, or the like. Also, the plurality of microprisms 235 may be formed of glass, plastic, or fluorspar. Also, the plurality of microprisms 235 may be manufactured by a method such as molding and etching.

At this point, a surface of the micro prism 235 may be polished by a polishing process so that diffused reflection due to surface roughness may be prevented.

According to one embodiment, the micro prisms 235 may be disposed on both surfaces of the substrate 236. For example, the micro prisms disposed on a first surface of the substrate 236 may steer the laser beam in a first axis, the micro prisms disposed on a second surface of the substrate 236 may steer the laser beam in a second axis.

Figure 18:
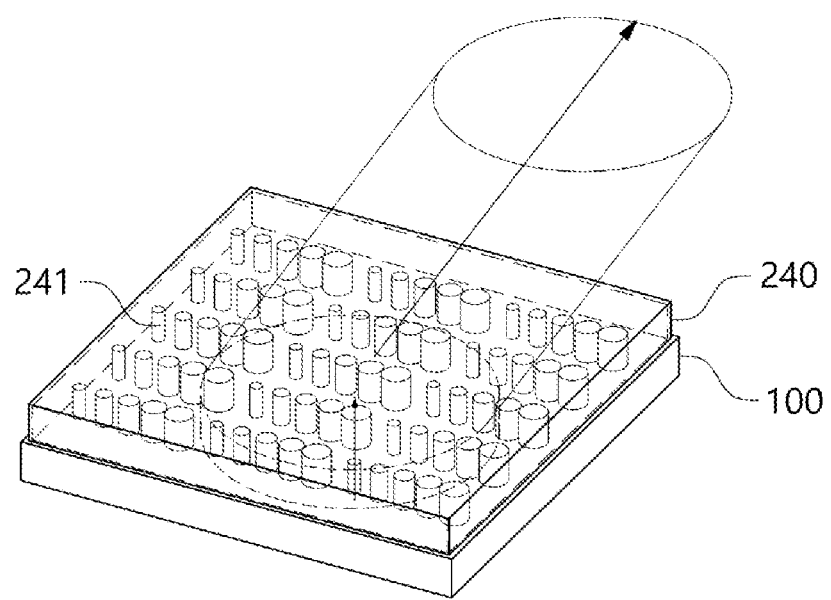
FIG. 18 is a diagram for describing a steering component according to one embodiment.

FIG. 18 is a diagram illustrating a steering component according to an embodiment.

Referring to FIG. 18, the steering component according to an embodiment may include a metasurface 240.

The metasurface 240 may include a plurality of nanopillars 241. For example, the plurality of nanopillars 241 may be disposed on one side of the metasurface 240. Also, for example, the plurality of nanopillars 241 may be disposed on both sides of the metasurface 240.

By adjusting the phase of a laser beam emitted from the laser emitting unit 100, the metasurface 240 may refract the laser beam.

The metasurface 240 may be disposed on the laser emitting unit 100. For example, the metasurface 240 may be disposed to the side of the emission surface of the laser emitting unit 100.

Alternatively, the metasurface 240 may be deposited on the laser emitting unit 100. The plurality of nanopillars 241 may be formed on an upper portion of the laser emitting unit 100. The plurality of nanopillars 241 may form various nanopatterns on the laser emitting unit 100.

The nanopillars 241 may have various shapes. For example, the nanopillars 241 may have a shape such as a circular column, a polygonal column, a circular pyramid, and a polygonal pyramid. In addition, the nanopillars 241 may have an irregular shape.

The nanopillars 241 may form various nanopatterns. The metasurface 240 may steer a laser beam emitted from the laser emitting unit 100 based on the nanopatterns.

The nanopillars 241 may form nanopatterns based on various features. The features may include the width (hereinafter referred to as W), pitch (hereinafter referred to as P), height (hereinafter referred to as H), and the number per unit length of nanopillars 241.

A nanopattern formed based on various features and a method of steering a laser beam according to the nanopattern will be described below.

Figure 19:
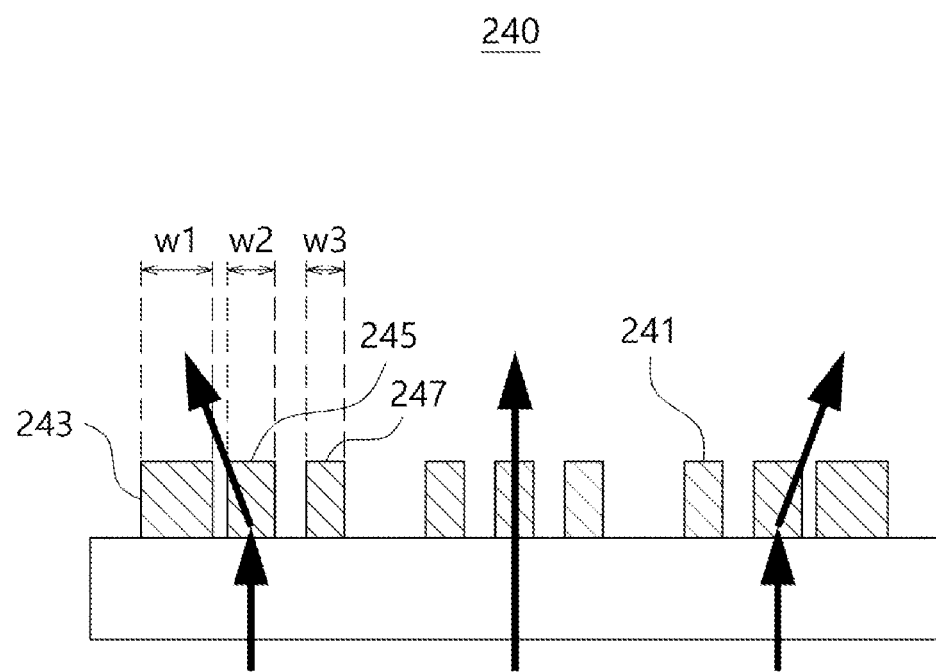
FIG. 19 is a diagram for describing a metasurface according to one embodiment.

FIG. 19 is a diagram illustrating a metasurface according to an embodiment.

Referring to FIG. 19, a metasurface 240 according to an embodiment may include a plurality of nanopillars 241 with different widths W.

The plurality of nanopillars 241 may form nanopatterns based on the widths W. For example, the plurality of nanopillars 241 may be disposed to have widths increasing in one direction (W1, W2, and W3). In this case, a laser beam emitted from a laser emitting unit 100 may be steered in a direction in which the widths W of the nanopillars 241 increase.

For example, the metasurface 240 may include a first nanopillar 243 with a first width W1, a second nanopillar 245 with a second width W2, and a third nanopillar 247 with a third width W3. The first width W1 may be greater than the second width W2 and the third width W3. The second width W2 may be greater than the third width W3. That is, the widths W of the nanopillars 241 may decrease from the first nanopillar 243 to the third nanopillar 247. In this case, when the laser beam emitted from the laser emitting unit 100 passes through the metasurface 240, the laser beam may be steered between a first direction in which the laser beam is emitted from the laser emitting unit 100 and a second direction which is a direction from the third nanopillar 247 to the first nanopillar 243.

Meanwhile, the steering angle θ of the laser beam may vary depending on a change rate of the widths W of the nanopillars 241. Here, the change rate of the widths W of the nanopillars 241 may refer to a numerical value indicating the average change of the widths W of the plurality of nanopillars 241.

The change rate of the widths W of the nanopillars 241 may be calculated based on the difference between the first width W1 and the second width W2 and the difference between the second width W2 and the third width W3.

The difference between the first width W1 and the second width W2 may be different from the difference between the second width W2 and the third width W3.

The steering angle θ of the laser beam may vary depending on the widths W of the nanopillars 241.

In detail, the steering angle θ may increase as the change rate of the widths W of the nanopillars 241 increases.

For example, the nanopillars 241 may form a first pattern with a first change rate on the basis of the widths W. Also, the nanopillars 241 may form a second pattern with a second change rate smaller than the first change rate on the basis of the widths W.

In this case, a first steering angle caused by the first pattern may be greater than a second steering angle caused by the second pattern.

Meanwhile, the steering angle θ may range from −90 degrees to 90 degrees.

Figure 20:
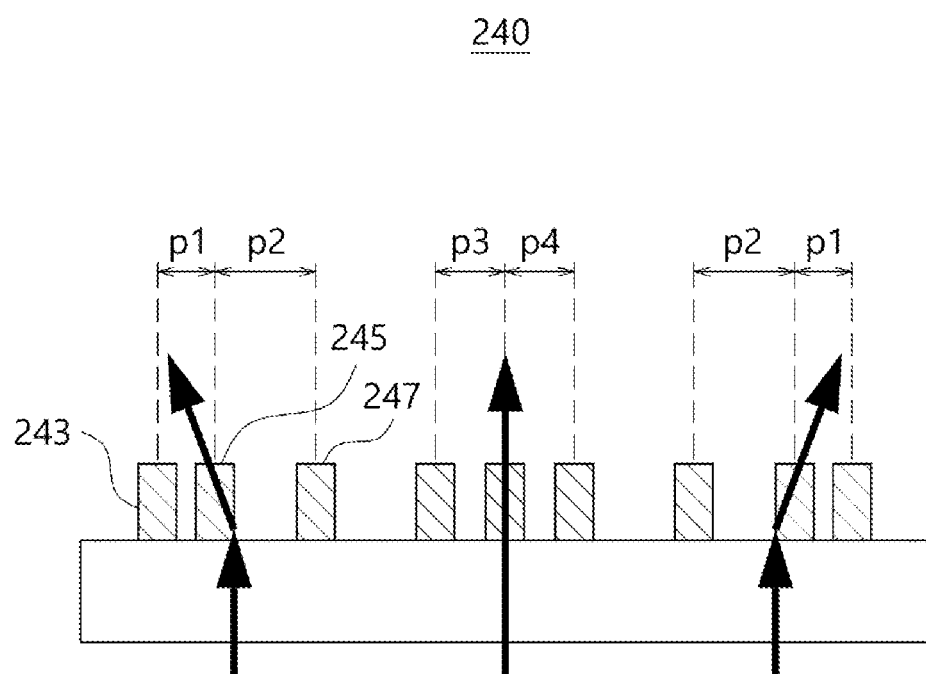
FIG. 20 is a diagram for describing a metasurface according to one embodiment.

FIG. 20 is a diagram illustrating a metasurface according to an embodiment.

Referring to FIG. 20, a metasurface 240 according to an embodiment may include a plurality of nanopillars 241 with different pitches P between adjacent nanopillars 241.

The plurality of nanopillars 241 may form nanopatterns based on a change in the pitches P between the adjacent nanopillars 241. The metasurface 240 may steer a laser beam emitted from the laser emitting unit 100 based on the nanopatterns formed based on the change in the pitches P between the nanopillars 241.

According to an embodiment, the pitches P between the nanopillars 241 may decrease in one direction. Here, a pitch P may refer to a distance between the centers of two adjacent nanopillars 241. For example, a first pitch P may refer to a distance between the center of a first nanopillar 243 and the center of a second nanopillar 245. Alternatively, the first pitch P1 may be defined as the shortest distance between the first nanopillar 243 and the second nanopillar 245.

A laser beam emitted from a laser emitting unit 100 may be steered in a direction in which the pitches P between the nanopillars 241 decrease.

The metasurface 240 may include the first nanopillar 243, the second nanopillar 245, and the third nanopillar 247. In this case, the first pitch P1 may be acquired based on a distance between the first nanopillar 243 and the second nanopillar 245. Likewise, a second pitch P2 may be acquired based on a distance between the second nanopillar 245 and the third nanopillar 247. In this case, the first pitch P1 may be smaller than the second pitch P2. That is, the pitches P may increase from the first nanopillar 243 to the third nanopillar 247.

In this case, when the laser beam emitted from the laser emitting unit 100 passes through the metasurface 240, the laser beam may be steered between a first direction in which the laser beam is emitted from the laser emitting unit 100 and a second direction which is a direction from the third nanopillar 247 to the first nanopillar 243.

The steering angle θ of the laser beam may vary depending on the pitches P between the nanopillars 241.

In detail, the steering angle θ of the laser beam may vary depending on a change rate of the pitches P between the nanopillars 241. Here, the change rate of the pitches P between the nanopillars 241 may refer to a numerical value indicating the average change of the pitches P between adjacent nanopillars 241.

The steering angle θ of the laser beam may increase as the change rate of the pitches P between the nanopillars 241 increases.

For example, the nanopillars 241 may form a first pattern with a first change rate based on the pitches P. Also, the nanopillars 241 may form a second pattern with a second change rate based on the pitches P.

In this case, a first steering angle caused by the first pattern may be greater than a second steering angle caused by the second pattern.

Meanwhile, the above-described principle of steering a laser beam according to a change in the pitches P between the nanopillars 241 is similarly applicable even to a case in which the number per unit length of nanopillars 241 changes.

For example, when the number per unit length of nanopillars 241 changes, the laser beam emitted from the laser emitting unit 100 may be steered between the first direction in which the laser beam is emitted from the laser emitting unit 100 and the second direction in which the number per unit length of nanopillars 241 increases.

Figure 21:
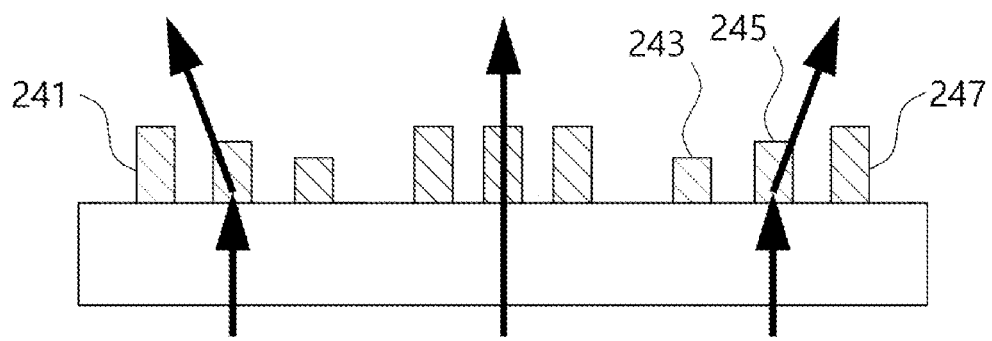
FIG. 21 is a diagram for describing a metasurface according to one embodiment.

FIG. 21 is a diagram illustrating a metasurface according to an embodiment.

Referring to FIG. 21, a metasurface 240 according to an embodiment may include a plurality of nanopillars 241 with different heights H.

The plurality of nanopillars 241 may form nanopatterns on the basis of a change in the heights H of the nanopillars 241.

According to an embodiment, the heights H1, H2, and H3 of the plurality of nanopillars 241 may increase in one direction. A laser beam emitted from a laser emitting unit 100 may be steered in a direction in which the heights H of the nanopillars 241 increase.

For example, the metasurface 240 may include a first nanopillar 243 with a first height H1, a second nanopillar 245 with a second height H2, and a third nanopillar 247 with a third height H3. The third height H3 may be greater than the first height H1 and the second height H2. The second height H2 may be greater than the first height H1. That is, the heights H of the nanopillars 241 may increase from the first nanopillar 243 to the third nanopillar 247. In this case, when the laser beam emitted from the laser emitting unit 100 passes through the metasurface 240, the laser beam may be steered between the first direction in which the laser beam is emitted from the laser emitting unit 100 and the second direction which is a direction from the first nanopillar 243 to the third nanopillar 247.

The steering angle θ of the laser beam may vary depending on the heights H of the nanopillars 241.

In detail, the steering angle θ of the laser beam may vary depending on a change rate of the heights H of the nanopillars 241. Here, the change rate of the heights H of the nanopillars 241 may refer to a numerical value indicating the average change of the heights H of adjacent nanopillars 241.

The change rate of the heights H of the nanopillars 241 may be calculated based on the difference between the first height H1 and the second height H2 and the difference between the second height H2 and the third height H3. The difference between the first height H1 and the second height H2 may be different from the difference between the second height H2 and the third height H3.

The steering angle θ of the laser beam may increase as the change rate of the heights H2 of the nanopillars 241 increases.

For example, the nanopillars 241 may form a first pattern with a first change rate on the basis of the heights H. Also, the nanopillars 241 may form a second pattern with a second change rate on the basis of the heights H.

In this case, a first steering angle caused by the first pattern may be greater than a second steering angle caused by the second pattern.

According to one embodiment, the steering component 230 may include a mirror that reflects the laser beam. For example, the steering component 230 may include a planar mirror, a polygonal mirror, a resonant mirror, a MEMS mirror, and a galvano mirror.

Alternatively, the steering component 230 may include a polygonal mirror that rotates 360 degrees about one axis, and a nodding mirror that is repeatedly driven in a predetermined range about one axis.

Figure 22:
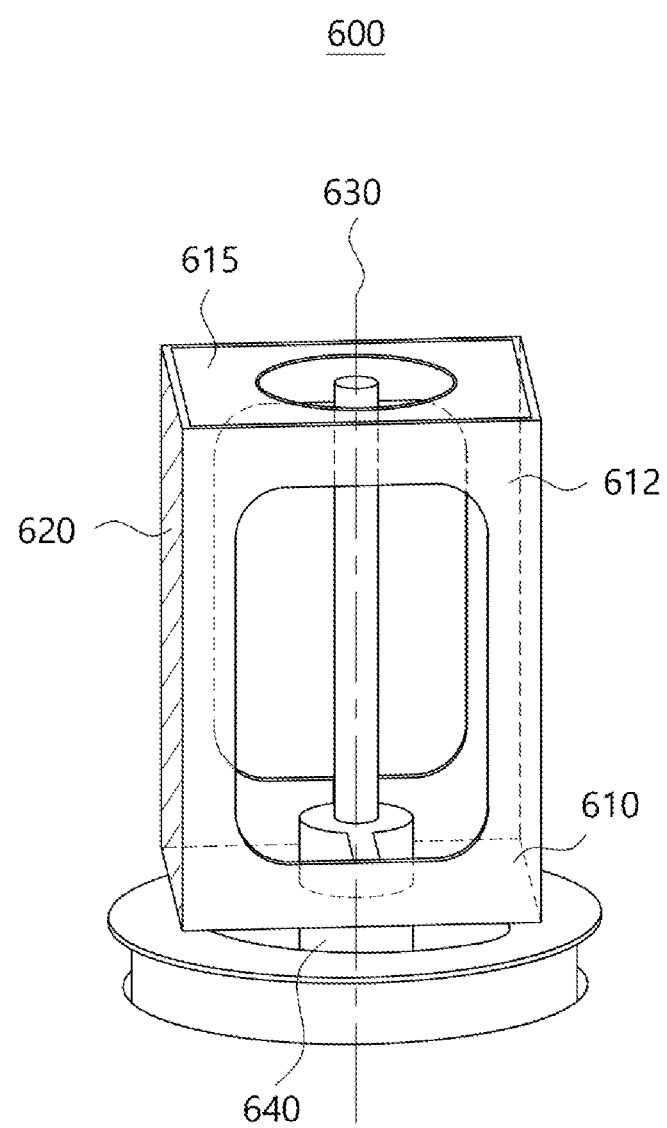
FIG. 22 is a diagram for describing a rotating polygon mirror according to one embodiment.

FIG. 22 is a diagram for describing a polygonal mirror that is a steering component according to one embodiment.

Referring to FIG. 22, a rotating polygonal mirror 600 according to one embodiment may include reflective surfaces 620 and a body and may rotate about a rotation axis 630 vertically passing through a center of each of an upper portion 615 and a lower portion 610 of the body. However, the rotating polygonal mirror 600 may be configured with only some of the above-described components and may include more components. For example, the rotating polygonal mirror 600 may include the reflective surfaces 620 and the body, and the body may be configured with only the lower portion 610. At this point, the reflective surfaces 620 may be supported by the lower portion 610 of the body.

The reflective surfaces 620 are surfaces for reflecting the received laser, and may each include a reflective mirror, a reflective plastic, or the like, but the present disclosure is not limited thereto.

Further, the reflective surfaces 620 may be installed on side surfaces of the body except for the upper portion 615 and the lower portion 610 and may be installed such that a normal line of each thereof is orthogonal to the rotation axis 630. This may be for repetitive scanning of the same scan region by making the scan region of the laser irradiated from each of the reflective surfaces 620 the same.

Further, the reflective surfaces 620 may be installed on the side surfaces of the body except for the upper portion 615 and the lower portion 610 and may be installed such that a normal line of each thereof has a different angle from the rotation axis 630. This may be for expanding the scan region of the LiDAR device by making the scan region of the laser irradiated from each of the reflective surfaces 620 to be different.

Further, each of the reflective surfaces 620 may be formed in a rectangular shape, but is not limited thereto, and may have various shapes such as a triangular shape, a trapezoidal shape, and the like.

Further, the body is for supporting the reflective surfaces 620, and may include the upper portion 615, the lower portion 610, and a column 612 connecting the upper portion 615 and the lower portion 610. In this case, the column 612 may be installed to connect the centers of the upper portion 615 and the lower portion 610 of the body, may be installed to connect each vertex of the upper portion 615 and the lower portion 610 of the body, or may be installed to connect each corner of the upper portion 615 and the lower portion 610 of the body, but is limited to a structure for connecting and supporting the upper portion 615 and the lower portion 610 of the body.

Further, the body may be fastened to a driving unit 640 to receive a driving force for rotating, may be fastened to the driving unit 640 through the lower portion 610 of the body, or may be fastened to the driving unit 640 through the upper portion 615 of the body. In addition, a shape of each of the upper portion 615 and the lower portion 610 of the body may be a polygonal shape. In this case, the shapes of the upper portion 615 and the lower portion 610 of the body may be identical, but are not limited thereto, and may be different from each other.

Further, a size of each of the upper portion 615 and the lower portion 610 of the body may be the same. However, the present disclosure is not limited thereto, and the sizes of the upper portion 615 and the lower portion 610 of the body may be different from each other.

Further, the upper portion 615 and/or the lower portion 610 of the body may include an empty space through which air may pass.

In FIG. 22, the rotating polygonal mirror 600 is illustrated as being a hexahedron in a shape of a tetragonal column including four reflective surfaces 620, but the number of the reflective surfaces 620 of the rotating polygonal mirror 600 is not necessarily four, and the rotating polygonal mirror 600 is not necessarily a hexahedron in the shape of a tetragonal column.

Further, in order to detect a rotation angle of the rotating polygonal mirror 600, the LiDAR device may further include an encoder unit. In addition, the LiDAR device may control the operation of the rotating polygonal mirror 600 using the detected rotation angle. In this case, the encoder unit may be included in the rotating polygonal mirror 600 and may be disposed to be spaced apart from the rotating polygonal mirror 600.

A required field of view (FOV) of the LiDAR device may be different depending on the application. For example, in a case of a fixed LiDAR device for three-dimensional (3D) mapping, the widest viewing angle may be required in vertical and horizontal directions, and in a case of a LiDAR device disposed in a vehicle, a relatively narrow viewing angle may be required in the vertical direction while a relatively wide viewing angle is required in the horizontal direction. In addition, in a case of a LiDAR device disposed in a drone, the widest viewing angle may be required in the vertical and horizontal directions.

Further, the scan region of the LiDAR device may be determined on the basis of the number of reflective surfaces of the rotating polygonal mirror, and the viewing angle of the LiDAR device may be determined accordingly. Thus, the number of reflective surfaces of the rotating polygonal mirror may be determined on the basis of the required viewing angle of the LiDAR device.

Figure 23:
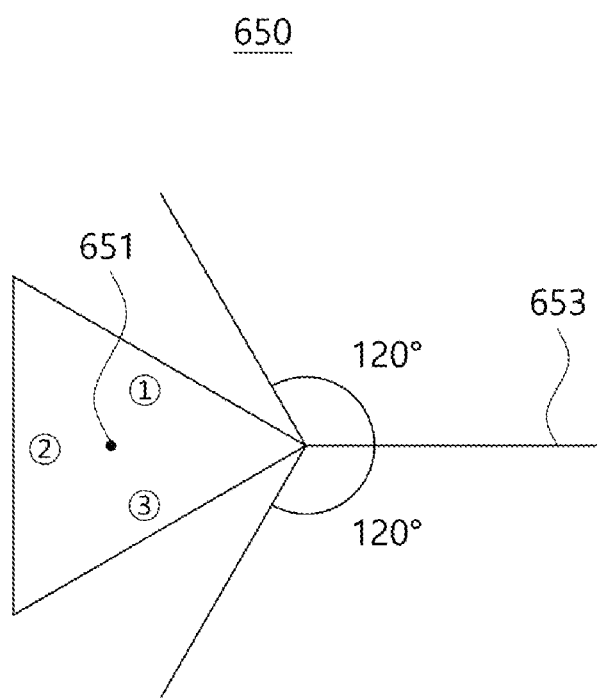
FIG. 23 is a top view for describing a viewing angle of a rotating polygon mirror having three reflective surfaces and a body of which upper and lower portions have an equilateral triangle shape.
Figure 24:
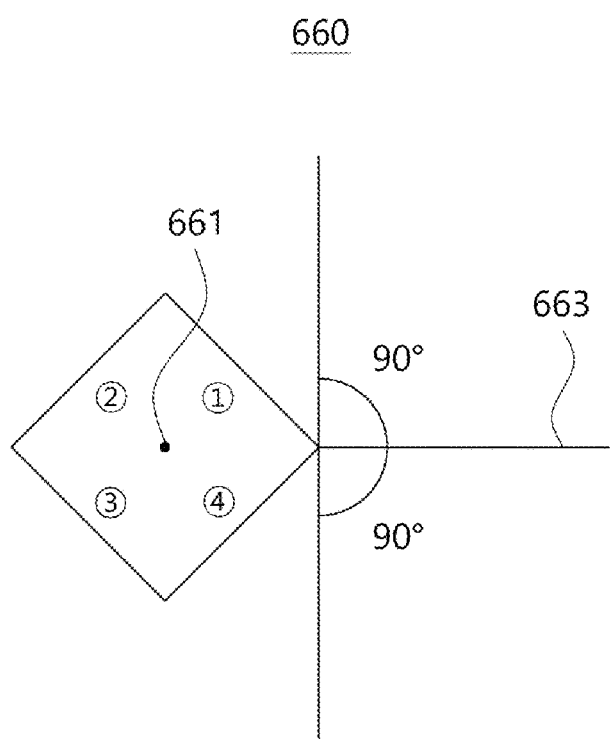
FIG. 24 is a top view for describing a viewing angle of a rotating polygon mirror having four reflective surfaces and a body of which upper and lower portions have a square shape.
Figure 25:
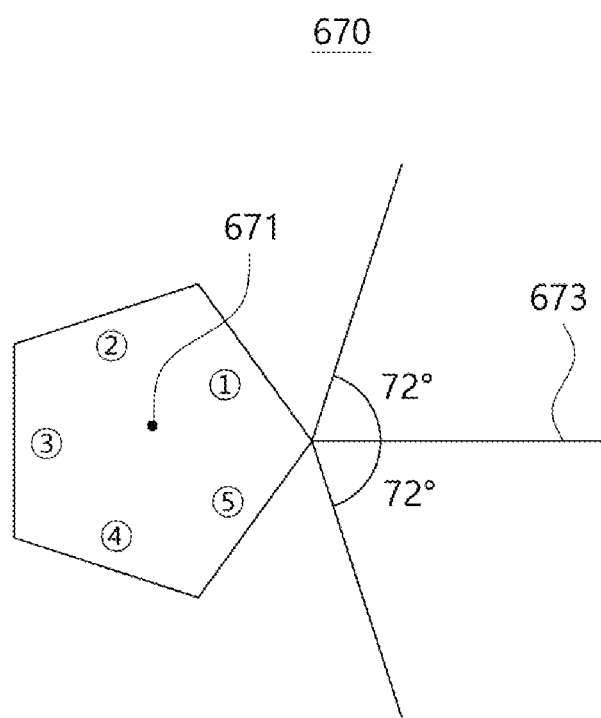
FIG. 25 is a top view for describing a viewing angle of a rotating polygon mirror having five reflective surfaces and a body of which upper and lower portions have a regular pentagon shape.

FIGS. 23 to 25 are diagrams illustrating the relationship between the number of reflective surfaces and the viewing angle.

Cases of three, four, and five reflective surfaces are respectively illustrated in FIGS. 23 to 25, but the number of reflective surfaces is not determined, and when the number of reflective surfaces is different from the above, it may be easily calculated by analogizing the following description. Further, in FIGS. 22 to 24, a case in which the upper and lower portions of the body have a regular polygonal shape is described, but even when the upper and lower portions of the body do not have the regular polygonal shape, it may be easily calculated by analogizing the following description.

FIG. 23 is a top view for describing a viewing angle of a rotating polygonal mirror 650 in which the number of reflective surfaces is three and the shape of each of the upper and lower portions of the body is an equilateral triangle shape.

Referring to FIG. 23, a laser 653 may be incident in a direction consistent with a rotation axis 651 of the rotating polygonal mirror 650. Here, since the upper portion of the rotating polygonal mirror 650 has an equilateral triangle shape, an angle formed by the three reflective surfaces may be 60 degrees. In addition, referring to FIG. 23, when the rotating polygonal mirror 650 is positioned to slightly rotate in a clockwise direction, the laser may be reflected upward in the drawing, and when the rotating polygonal mirror 650 is positioned to slightly rotate in a counterclockwise direction, the laser is reflected downward in the drawing. Thus, when a path of the reflected laser is calculated with reference to FIG. 23, the maximum viewing angle of the rotating polygonal mirror may be obtained.

For example, when the laser is reflected through a first reflective surface of the rotating polygonal mirror 650, the reflected laser may be reflected upward at an angle of 120 degrees with respect to the incident laser 653. In addition, when the laser is reflected through a third reflective surface of the rotating polygonal mirror 650, the reflected laser may be reflected downward at an angle of 120 degrees with respect to the incident laser 653.

Thus, when the number of the reflective surfaces of the rotating polygonal mirror 650 is three, and the shape of each of the upper and lower portions of the body is an equilateral triangle shape, the maximum viewing angle of the rotating polygonal mirror may be 240 degrees.

FIG. 24 is a top view for describing a viewing angle of a rotating polygonal mirror 660 in which the number of reflective surfaces is four and the shape of each of the upper and lower portions of the body is a square shape.

Referring to FIG. 24, a laser 663 may be incident in a direction consistent with a rotation axis 661 of the rotating polygonal mirror 660. Here, since the upper portion of the rotating polygonal mirror 660 has a square shape, an angle formed by the four reflective surfaces may each be 90 degrees. In addition, referring to FIG. 24, when the rotating polygonal mirror 660 is positioned to slightly rotate in a clockwise direction, the laser may be reflected upward in the drawing, and, when the rotating polygonal mirror 660 is positioned to slightly rotate in a counterclockwise direction, the laser is reflected downward in the drawing. Thus, when a path of the reflected laser is calculated with reference to FIG. 24, the maximum viewing angle of the rotating polygonal mirror 660 may be obtained.

For example, when the laser is reflected through a first reflective surface of the rotating polygonal mirror 660, the reflected laser may be reflected upward at an angle of 90 degrees with respect to the incident laser 663. In addition, when the laser is reflected through a fourth reflective surface of the rotating polygonal mirror 660, the reflected laser may be reflected downward at an angle of 90 degrees with respect to the incident laser 663.

Thus, when the number of the reflective surfaces of the rotating polygonal mirror 660 is four, and the shape of each of the upper and lower portions of the body is a square shape, the maximum viewing angle of the rotating polygonal mirror 660 may be 180 degrees.

FIG. 25 is a top view for describing a viewing angle of a rotating polygonal mirror 670 in which the number of reflective surfaces is five and the shape of each of the upper and lower portions of the body is a regular pentagonal shape.

Referring to FIG. 25, a laser 673 may be incident in a direction consistent with a rotation axis 671 of the rotating polygonal mirror 670. Here, since the upper portion of the rotating polygonal mirror 670 has a regular pentagonal shape, an angle formed by the five reflective surfaces may each be 108 degrees. In addition, referring to FIG. 25, when the rotating polygonal mirror 670 is positioned to slightly rotate in a clockwise direction, the laser may be reflected upward in the drawing, and, when the rotating polygonal mirror 670 is positioned to slightly rotate in a counterclockwise direction, the laser is reflected downward in the drawing. Thus, when a path of the reflected laser is calculated with reference to FIG. 25, the maximum viewing angle of the rotating polygonal mirror may be obtained.

For example, when the laser is reflected through a first reflective surface of the rotating polygonal mirror 670, the reflected laser may be reflected upward at an angle of 72 degrees with respect to the incident laser 673. In addition, when the laser is reflected through a fifth reflective surface of the rotating polygonal mirror 670, the reflected laser may be reflected downward at an angle of 72 degrees with respect to the incident laser 673.

Thus, when the number of the reflective surfaces of the rotating polygonal mirror 670 is five, and the shape of each of the upper and lower portions of the body is a regular pentagonal shape, the maximum viewing angle of the rotating polygonal mirror may be 144 degrees.

As a result, referring to FIGS. 23 to 25 described above, in a case in which the number of reflective surfaces of the rotating polygonal mirror is N, and each of the upper and lower portions of the body has an N-polygon, when an inner angle of the N-polygon is referred to as a theta, the maximum viewing angle of the rotating polygonal mirror may be 360 degrees-2 theta.

However, the above-described viewing angle of the rotating polygonal mirror is only the calculated maximum value, and thus, a viewing angle determined by the rotating polygonal mirror in the LiDAR device may be less than the calculated maximum value. Further, in this case, the LiDAR device may use only a portion of each of the reflective surfaces of the rotating polygonal minor for scanning.

When a scanning unit of the LiDAR device includes a rotating polygonal mirror, the rotating polygonal mirror may be used to irradiate a laser emitted from a laser emitting unit toward a scan region of the LiDAR device, and may also be used for a detecting unit to receive the laser reflected from an object existing on the scan region.

Here, a portion of each of the reflective surfaces of the rotating polygonal minor, which is used to irradiate the emitted laser to the scan region of the LiDAR device, will be referred to as an irradiated portion. In addition, a portion of each of the reflective surfaces of the rotating polygonal mirror, which is used for the detecting unit to receive the laser reflected from the object existing on the scan region, will be referred to as a light-receiving portion.

Figure 26:
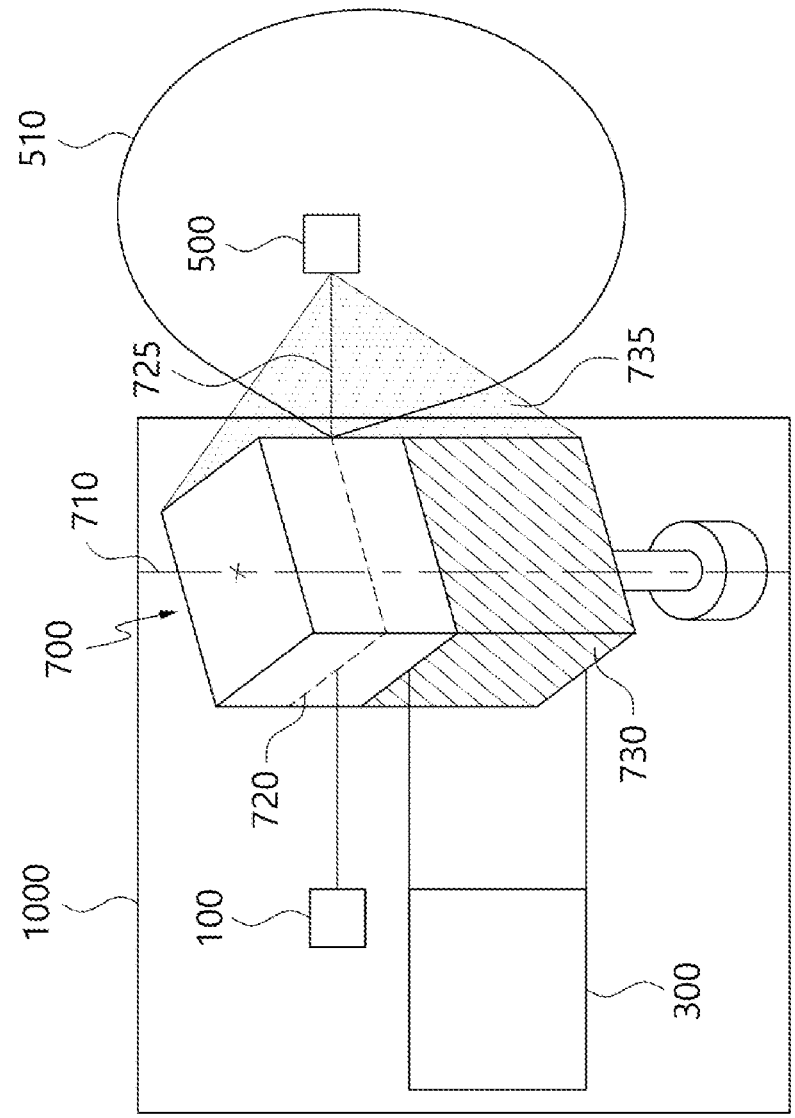
FIG. 26 is a diagram for describing a radiating part and a light receiving part of a rotating polygon mirror according to one embodiment.

FIG. 26 is a diagram for describing an irradiated portion and a light-receiving portion of a rotating polygonal minor according to one embodiment.

Referring to FIG. 26, a laser emitted from the laser emitting unit 100 may have a point-shaped irradiation region and may be incident on each of reflective surfaces of a rotating polygonal minor 700. However, although not illustrated in FIG. 26, the laser emitted from the laser emitting unit 100 may have a line- or planar-shaped irradiation region.

When the laser emitted from the laser emitting unit 100 has a point-shaped irradiation region, in the rotating polygonal minor 700, an irradiated portion 720 may have a linear shape formed by connecting a point, at which the emitted laser meets the rotating polygonal mirror, in a rotational direction of the rotating polygonal mirror. Thus, in this case, the irradiated portion 720 of the rotating polygonal mirror 700 may be positioned on each of the reflective surfaces in a linear shape in a direction perpendicular to a rotation axis 710 of the rotating polygonal mirror 700.

Further, a laser 725, which is irradiated from the irradiated portion 720 of the rotating polygonal mirror 700 and irradiated to a scan region 510 of the LiDAR device 1000, may be reflected from an object 500 existing on a scan region 510, and a laser 735 reflected from the object 500 may be reflected in a larger range than an irradiated laser 725. Thus, the laser 735 reflected from the object 500 may be parallel to the irradiated laser 725 and may be received by the LiDAR device 1000 in a wider range.

At this point, the laser 735 reflected from the object 500 may be transmitted in a larger size than the reflective surface of the rotating polygonal mirror 700. Meanwhile, a light-receiving portion 730 of the rotating polygonal mirror 700 is a portion that used for the detecting unit 300 to receive the laser 735 reflected from the object 500 and may be a portion of the reflective surface that is less in size than the reflective surface of the rotating polygonal mirror 700.

For example, as illustrated in FIG. 26, when the laser 735 reflected from the object 500 is transmitted toward the detecting unit 300 through the rotating polygonal mirror 700, a portion of the reflective surface of the rotating polygonal mirror 700, which reflects the reflected laser 735 so as to be transmitted toward the detecting unit 300, may be the light-receiving portion 730. Thus, the light-receiving portion 730 of the rotating polygonal mirror 700 may be a portion formed by extending the portion of the reflective surface, which reflects the laser 735 so as to be transmitted toward the detecting unit 300, in a rotational direction of the rotating polygonal mirror 700.

Further, when a light condensing lens is further included between the rotating polygonal mirror 700 and the detecting unit 300, the light-receiving portion 730 of the rotating polygonal mirror 700 may be a portion formed by extending the portion of the reflective surface, which reflects the laser 735 so as to be transmitted toward the light condensing lens, in the rotational direction of the rotating polygonal mirror 700.

Although it is illustrated in FIG. 26 that the irradiated portion 720 and the light-receiving portion 730 of the rotating polygonal mirror 700 are spaced apart from each other, the irradiated portion 720 and the light-receiving portion 730 of the rotating polygonal mirror 700 may partially overlap each other, and the irradiated portion 720 may be included in the light-receiving portion 730.

Further, according to one embodiment, the steering component 230 may include an optical phased array (OPA) or the like in order to change a phase of an emitted laser, and change an irradiation direction accordingly, but the present disclosure is not limited thereto.

A LiDAR device according to an embodiment may include an optic unit configured to direct a laser beam emitted from a laser emitting unit to an object.

The optic unit may include a beam collimation and steering component (BCSC) configured to collimate and steer a laser beam emitted from a laser beam output unit. The BCSC may include one component or a plurality of components.

Figure 27:
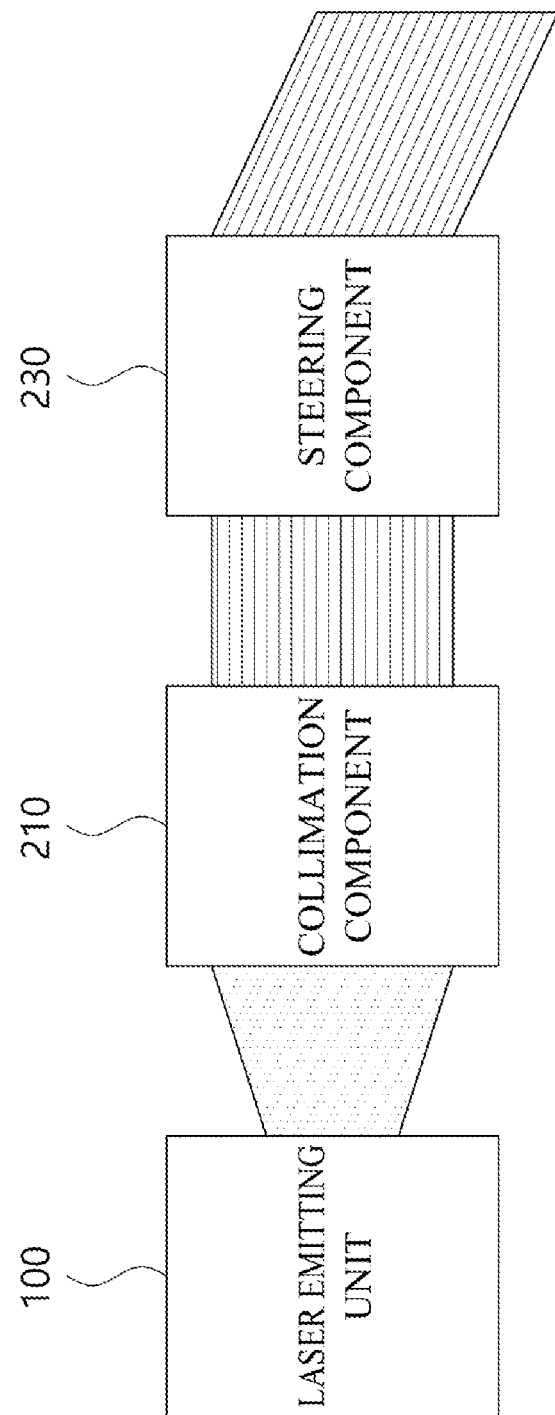
FIG. 27 is a diagram for describing an optic unit according to one embodiment.

FIG. 27 is a diagram illustrating an optic unit according to an embodiment.

Referring to FIG. 27, the optic unit according to an embodiment may include a plurality of components. For example, the optic unit may include a collimation component 210 and a steering component 230.

According to an embodiment, the collimation component 210 may serve to collimate a beam emitted from a laser emitting unit 100, and the steering component 230 may serve to steer a collimated beam emitted from the collimation component 210. As a result, the laser beam emitted from the optic unit may travel in a predetermined direction.

The collimation component 210 may be a microlens or a metasurface.

When the collimation component 210 is a microlens, a microlens array may be disposed on one side of a substrate or on both sides of a substrate.

When the collimation component 210 is a metasurface, a laser beam may be collimated by a nanopattern formed by a plurality of nanopillars included in the metasurface.

The steering component 230 may be a microlens, a microprism, or a metasurface.

When the steering component 230 is a microlens, a microlens array may be disposed on one side of a substrate or on both sides of a substrate.

When the steering component 230 is a microprism, a laser beam may be steered by the angle of the microprism.

When the steering component 230 is a metasurface, a laser beam may be steered by a nanopattern formed by a plurality of nanopillars included in the metasurface.

According to one embodiment, when the optic unit includes a plurality of components, it may be necessary to correctly arrange the plurality of components. At this point, the collimation component and the steering component may be properly disposed using an alignment mark. Further, a printed circuit board (PCB), the VCSEL array, the collimation component, and the steering component may be correctly disposed using the alignment mark.

For example, the VCSEL array and the collimation component may be correctly disposed by inserting the alignment mark into an edge portion of the VCSEL array or between the VCSEL units included in the VCSEL array.

Further, for example, the collimation component and the steering component may be correctly disposed by inserting the alignment mark into an edge portion of the collimation component or between the collimation component and the steering component.

Figure 28:
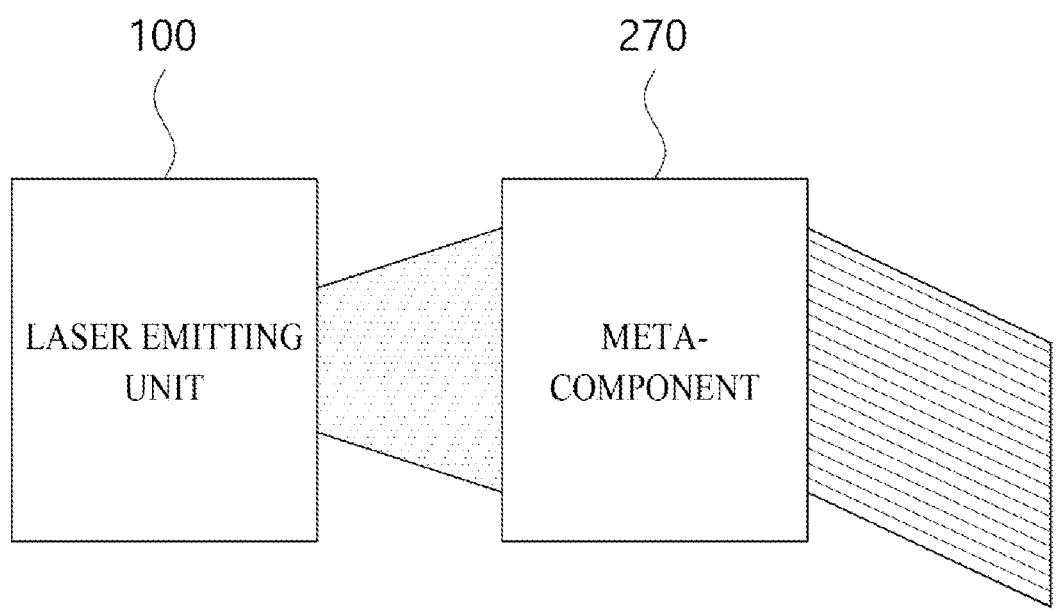
FIG. 28 is a diagram for describing an optic unit according to one embodiment.

FIG. 28 is a diagram illustrating an optic unit according to an embodiment.

Referring to FIG. 28, the optic unit according to an embodiment may include one single component. For example, the optic unit may include a meta-component 270.

According to an embodiment, the meta-component 270 may collimate or steer a laser beam emitted from a laser emitting unit 100.

For example, the meta-component 270 may include a plurality of metasurfaces. One metasurface may collimate a laser beam emitted from the laser emitting unit 100, and another metasurface may steer a collimated laser beam. This will be described in detail below with reference to FIG. 23.

Alternatively, for example, the meta-component 270 may include one metasurface, which may collimate and steer a laser beam emitted from the laser emitting unit 100. This will be described in detail below with reference to FIG. 24.

Figure 29:
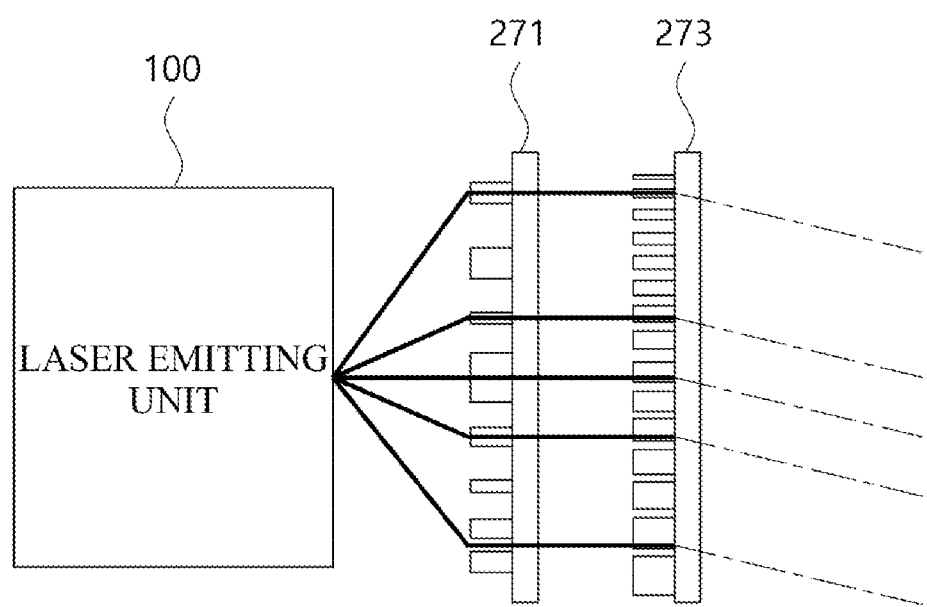
FIG. 29 is a diagram for describing a meta-component according to one embodiment.

FIG. 29 is a diagram illustrating a meta-component according to an embodiment.

Referring to FIG. 29, a meta-component 270 according to an embodiment may include a plurality of metasurfaces 271 and 273. For example, the meta-component 270 may include a first metasurface 271 and a second metasurface 273.

The first metasurface 271 may be disposed in a direction in which a laser beam is emitted from a laser emitting unit 100. The first metasurface 271 may include a plurality of nanopillars. The first metasurface 271 may form a nanopattern using the plurality of nanopillars. The first metasurface 271 may utilize the formed nanopattern to collimate a laser beam emitted from the laser emitting unit 100.

The second metasurface 273 may be disposed in a direction in which a laser beam is emitted from the first metasurface 271. The second metasurface 273 may include a plurality of nanopillars. The second metasurface 273 may form a nanopattern using the plurality of nanopillars. The second metasurface 273 may steer a laser beam emitted from the laser emitting unit 100 according to the formed nanopattern. For example, as shown in FIG. 23, the second metasurface 273 may steer the laser beam in a specific direction according to a change rate of the widths W of the plurality of nanopillars. Also, the second metasurface 273 may steer the laser beam in a specific direction according to the pitches P, the heights H, and the number per unit length of nanopillars.

Figure 30:
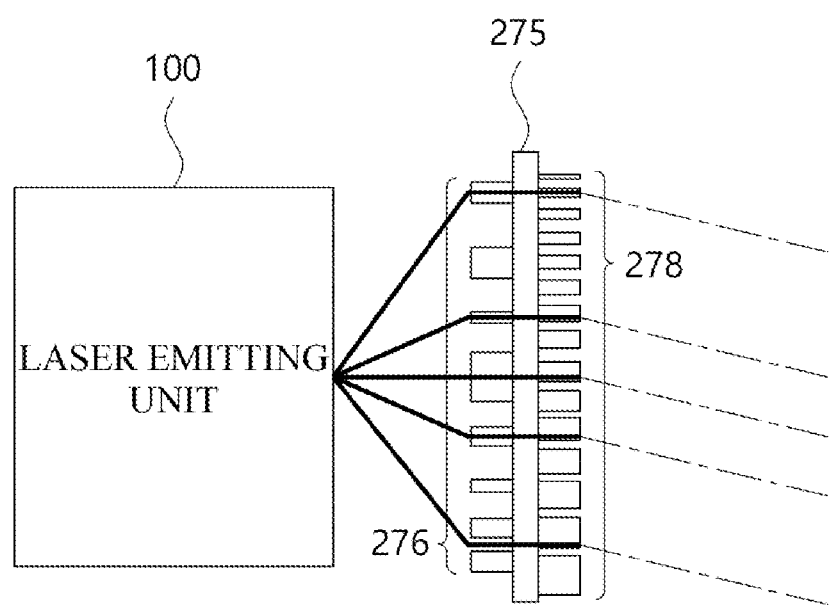
FIG. 30 is a diagram for describing a meta-component according to another embodiment.

FIG. 30 is a diagram illustrating a meta-component according to another embodiment.

Referring to FIG. 30, a meta-component 270 according to an embodiment may include one metasurface 274.

The metasurface 275 may include a plurality of nanopillars on both sides. For example, the metasurface 275 may include a first nanopillar set 276 on a first side and a second nanopillar set 278 on a second side.

The metasurface 275 may collimate a laser beam emitted from a laser emitting unit 100 and then steer the collimated laser beam using a plurality of nanopillars forming a nanopattern on each of the sides.

For example, the first nanopillar set 276 disposed on one side of the metasurface 275 may form a nanopattern. A laser beam emitted from the laser emitting unit 100 may be collimated by the nanopattern formed by the first nanopillar set 276. The second nanopillar set 278 disposed on the other side of the metasurface 275 may form a nanopattern. A laser beam having passed through the first nanopillar set 276 may be steered in a specific direction by the nanopattern formed by the second nanopillar set 278.

Figure 31:
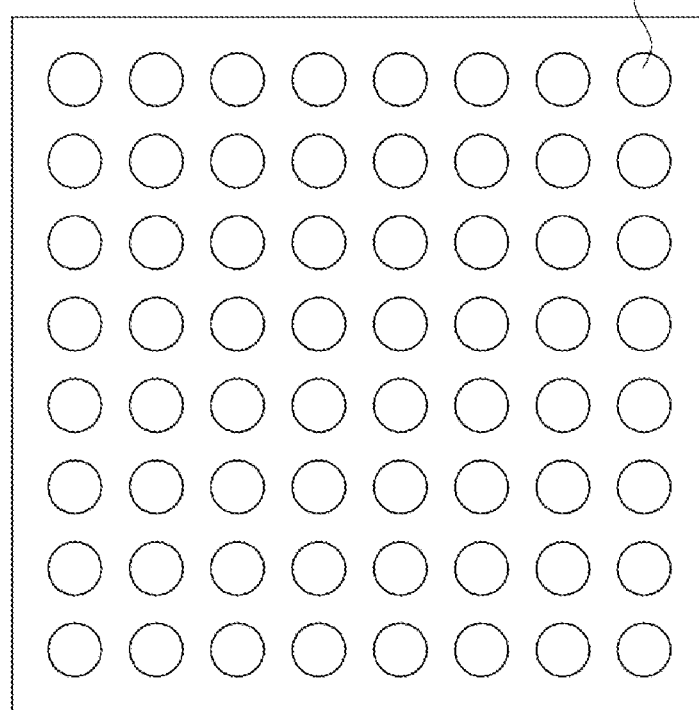
FIG. 31 is a diagram for describing a single photon avalanche diode (SPAD) array according to one embodiment.

FIG. 31 is a diagram for describing a SPAD array according to one embodiment.

Referring to FIG. 31, the detecting unit 300 according to one embodiment may include a SPAD array 750. FIG. 31 illustrates a SPAD array in an 8×8 matrix, but the present disclosure is not limited thereto, and the SPAD array in a 10×10 matrix, a 12×12 matrix, a 24×24 matrix, a 64×64 matrix, and the like may be used.

The SPAD array 750 according to one embodiment may include a plurality of SPADs 751. For example, the plurality of SPADs 751 may be disposed in a matrix structure, but is not limited thereto, and may be disposed in a circular structure, an elliptical structure, a honeycomb structure, or the like.

When a laser beam is incident on the SPAD array 750, photons may be detected due to an avalanche phenomenon. According to one embodiment, results from the SPAD array 750 may be accumulated in the form of a histogram.

Figure 32:
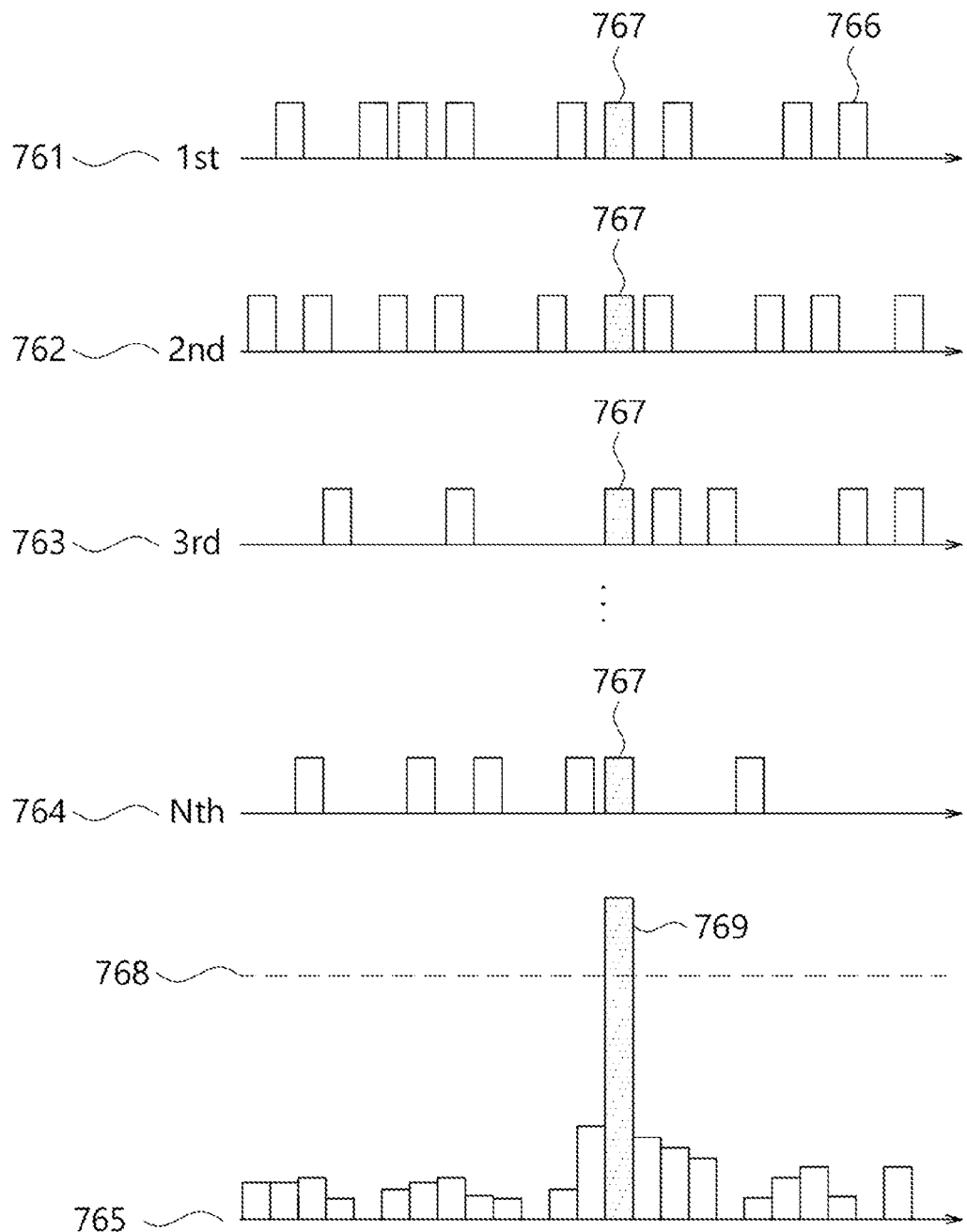
FIG. 32 shows diagrams for describing a histogram of an SPAD according to one embodiment.

FIG. 32 is a diagram for describing a histogram for a SPAD according to one embodiment.

Referring to FIG. 32, the SPAD 751 according to one embodiment may detect photons. When the SPAD 751 detects photons, signals 766 and 767 may be generated.

A recovery time may be required for the SPAD 751 to return to a state capable of detecting photons again after detecting photons. When the SPAD 751 detects photons and the recovery time has not elapsed, even when photons are incident on the SPAD 751 at this time, the SPAD 751 is unable to detect the photons. Accordingly, a resolution of the SPAD 751 may be determined by the recovery time.

According to one embodiment, the SPAD 751 may detect photons for a predetermined period of time after a laser beam is emitted from a laser emitting unit. At this point, the SPAD 751 may detect photons for a cycle of predetermined time. For example, the SPAD 751 may detect photons several times according to a time resolution of the SPAD 751 during the cycle. At this point, the time resolution of the SPAD 751 may be determined by the recovery time of the SPAD 751.

According to one embodiment, the SPAD 751 may detect photons reflected from an object and other photons. For example, the SPAD 751 may generate the signal 767 when detecting the photons reflected from the object.

Further, for example, the SPAD 751 may generate the signal 766 when detecting photons other than the photons reflected from the object. In this case, the photons other than the photons reflected from the object may be sunlight, a laser beam reflected from a window, and the like.

According to one embodiment, the SPAD 751 may detect photons for a cycle of predetermined time after the laser beam is emitted from the laser emitting unit.

For example, the SPAD 751 may detect photons for a first cycle after a first laser beam is emitted from the laser emitting unit. At this point, the SPAD 751 may generate a first detection signal 761 after detecting the photons.

Further, for example, the SPAD 751 may detect photons for a second cycle after a second laser beam is emitted from the laser emitting unit. At this point, the SPAD 751 may generate a second detection signal 762 after detecting the photons.

Further, for example, the SPAD 751 may detect photons for a third cycle after a third laser beam is emitted from the laser emitting unit. At this point, the SPAD 751 may generate a third detection signal 763 after detecting the photons.

Further, for example, the SPAD 751 may detect photons for an Nth cycle after an Nth laser beam is emitted from the laser emitting unit. At this point, the SPAD 751 may generate an Nth detection signal 764 after detecting the photons.

Here, each of the first detection signal 761, the second detection signal 762, the third detection signal 763, . . . , and the Nth detection signal 764 may include the signal 767 generated by detecting photons reflected from the object or the signal 766 generated by detecting photons other than the photon reflected by the object.

In this case, the Nth detection signal 764 may be a photon detection signal generated for the Nth cycle after the Nth laser beam is emitted. For example, N may be 5, 10, 20, 30, 40, 50, 60, 70, 80, 90, 100, 200, 300, or the like.

The signals generated by the SPAD 751 may be accumulated in the form of a histogram. The histogram may have a plurality of histogram bins. The signals generated by the SPAD 751 may be accumulated in the form of a histogram to respectively correspond to the histogram bins.

For example, the histogram may be formed by accumulating signals generated by one SPAD 751, or may be formed by accumulating signals generated by the plurality of SPADs 751.

For example, a histogram 765 may be formed by accumulating the first detection signal 761, the second detection signal 762, the third detection signal 763, . . . , and the Nth detection signal 764. In this case, the histogram 765 may include a signal generated due to photons reflected from the object or a signal generated due to the other photons.

In order to obtain distance information of the object, it is necessary to extract a signal generated due to photons reflected from the object from the histogram 765. The signal generated due to the photons reflected from the object may be greater in amount and more regular than the signal generated due to the other photons.

At this point, the signal generated due to the photons reflected from the object may be regularly present at a specific time within the cycle. On the other hand, the signal generated due to sunlight may be small in amount and irregularly present.

There is a high possibility that a signal having a large accumulation amount of the histogram at a specific time is a signal generated due to photons reflected from the object. Accordingly, of the accumulated histogram 765, a signal having a large accumulation amount may be extracted as a signal generated due to photons reflected from the object.

For example, of the histogram 765, a signal 769 having the highest value may be simply extracted as a signal generated due to photons reflected from the object. Further, for example, of the histogram 765, a signal 769 having a value greater than or equal to a predetermined amount 768 may be extracted as a signal generated due to photons reflected from the object.

In addition to the method described above, there may be various algorithms that may extract as a signal, which is generated due to photons reflected from the object, from the histogram 765.

The signal generated due to photons reflected from the object is extracted from the histogram 765, and then, based on a generation time of the corresponding signal, a reception time of the photons, or the like, the distance information of the object may be calculated.

For example, the signal extracted from the histogram 765 may be a signal at one scan point. At this point, one scan point may correspond to one SPAD.

For another example, the signals extracted from the plurality of histograms may be signals at one scan point. At this point, one scan point may correspond to the plurality of SPADs.

According to another embodiment, the signals extracted from the plurality of histograms may be calculated as a signal at one scan point by applying weights thereto. At this point, the weights may be determined by a distance between the SPADs.

For example, a signal at a first scan point may be calculated by applying a weight of 0.8 to a signal by a first SPAD, applying a weight of 0.6 to a signal by a second SPAD, applying a weight of 0.4 to a signal by a third SPAD, and applying a weight of 0.2 to a signal by a fourth SPAD.

When the signals extracted from the plurality of histograms are calculated as a signal at one scan point by applying weights thereto, it is possible to obtain an effect of accumulating the histogram multiple times with one accumulation of the histogram. Thus, a scan time may be reduced, and an effect of reducing the time to obtain the entire image may be derived.

According to still another embodiment, the laser emitting unit may emit a laser beam to be addressable. Alternatively, the laser emitting unit may emit a laser beam to be addressable for each VCSEL unit.

For example, the laser emitting unit may emit a laser beam from a VCSEL unit in a first row and first column one time, and then emit a laser beam from a VCSEL unit in a first row and third column one time, and then emit a laser beam from a VCSEL unit in a second row and fourth column one time. As described above, the laser emitting unit may emit a laser beam from a VCSEL unit in an Ath row and Bth column N times, and then emit a laser beam from a VCSEL unit of a Cth row and Dth column M times.

At this point, the SPAD array may receive, among the laser beam emitted from the corresponding VCSEL unit, the laser beam reflected from the object.

For example, when the VCSEL unit in the first row and first column emits the laser beam N times in a sequence of emitting the laser beam by the laser emitting unit, a SPAD unit in a first row and first column corresponding to the first row and first column may receive the laser beam reflected from the object up to N times.

Further, for example, when the reflected laser beam should be accumulated N times in the histogram of the SPAD, and there are M VCSEL units in the laser emitting unit, it is possible to operate the M VCSEL units N times at once. Alternatively, it is possible to operate M VCSEL units one by one M*N times, and it is also possible to operate M VCSEL units for every five VCSEL units M*N/5 times.

Figure 33:
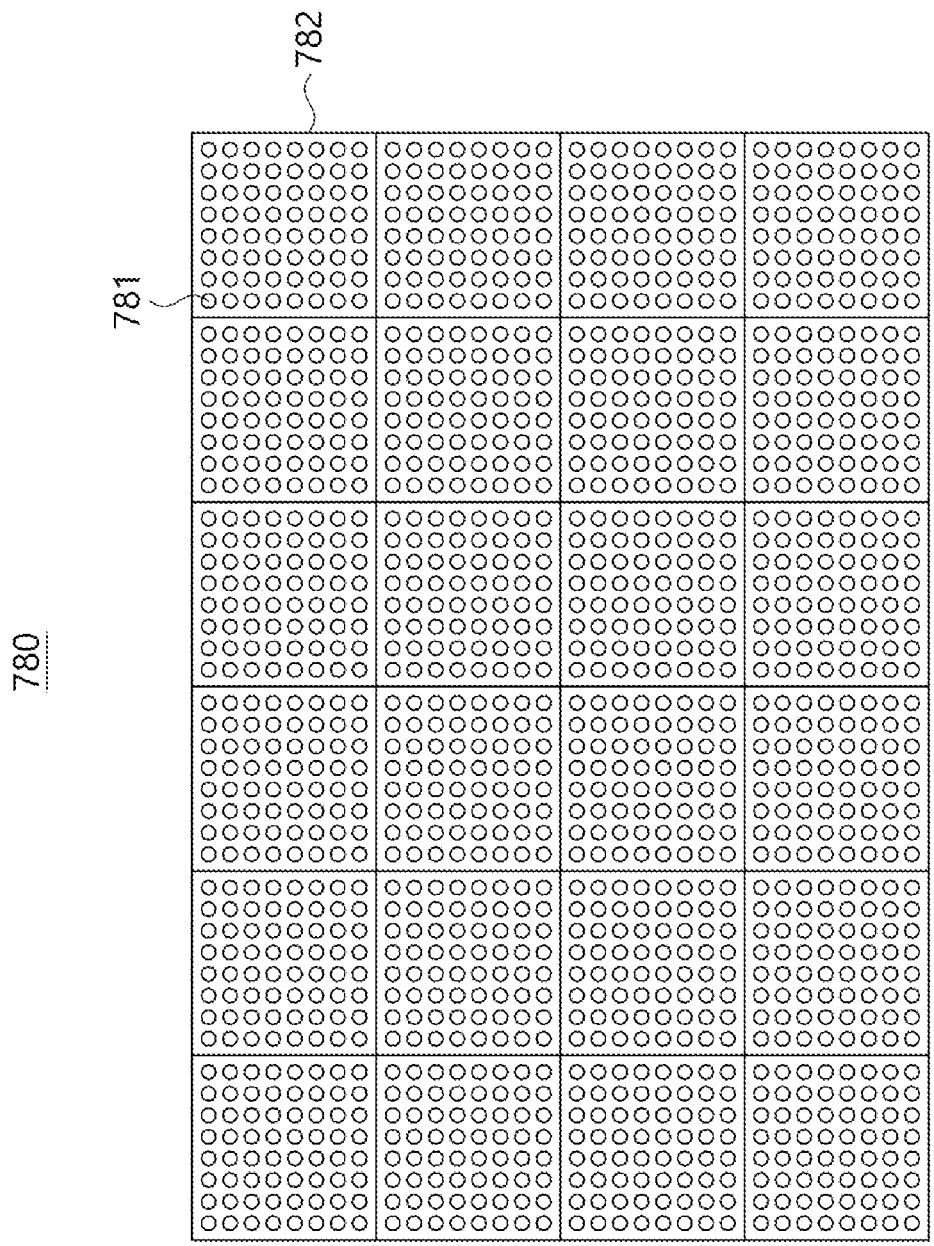
FIG. 33 is a diagram for describing a silicon photomultiplier (SiPM) according to one embodiment.

FIG. 33 is a diagram for describing a SiPM according to one embodiment.

Referring to FIG. 33, the detecting unit 300 according to one embodiment may include a SiPM 780. The SiPM 780 according to one embodiment may include a plurality of microcells 781 and a plurality of microcell units 782. For example, each of the microcells may be a SPAD. For example, each of the microcell units 782 may be a SPAD array, which is a set of a plurality of SPADs.

The SiPM 780 according to one embodiment may include the plurality of microcell units 782. In FIG. 33, the SiPM 780 is illustrated as being formed by the microcell units 782 disposed in a 4×6 matrix, but is not limited thereto, and may be formed by the microcell units 782 disposed in a 10×10, 12×12, 24×24, or 64×64 matrix. Further, although the microcell units 782 may be disposed in a matrix structure, the present disclosure is not limited thereto, and the microcell units 782 may be disposed in a circular structure, an elliptical structure, a honeycomb structure, or the like.

When a laser beam is incident on the SiPM 780, photons may be detected due to an avalanche phenomenon. According to one embodiment, results from the SiPM 780 may be accumulated in the form of a histogram.

There are several differences between the histogram by the SiPM 780 and the histogram by the SPAD 751.

As described above, the histogram by the SPAD 751 may be formed by accumulating N detection signals formed by receiving the laser beam N times by one SPAD 751. In addition, the histogram by the SPAD 751 may be formed by accumulating X*Y detection signals formed by receiving the laser beam Y times by X SPADs 751.

On the other hand, the histogram by the SiPM 780 may be formed by accumulating signals generated by one microcell units 782, or may be formed by accumulating signals generated by the plurality of microcell units 782.

According to one embodiment, one microcell unit 782 may form a histogram by detecting photons reflected from the object after a first laser beam is emitted from the laser emitting unit.

For example, the histogram by the SiPM 780 may be formed by accumulating signals generated by detecting photons, which are reflected from the object, by the plurality of microcells included in one microcell unit 782.

According to another embodiment, the plurality of microcell units 782 may form a histogram by detecting photons reflected from the object after a first laser beam is emitted from the laser emitting unit.

For example, the histogram by the SiPM 780 may be formed by accumulating signals generated by detecting photons, which are reflected from the object, by the plurality of microcells included in the plurality of microcell units 782.

In the histogram by the SPAD 751, one SPAD 751 or a plurality of SPADs 751 requires that the laser emitting unit emits the laser beam N times. However, in the histogram formed by the SiPM 780, one microcell unit 782 or the plurality of microcell units 782 require that the laser emitting unit emits the laser beam only one time.

Accordingly, the time to accumulate the histogram may take longer in the histogram by the SPAD 751 than in the histogram by the SiPM 780. The histogram by the SiPM 780 is advantageous in that the histogram may be quickly formed with only one laser beam emission.

Figure 34:
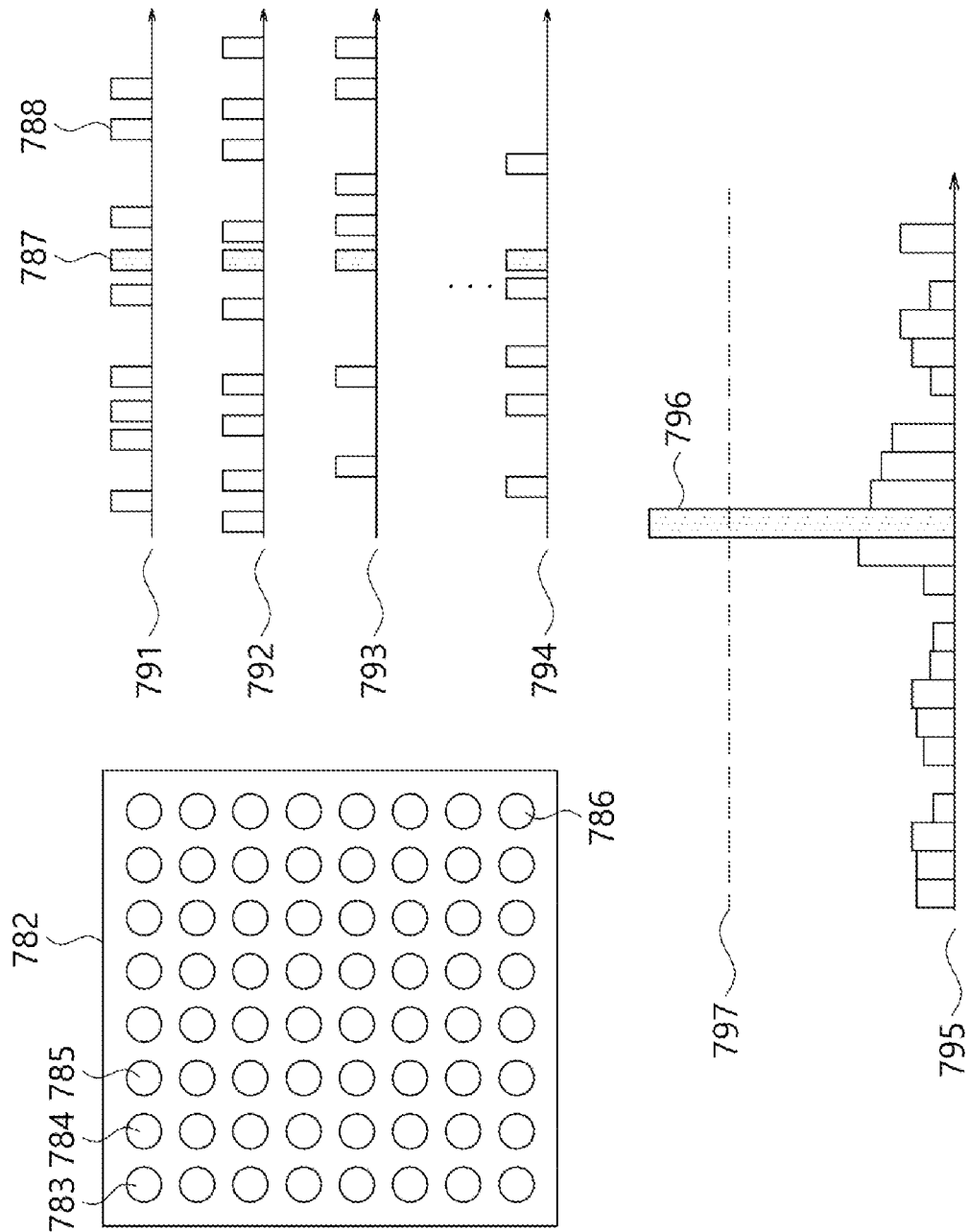
FIG. 34 shows diagrams for describing a histogram of an SIPM according to one embodiment.

FIG. 34 is a diagram for describing a histogram of a SiPM according to one embodiment.

Referring to FIG. 34, the SiPM 780 according to one embodiment may detect photons. For example, the microcell unit 782 may detect photons. When the microcell unit 782 detects photons, signals 787 and 788 may be generated.

A recovery time may be required for the microcell unit 782 to return to a state capable of detecting photons again after detecting photons. When the microcell unit 782 detects photons and the recovery time has not elapsed, even when photons are incident on the microcell unit 782 at this time, the microcell unit 782 is unable to detect photons. Accordingly, a resolution of the microcell unit 782 may be determined by the recovery time.

According to one embodiment, the microcell unit 782 may detect photons for a predetermined period of time after the laser beam is emitted from the laser emitting unit. At this point, the microcell unit 782 may detect photons for a cycle of predetermined time. For example, the microcell unit 782 may detect photons several times according to a time resolution of the microcell unit 782 during the cycle. At this point, the time resolution of the microcell unit 782 may be determined by the recovery time of the microcell unit 782.

According to one embodiment, the microcell unit 782 may detect photons reflected from an object and other photons. For example, the microcell unit 782 may generate the signal 787 when detecting the photons reflected from the object.

Further, for example, the microcell unit 782 may generate the signal 788 when detecting photons other than the photons reflected from the object. In this case, the photons other than the photons reflected from the object may be sunlight, a laser beam reflected from a window, and the like.

According to one embodiment, the microcell unit 782 may detect photons for a cycle of predetermined time after the laser beam is emitted from the laser emitting unit.

For example, a first microcell 783 included in the microcell unit 782 may detect photons for a first cycle after a laser beam is emitted from the laser emitting unit. At this point, the first microcell 783 may generate a first detection signal 791 after detecting the photons.

Further, for example, a second microcell 784 included in the microcell unit 782 may detect photons for a first cycle after a laser beam is emitted from the laser emitting unit. At this point, the second microcell 784 may generate a second detection signal 792 after detecting the photons.

Further, for example, a third microcell 785 included in the microcell unit 782 may detect photons for a first cycle after a laser beam is emitted from the laser emitting unit. At this point, the third microcell 785 may generate a third detection signal 793 after detecting the photons.

Further, for example, an Nth microcell 786 included in the microcell unit 782 may detect photons for a first cycle after a laser beam is emitted from the laser emitting unit. At this point, the Nth microcell 786 may generate an Nth detection signal 794 after detecting the photons.

Here, each of the first detection signal 791, the second detection signal 792, the third detection signal 793, . . . , and the Nth detection signal 794 may include the signal 787 generated by detecting photons reflected from the object or the signal 788 generated by detecting photons other than the photon reflected by the object.

Here, the Nth detection signal 764 may be a photon detection signal of the Nth microcell included in the microcell unit 782. For example, N may be 5, 10, 20, 30, 40, 50, 60, 70, 80, 90, 100, 200, 300, or the like.

The signals generated by the microcells may be accumulated in the form of a histogram. The histogram may have a plurality of histogram bins. The signals generated by the microcells may be accumulated in the form of a histogram to respectively correspond to the histogram bins.

For example, the histogram may be formed by accumulating signals generated by one microcell units 782, or may be formed by accumulating signals generated by the plurality of microcell units 782.

For example, a histogram 795 may be formed by accumulating the first detection signal 791, the second detection signal 792, the third detection signal 793, . . . , and the Nth detection signal 794. In this case, the histogram 795 may include a signal generated due to photons reflected from the object or a signal generated due to the other photons.

In order to obtain distance information of the object, it is necessary to extract a signal generated due to photons reflected from the object from the histogram 795. The signal generated due to the photons reflected from the object may be greater in amount and more regular than the signal generated due to the other photons.

At this point, the signal generated due to the photons reflected from the object may be regularly present at a specific time within the cycle. On the other hand, the signal generated due to sunlight may be small in amount and irregularly present.

There is a high possibility that a signal having a large accumulation amount of the histogram at a specific time is a signal generated due to photons reflected from the object. Accordingly, of the accumulated histogram 795, a signal having a large accumulation amount may be extracted as a signal generated due to photons reflected from the object.

For example, of the histogram 795, a signal 796 having the highest value may be simply extracted as a signal generated due to photons reflected from the object. Further, for example, of the histogram 795, a signal 796 having a value greater than or equal to a predetermined amount 797 may be extracted as a signal generated due to photons reflected from the object.

In addition to the method described above, there may be various algorithms that may extract signals generated due to photons reflected from the object from the histogram 795.

The signal generated due to photons reflected from the object is extracted from the histogram 795, and then, based on a generation time of the corresponding signal, a reception time of the photons, or the like, the distance information of the object may be calculated.

According to still another embodiment, the laser emitting unit may emit a laser beam to be addressable. Alternatively, the laser emitting unit may emit a laser beam to be addressable for each VCSEL unit.

For example, the laser emitting unit may emit a laser beam from a VCSEL unit in a first row and first column one time, and then emit a laser beam from a VCSEL unit in a first row and third column one time, and then emit a laser beam from a VCSEL unit in a second row and fourth column one time. As described above, the laser emitting unit may emit a laser beam from a VCSEL unit in an Ath row and Bth column N times, and then emit a laser beam from a VCSEL unit of a Cth row and Dth column M times.

At this point, the SiPM may receive, among the laser beam emitted from the corresponding VCSEL unit, the laser beam reflected from the object.

For example, when the VCSEL unit in the first row and first column emits the laser beam N times in a sequence of emitting the laser beam by the laser emitting unit, a microcell unit in a first row and first column corresponding to the first row and first column of the VCSEL unit may receive the laser beam reflected from the object up to N times.

Further, for example, when the reflected laser beam should be accumulated N times in the histogram for the SiPM, and there are M VCSEL units in the laser emitting unit, it is possible to operate the M VCSEL units N times at once. Alternatively, it is possible to operate M VCSEL units one by one M*N times, and it is also possible to operate M VCSEL units for every five VCSEL units M*N/5 times.

The LiDAR may be implemented in various methods. For example, the LiDAR may be implemented using a flash method and a scanning method.

As described above, the flash method is a method using a laser beam that spreads toward an object through the divergence of the laser beam. In the flash method, since distance information of the object may be collected by illuminating a single laser pulse on an FOV, a resolution of a flash LiDAR may be determined by a detecting unit or a reception unit.

Further, as described above, the scanning method is a method of directing a laser beam emitted from a laser emitting unit in a specific direction. In the scanning method, since a laser beam is illuminated on a FOV using a scanner or a steering unit, a resolution of a scanning LiDAR may be determined by the scanner or the steering unit.

According to one embodiment, the LiDAR may be implemented in a mixed method of the flash method and the scanning method. In this case, the mixed method of the flash method and the scanning method may be a semi-flash method or a semi-scanning method. Alternatively, the mixed method of the flash method and the scanning method may be a quasi-flash method or a quasi-scanning method.

The semi-flash LiDAR or the quasi-flash LiDAR may refer to a similar-flash LiDAR rather than a full-flash LiDAR. For example, one unit of the laser emitting unit and one unit of the reception unit may operate in a flash LiDAR, but a plurality of units of the laser emitting unit and a plurality of units of the reception unit may be combined to operate as a similar-flash LiDAR rather than a full-flash LiDAR.

Further, for example, since a laser beam emitted from the laser emitting unit of either the semi-flash LiDAR or the quasi-flash LiDAR may pass through the steering unit, the semi-flash LiDAR or the quasi-flash LiDAR may be a similar-flash LiDAR rather than a full-flash LiDAR.

The semi-flash LiDAR or the quasi-flash LiDAR may overcome the disadvantage of the flash LiDAR. For example, there are problems in the flash LiDAR, such as, it is susceptible to an interference phenomenon between laser beams, a strong flash may be required to detect an object, and a detection range may not be limited.

However, since the laser beams pass through the steering unit, the semi-flash LiDAR or the quasi-flash LiDAR may overcome the interference phenomenon between the laser beams and control each laser emitting unit, so that the detection range may be controlled and the strong flash may not be required.

Figure 35:
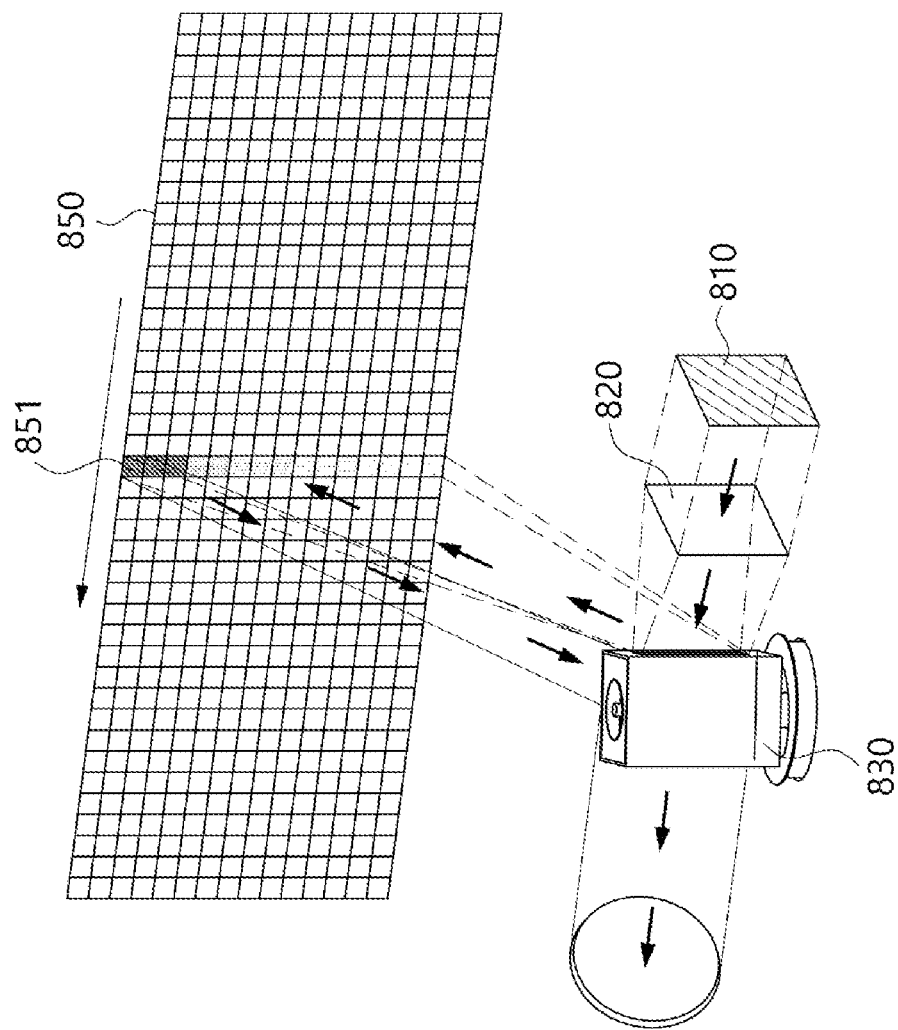
FIG. 35 shows diagrams for describing a semi-flash LiDAR according to one embodiment.

FIG. 35 is a diagram for describing a semi-flash LiDAR according to one embodiment.

Referring to FIG. 35, a semi-flash LiDAR 800 according to one embodiment may include a laser emitting unit 810, a BCSC 820, a scanning unit 830, and a reception unit 840.

The semi-flash LiDAR 800 according to one embodiment may include the laser emitting unit 810. For example, the laser emitting unit 810 may include a VCSEL array. At this point, the laser emitting unit 810 may include a VCSEL array composed of units each including a plurality of VCSEL emitters.

The semi-flash LiDAR 800 according to one embodiment may include the BCSC 820. For example, the BCSC 820 may include a collimation component 210 and a steering component 230.

According to one embodiment, a laser beam emitted from the laser emitting unit 810 is collimated by the collimation component 210 of the BCSC 820, and the collimated laser beam may be steered through the steering component 230 of the BCSC 820.

For example, a laser beam emitted from a first VCSEL unit included in the laser emitting unit 810 may be collimated by a first collimation component and may be steered in a first direction by a first steering component.

For example, a laser beam emitted from a second VCSEL unit included in the laser emitting unit 810 may be collimated by a second collimation component, and may be steered in a second direction by a second steering component.

At this point, the VCSEL units included in the laser emitting unit 810 may be steered in different directions. Accordingly, unlike the flash method using the divergence of a single pulse, the laser beam of the laser emitting unit of the semi-flash LiDAR may be steered in a specific direction by the BCSC. Thus, the laser beam emitted from the laser emitting unit of the semi-flash LiDAR may have directionality due to the BCSC.

The semi-flash LiDAR 800 according to one embodiment may include the scanning unit 830. For example, the scanning unit 830 may include an optic unit 200. For example, the scanning unit 830 may include a mirror that reflects a laser beam.

For example, the scanning unit 830 may include a planar mirror, a polygonal mirror, a resonant mirror, a MEMS mirror, and a galvano mirror. Further, for example, the scanning unit 830 may include a polygonal mirror that rotates 360 degrees about one axis, and a nodding mirror that is repeatedly driven in a predetermined range about one axis.

The semi-flash LiDAR may include a scanning unit. Thus, unlike the flash method in which the entire image is obtained at once due to the divergence of a single pulse, the semi-flash LiDAR may scan an image of an object using the scanning unit.

In addition, the object may be randomly scanned by the laser emitted from the laser emitting unit of the semi-flash LiDAR. Thus, of the entire FOV, the semi-flash LiDAR may intensively scan only a desired region of interest 851.

The semi-flash LiDAR 800 according to one embodiment may include the reception unit 840. For example, the reception unit 840 may include a detecting unit 300. Further, for example, the reception unit 840 may be the SPAD array 750. Also, for example, the reception unit 840 may be the SiPM 780.

The reception unit 840 may include various sensor elements. For example, the reception unit 840 may include a PN photodiode, a phototransistor, a PIN photodiode, an avalanche photodiode (APD), a single-photon avalanche diode (SPAD), silicon photomultipliers (SiPM), a time-to-digital converter (TDC), a complementary metal-oxide-semiconductor (CMOS), a charge-coupled device (CCD), or the like, but the present disclosure is not limited thereto. At this point, the reception unit 840 may cause a histogram to be accumulated. For example, the reception unit 840 may detect a time point, at which a laser beam reflected from an object 850 is received, using the histogram.

The reception unit 840 according to one embodiment may include one or more optical elements. For example, the reception unit 840 may include an aperture, a microlens, a converging lens, a diffuser, or the like, but the present disclosure is not limited thereto.

Further, the reception unit 840 according to one embodiment may include one or more optical filters. The reception unit 840 may receive a laser reflected from an object through the optical filter. For example, the reception unit 840 may include a band-pass filter, a dichroic filter, a guided-mode resonance filter, a polarizer, a wedge filter, or the like, but the present disclosure is not limited thereto.

According to one embodiment, the semi-flash LiDAR 800 may have a predetermined light path between the components.

For example, light emitted from the laser emitting unit 810 may be incident on the scanning unit 830 through the BCSC 820. Further, the light incident on the scanning unit 830 may be reflected from the scanning unit 830 and incident on the object 850. Further, the light incident on the object 850 may be reflected from the object 850 and incident on the scanning unit 830 again. Further, the light incident on the scanning unit 830 may be reflected from scanning unit 830 and received by the reception unit 840. A lens for increasing light-transmitting/receiving efficiency may be additionally inserted into the above-described light path.

Figure 36:
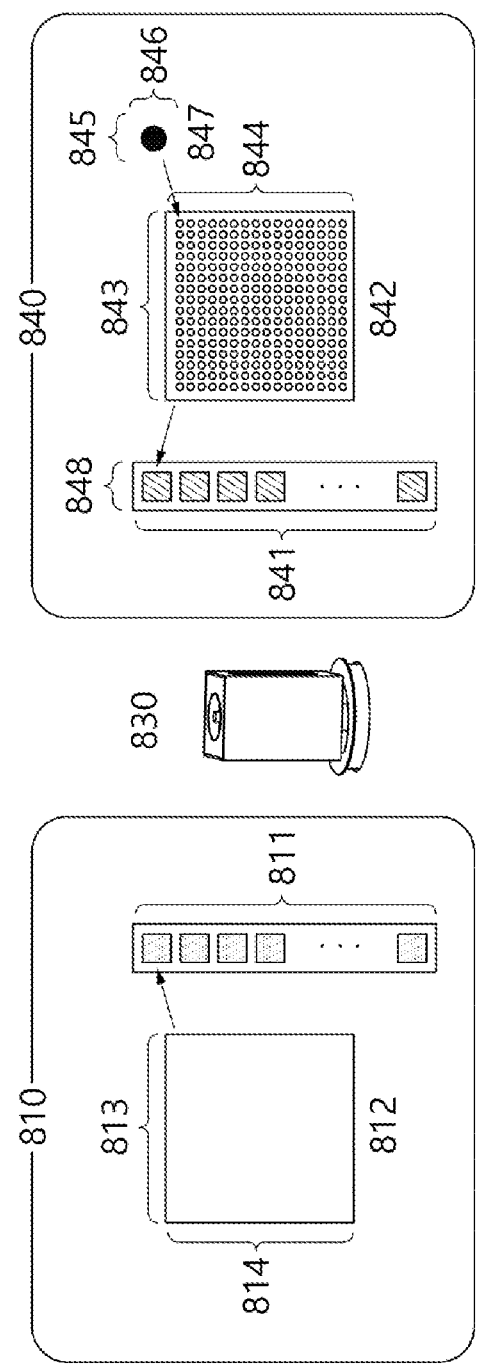
FIG. 36 is a diagram for describing a configuration of a semi-flash LiDAR according to one embodiment.

FIG. 36 is a diagram for describing a configuration of the semi-flash LiDAR according to one embodiment.

Referring to FIG. 36, the semi-flash LiDAR 800 according to one embodiment may include the laser emitting unit 810, the scanning unit 830, and the reception unit 840.

According to one embodiment, the laser emitting unit 810 may include a VCSEL array 811. Only one column of the VCSEL array 811 is shown in FIG. 36, but the present disclosure is not limited thereto, and the VCSEL array 811 may be formed in an N*M matrix structure.

According to one embodiment, the VCSEL array 811 may include a plurality of VCSEL units 812. Here, each of the VCSEL units 812 may include a plurality of VCSEL emitters. For example, the VCSEL array 811 may include 25 VCSEL units 812. In this case, the 25 VCSEL units 812 may be arranged in one column, but the present disclosure is not limited thereto.

According to one embodiment, each of the VCSEL units 812 may have a divergence angle. For example, the VCSEL unit 812 may have a horizontal divergence angle 813 and a vertical divergence angle 814. For example, the VCSEL unit 812 may have the horizontal divergence angle 813 of 1.2 degrees and the vertical divergence angle 814 of 1.2 degrees, but the present disclosure is not limited thereto.

According to one embodiment, the scanning unit 830 may receive a laser beam emitted from the laser emitting unit 810. At this point, the scanning unit 830 may reflect the laser beam toward an object. In addition, the scanning unit 830 may receive a laser beam reflected from the object. At this point, the scanning unit 830 may transmit the laser beam reflected from the object to the reception unit 840.

In this case, a region from which the laser beam is reflected toward the object and a region to which the laser beam reflected from the object is received may be the same or different. For example, the region from which the laser beam is reflected toward the object and the region to which the laser beam reflected from the object is received may be in the same reflective surface. In this case, the regions may be divided into upper and lower portions or left and right portions within the same reflective surface.

Further, for example, the region from which the laser beam is reflected toward the object and the region to which the laser beam reflected from the object is received may be different reflective surfaces. For example, the region from which the laser beam is reflected toward the object may be a first reflective surface of the scanning unit 830, and the region to which the laser beam reflected from the object is received may be a second reflective surface of the scanning unit 830.

According to one embodiment, the scanning unit 830 may reflect a 2D laser beam emitted from the laser emitting unit 810 toward the object. At this point, as the scanning unit 830 rotates or scans, the LiDAR device may three-dimensionally scan the object.

According to one embodiment, the reception unit 840 may include a SPAD array 841. Only one column of the SPAD array 841 is shown in FIG. 36, but the present disclosure is not limited thereto, and the SPAD array 841 may be formed in an N*M matrix structure.

According to one embodiment, the SPAD array 841 may include a plurality of SPAD units 842. At this point, each of the SPAD units 842 may include a plurality of SPAD pixels 847. For example, each of the SPAD units 842 may include 12×12 SPAD pixels 847. In this case, each of the SPAD pixels 847 may refer to one SPAD element, but the present disclosure is not limited thereto.

Further, for example, the SPAD array 841 may include 25 SPAD units 842. In this case, the 25 SPAD units 842 may be arranged in one column, but the present disclosure is not limited thereto. Further, in this case, the arrangement of the SPAD units 842 may correspond to the arrangement of the VCSEL units 812.

According to one embodiment, each of the SPAD units 842 may have an FOV at which light may be received. For example, the SPAD unit 842 may have a horizontal FOV 843 and a vertical FOV 844. For example, the SPAD unit 842 may have the horizontal FOV 843 of 1.2 degrees and the vertical FOV 844 of 1.2 degrees.

At this point, the FOV of the SPAD unit 842 may be proportional to the number of SPAD pixels 847 included in the SPAD unit 842. Alternatively, an FOV of the individual SPAD pixel 847 included in the SPAD unit 842 may be determined by the FOV of the SPAD unit 842.

For example, in a case in which each of a horizontal FOV 845 and a vertical FOV 846 of the individual SPAD pixel 847 is 0.1 degrees, when the SPAD unit 842 includes N*M SPAD pixels 847, the horizontal FOV 843 and the vertical FOV 844 of the SPAD unit 842 may be 0.1*N and 0.1*M, respectively.

Further, for example, in a case in which each of the horizontal FOV 843 and the vertical FOV 844 of the SPAD unit 842 is 1.2 degrees, when the SPAD unit 842 includes 12×12 SPAD pixels 847, the horizontal FOV 845 and the vertical FOV 846 of the individual SPAD pixel 847 may each be 0.1 degrees (=1.2/12).

According to another embodiment, the reception unit 840 may include a SiPM array 841. Only one column of the SiPM array 841 is shown in FIG. 36, but the present disclosure is not limited thereto, and the SiPM array 841 may be formed in an N*M matrix structure.

According to one embodiment, the SiPM array 841 may include a plurality of microcell units 842. Here, each of the microcell units 842 may include a plurality of microcells 847. For example, each of the microcell units 842 may include 12×12 microcells 847.

Further, for example, the SiPM array 841 may include 25 microcell units 842. In this case, the 25 microcell units 842 may be arranged in one column, but the present disclosure is not limited thereto. Further, in this case, the arrangement of the microcell units 842 may correspond to the arrangement of the VCSEL units 812.

According to one embodiment, each of the microcell units 842 may have an FOV at which light may be received. For example, the microcell unit 842 may have the horizontal FOV 843 and the vertical FOV 844. For example, the microcell unit 842 may have the horizontal FOV 843 of 1.2 degrees and the vertical FOV 844 of 1.2 degrees.

Here, the FOV of the microcell unit 842 may be proportional to the number of microcells included in the microcell unit 842. Alternatively, an FOV of the individual microcell 847 included in the microcell unit 842 may be determined by the FOV of the microcell unit 842.

For example, in a case in which each of the horizontal FOV 845 and the vertical FOV 846 of the individual microcell 847 is 0.1 degrees, when the microcell unit 842 includes N*M microcells 847, the horizontal FOV 843 and the vertical FOV 844 of the microcell unit 842 may be 0.1*N and 0.1*M, respectively.

Further, for example, in a case in which each of the horizontal FOV 843 and the vertical FOV 844 of the microcell unit 842 is 1.2 degrees, when the microcell unit 842 includes 12×12 microcells 847, the horizontal FOV 845 and the vertical FOV 846 of the individual microcell 847 may each be 0.1 degrees (=1.2/12).

According to another embodiment, one VCSEL unit 812 may correspond to the plurality of SPAD units or microcell units 842. For example, a laser beam emitted from the VCSEL unit 812 in a first row and first column may be reflected from the scanning unit 830 and the object 850 and received by the SPAD units or microcell units 842 in the first row and first column and a first row and second column.

According to still another embodiment, the plurality of VCSEL units 812 may correspond to one SPAD unit or microcell unit 842. For example, a laser beam emitted from the VCSEL unit 812 in the first row and first column may be reflected from the scanning unit 830 and the object 850 and received by the SPAD unit or microcell unit 842 in the first row and first column.

According to one embodiment, the VCSEL unit 812 of the laser emitting unit 810 may correspond to the SPAD unit or microcell unit 842 of the reception unit 840.

For example, the horizontal divergence angle and the vertical divergence angle of the VCSEL units 812 may be respectively identical to the horizontal FOV 845 and the vertical FOV 846 of the SPAD unit or microcell unit 842.

For example, the laser beam emitted from the VCSEL unit 812 in the first row and first column may be reflected from the scanning unit 830 and the object 850 and received by the SPAD unit or microcell unit 842 in the first row and first column.

Further, for example, a laser beam emitted from the VCSEL unit 812 in an Nth row and Mth column may be reflected from the scanning unit 830 and the object 850 and received by the SPAD unit or microcell unit 842 in the Nth row and Mth column.

At this point, the laser, which is emitted from the VCSEL unit 812 in the Nth row and Mth column and reflected from the scanning unit 830 and the object 850, may be received by the SPAD unit or microcell unit 842 in the Nth row and Mth column, and the LiDAR device 800 may have a resolution by the SPAD unit or microcell unit 842.

For example, when the SPAD unit or microcell unit 842 includes SPAD pixels or microcells 847 of N rows*M columns, the VCSEL unit 812 may recognize distance information of the object by dividing the FOV, at which light is irradiated, into N*M regions.

According to another embodiment, one VCSEL unit 812 may correspond to the plurality of SPAD units or microcell units 842. For example, a laser beam emitted from the VCSEL unit 812 in a first row and first column may be reflected from the scanning unit 830 and the object 850 and received by the SPAD units or microcell units 842 in the first row and first column and a first row and second column.

According to still another embodiment, the plurality of VCSEL units 812 may correspond to one SPAD unit or microcell unit 842. For example, the laser beam emitted from the VCSEL unit 812 in the first row and first column may be reflected from the scanning unit 830 and the object 850 and received by the SPAD unit or microcell unit 842 in the first row and first column.

According to one embodiment, the plurality of VCSEL units 812 included in the laser emitting unit 810 may operate according to a predetermined sequence or may operate randomly. At this point, the SPAD unit or microcell unit 842 of the reception unit 840 may also operate corresponding to the operation of the VCSEL unit 812.

For example, in the VCSEL array 811, the VCSEL unit in a third row may operate after the VCSEL unit in a first row operates. Thereafter, the VCSEL unit in a fifth row may operate, and then the VCSEL unit in a seventh row may operate.

In this case, in the reception unit 840, the SPAD unit or microcell unit 842 in a third row may operate after the SPAD unit or microcell unit 842 in a first row operates. Thereafter, the SPAD unit or microcell unit 842 in a fifth row may operate, and then the SPAD unit or microcell unit 842 in a seventh row may operate.

Further, for example, the VCSEL units of the VCSEL array 811 may operate randomly. At this point, the SPAD unit or microcell unit 842 of the reception unit, which is present at a position corresponding to the position of the randomly operating VCSEL unit 812, may operate.

Figure 37:
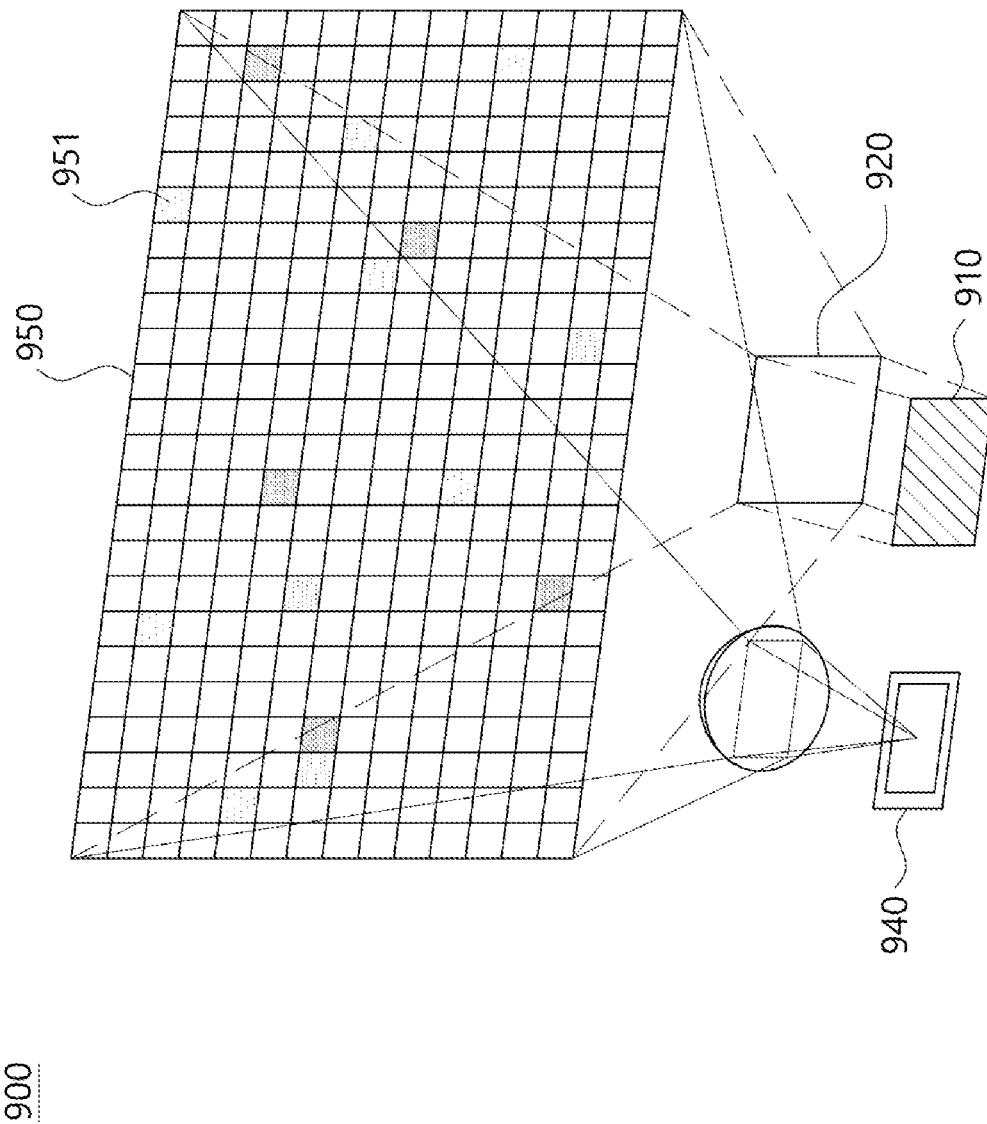
FIG. 37 shows diagrams for describing a configuration of a semi-flash LiDAR according to another embodiment.

FIG. 37 is a diagram for describing a semi-flash LiDAR according to another embodiment.

Referring to FIG. 37, a semi-flash LiDAR 900 according to another embodiment may include a laser emitting unit 910, a BCSC 920, and a reception unit 940.

The semi-flash LiDAR 900 according to one embodiment may include the laser emitting unit 910. A description of the laser emitting unit 910 may be duplicated with that of the laser emitting unit 810 of FIG. 35, and thus a detailed description thereof will be omitted.

The semi-flash LiDAR 900 according to one embodiment may include the BCSC 920. A description of the BCSC 920 may be duplicated with that of the BCSC 820 of FIG. 35, and thus a detailed description thereof will be omitted.

The semi-flash LiDAR 900 according to one embodiment may include the reception unit 940. A description of the reception unit 940 may be duplicated with that of the reception unit 840 of FIG. 35, and thus a detailed description thereof will be omitted.

According to one embodiment, the semi-flash LiDAR 900 may have a predetermined light path between the components.

For example, light emitted from the laser emitting unit 910 may be incident on an object 950 through the BCSC 920. Further, the light incident on the object 950 may be reflected from the object 950 and received by the reception unit 940. A lens for increasing light-transmitting/receiving efficiency may be additionally inserted into the above-described light path.

When the semi-flash LiDAR 900 of FIG. 37 is compared with the semi-flash LiDAR 800 of FIG. 35, the semi-flash LiDAR 900 of FIG. 37 may not include a scanning unit. A scanning function of the scanning unit may be realized with the laser emitting unit 910 and the BCSC 920.

For example, the laser emitting unit 910 may include an addressable VCSEL array and partially emit a laser beam to a region of interest 951 by an addressable operation.

Further, for example, the BCSC 920 may include a collimation component and a steering component to provide a particular orientation to a laser beam so that the laser beam is irradiated to a desired region of interest 951.

Further, the semi-flash LiDAR 900 of FIG. 37 may have a simplified light path as compared with the semi-flash LiDAR 800 of FIG. 35. By simplifying the light path, a light loss may be minimized and the possibility of occurring crosstalk may be reduced.

Figure 38:
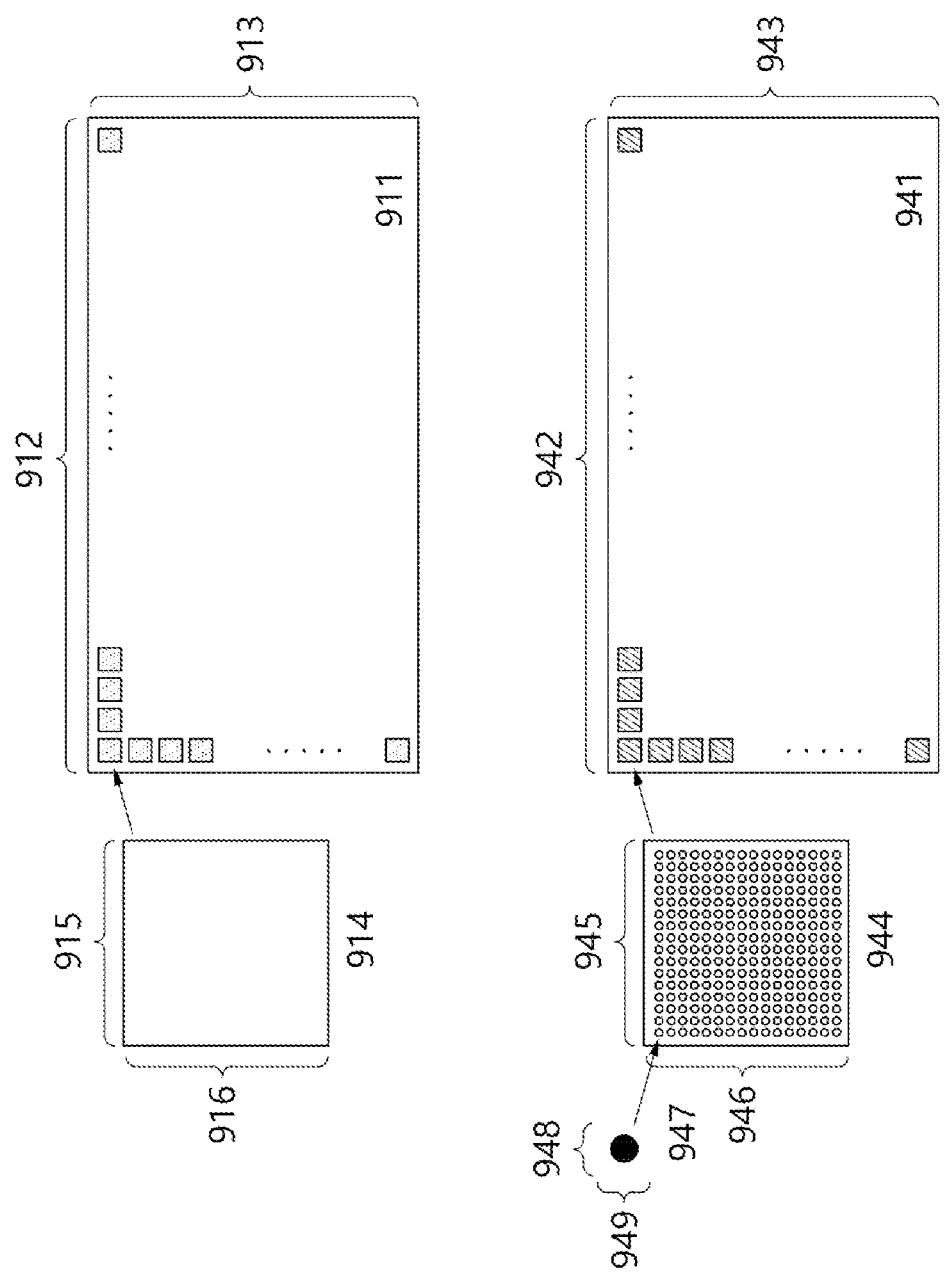
FIG. 38 shows diagrams for describing a configuration of a semi-flash LiDAR according to still another embodiment.

FIG. 38 is a diagram for describing a configuration of a semi-flash LiDAR according to another embodiment.

Referring to FIG. 38, a semi-flash LiDAR 900 according to one embodiment may include a laser emitting unit 910 and a reception unit 940.

According to one embodiment, the laser emitting unit 910 may include a VCSEL array 911. For example, the VCSEL array 911 may have an N*M matrix structure 912, 913.

According to one embodiment, the VCSEL array 911 may include a plurality of VCSEL units 914. Here, each of the VCSEL units 914 may include a plurality of VCSEL emitters. For example, the VCSEL array 911 may include 1250 VCSEL units 914 having a 50×25 matrix structure, but the present disclosure is not limited thereto.

According to one embodiment, each of the VCSEL units 914 may have a divergence angle. For example, the VCSEL unit 914 may have a horizontal divergence angle 915 and a vertical divergence angle 916. For example, the VCSEL unit 914 may have the horizontal divergence angle 915 of 1.2 degrees and the vertical divergence angle 916 of 1.2 degrees, but the present disclosure is not limited thereto.

According to one embodiment, the reception unit 940 may include a SPAD array 941. For example, the SPAD array 941 may have an N*M matrix structure 942, 943.

According to one embodiment, the SPAD array 941 may include a plurality of SPAD units 944. At this point, each of the SPAD units 944 may include a plurality of SPAD pixels 947. For example, the SPAD unit 944 may include 12×12 SPAD pixels 947.

Further, for example, the SPAD array 941 may include 1250 SPAD units 944 of a 50×25 matrix structure. In this case, the arrangement of the SPAD units 944 may correspond to the arrangement of the VCSEL units 914.

According to one embodiment, each the SPAD units 944 may have an FOV at which light may be received. For example, the SPAD unit 944 may have a horizontal FOV 945 and a vertical FOV 946. For example, the SPAD unit 944 may have the horizontal FOV 945 of 1.2 degrees and the vertical FOV 946 of 1.2 degrees.

At this point, the FOV of the SPAD unit 944 may be proportional to the number of SPAD pixels 947 included in the SPAD unit 944. Alternatively, an FOV of the individual SPAD pixel 947 included in the SPAD unit 944 may be determined by the FOV of the SPAD unit 944.

For example, in a case in which each of a horizontal FOV 948 and a vertical FOV 949 of the individual SPAD pixel 947 is 0.1 degrees, when the SPAD unit 944 includes N*M SPAD pixels 947, the horizontal FOV 945 and the vertical FOV 946 of the SPAD unit 944 may be 0.1*N and 0.1*M, respectively.

Further, for example, in a case in which each of the horizontal FOV 945 and the vertical FOV 946 of the SPAD unit 944 is 1.2 degrees, when the SPAD unit 944 includes 12×12 SPAD pixels 947, the horizontal FOV 948 and the vertical FOV 949 of the individual SPAD pixel 947 may each be 0.1 degrees (=1.2/12).

According to another embodiment, the reception unit 940 may include a SiPM array 941. For example, the SiPM array 941 may have an N*M matrix structure.

According to one embodiment, the SiPM array 941 may include a plurality of microcell units 944. Here, each of the microcell units 944 may include a plurality of microcells 947. For example, each of the microcell units 944 may include 12×12 microcells 947.

Further, for example, the SiPM array 941 may include 1250 microcell units 944 of a 50×25 matrix structure. In this case, the arrangement of the microcell units 944 may correspond to the arrangement of the VCSEL units 914.

According to one embodiment, each of the microcell units 944 may have an FOV at which light may be received. For example, the microcell unit 944 may have a horizontal FOV 945 and a vertical FOV 946. For example, the microcell unit 944 may have the horizontal FOV 945 of 1.2 degrees and the vertical FOV 946 of 1.2 degrees.

Here, the FOV of the microcell unit 944 may be proportional to the number of microcells 947 included in the microcell unit 944. Alternatively, an FOV of the individual microcell 947 included in the microcell unit 944 may be determined by the FOV of the microcell unit 944.

For example, in a case in which each of a horizontal FOV 948 and a vertical FOV 949 of the individual microcell 947 is 0.1 degrees, when the microcell unit 944 includes N*M microcells 947, the horizontal FOV 945 and the vertical FOV 946 of the microcell unit 944 may be 0.1*N and 0.1*M, respectively.

Further, for example, in a case in which each of the horizontal FOV 945 and the vertical FOV 946 of the microcell unit 944 is 1.2 degrees, when the microcell unit 944 includes 12×12 microcells 947, the horizontal FOV 948 and the vertical FOV 949 of the individual microcell 947 may each be 0.1 degrees (=1.2/12).

According to one embodiment, the VCSEL unit 914 of the laser emitting unit 910 may correspond to the SPAD unit or microcell unit 944 of the reception unit 940.

For example, the horizontal divergence angle and the vertical divergence angle of the VCSEL units 914 may be respectively identical to the horizontal FOV 945 and the vertical FOV 946 of the SPAD unit or microcell unit 944.

For example, a laser beam emitted from the VCSEL unit 914 in a first row and first column may be reflected from the object 850 and received by the SPAD unit or microcell unit 944 in the first row and first column.

Further, for example, a laser beam emitted from the VCSEL unit 914 in an Nth row and Mth column may be reflected from the object 850 and received by the SPAD unit or microcell unit 944 in the Nth row and Mth column.

At this point, the laser beam, which is emitted from the VCSEL unit 914 in the Nth row and Mth column and reflected from the object 850, may be received by the SPAD unit or microcell unit 944 in the Nth row and Mth column, and the LiDAR device 900 may have a resolution by the SPAD unit or microcell unit 944.

For example, when the SPAD unit or microcell unit 944 includes SPAD pixels or microcells 947 of N rows*M columns, the VCSEL unit 914 may recognize distance information of the object by dividing the FOV, at which light is irradiated, into N*M regions.

According to another embodiment, one VCSEL unit 914 may correspond to the plurality of SPAD units or microcell units 944. For example, the laser beam emitted from the VCSEL unit 914 in the first row and first column may be reflected from the object 850 and received by the SPAD units or microcell units 944 in the first row and first column and a first row and second column.

According to still another embodiment, the plurality of VCSEL units 914 may correspond to one SPAD unit or microcell unit 944. For example, a laser beam emitted from the VCSEL unit 914 in the first row and first column may be reflected from the object 850 and received by the SPAD unit or microcell unit 944 in the first row and first column.

According to one embodiment, the plurality of VCSEL units 914 included in the laser emitting unit 910 may operate according to a predetermined sequence or may operate randomly. At this point, the SPAD unit or microcell unit 944 of the reception unit 940 may also operate corresponding to the operation of the VCSEL unit 914.

For example, in the VCSEL array 911, the VCSEL unit in a first row and third column may operate after the VCSEL unit in a first row and first column operates. Thereafter, the VCSEL unit in a first row and fifth column may operate, and then the VCSEL unit in a first row and seventh column may operate.

In this case, in the reception unit 940, the SPAD unit or microcell unit 944 in a first row and third column may operate after the SPAD unit or microcell unit 944 in a first row and first column operates. Thereafter, the SPAD unit or microcell unit 944 in a first row and fifth column may operate, and then the SPAD unit or microcell unit 944 in a first row and seventh column may operate.

Further, for example, the VCSEL units of the VCSEL array 911 may operate randomly. At this point, the SPAD unit or microcell unit 944 of the reception unit, which is present at a position corresponding to the position of the randomly operating VCSEL unit 914, may operate.

Figure 39:
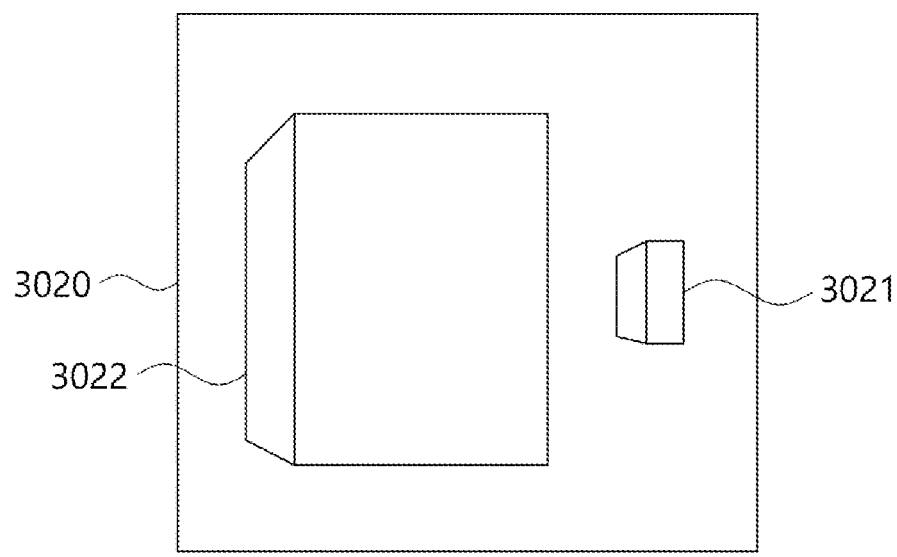
FIG. 39 is a diagram for describing a LiDAR device according to one embodiment.
Figure 39:
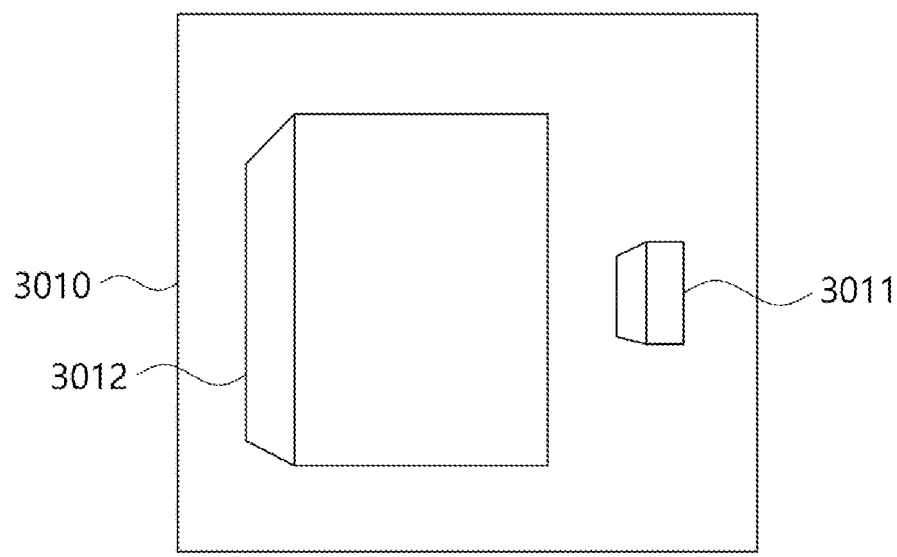

FIG. 39 is a diagram for describing a LiDAR device according to one embodiment.

Referring to FIG. 39, a LiDAR device 3000 according to one embodiment may include a transmission module 3010 and a reception module 3020.

Further, the transmission module 3010 may include a laser emitting array 3011 and a first lens assembly 3012, but the present disclosure is not limited thereto.

Here, the contents of the laser emitting unit or the like described above may be applied to the laser emitting array 3011, and thus redundant descriptions thereof will be omitted.

Further, the laser emitting array 3011 may emit at least one laser. For example, the laser emitting array 3011 may emit a plurality of lasers, but the present disclosure is not limited thereto.

Further, the laser emitting array 3011 may emit at least one laser at a first wavelength. For example, the laser emitting array 3011 may emit at least one laser at a wavelength of 940 nm, and may emit a plurality of lasers at a wavelength of 940 nm, but the present disclosure is not limited thereto.

In this case, the first wavelength may be a wavelength range including an error range. For example, the first wavelength may refer to a wavelength range of 935 nm to 945 nm as a wavelength of 940 nm in a 5 nm error range, but the present disclosure is not limited thereto.

Further, the laser emitting array 3011 may emit at least one laser at the same time point. For example, the laser emitting array 3011 may emit a first laser at a first time point, or may emit at least one laser at the same time point, such as, emitting first and second lasers at a second time point.

Further, the first lens assembly 3012 may include at least two lens layers. For example, the first lens assembly 3012 may include at least four lens layers, but the present disclosure is not limited thereto.

Further, the first lens assembly 3012 may steer the laser emitted from the laser emitting array 3011. For example, the first lens assembly 3012 may steer the first laser emitted from the laser emitting array 3011 in a first direction and steer the second laser emitted from the laser emitting array 3011 in a second direction, but the present disclosure is not limited thereto.

Further, the first lens assembly 3012 may steer a plurality of lasers, which are emitted from the laser emitting array 3011, in order to irradiate the plurality of lasers at different angles within a range of x degrees to y degrees. For example, the first lens assembly 3012 may steer the first laser emitted from the laser emitting array 3011 in the first direction in order to irradiate the first laser at the angle of x degrees, and steer the second laser emitted from the laser emitting array 3011 in the second direction in order to irradiate the second laser at the angle of y degrees, but the present disclosure is not limited thereto.

Further, the reception module 3020 may include a laser detecting array 3021 and a second lens assembly 3022, but the present disclosure is not limited thereto.

Here, the contents of the detecting unit or the like described above may be applied to the laser detecting array 3021, and thus redundant descriptions thereof will be omitted.

Further, the laser detecting array 3021 may detect at least one laser. For example, the laser detecting array 3021 may detect a plurality of lasers.

Further, the laser detecting array 3021 may include a plurality of detectors. For example, the laser detecting array 3021 may include a first detector and a second detector, but the present disclosure is not limited thereto.

Further, each of the plurality of detectors included in the laser detecting array 3021 may receive different lasers. For example, the first detector included in the laser detecting array 3021 may receive a first laser that is received in the first direction, and the second detector may receive a second laser that is received in the second direction, but the present disclosure is not limited thereto.

Further, the laser detecting array 3021 may detect at least a portion of the laser irradiated from the transmission module 3010. For example, the laser detecting array 3021 may detect at least a portion of the first laser irradiated from the transmission module 3010 and may detect at least a portion of the second laser, but the present disclosure is not limited thereto.

Further, the second lens assembly 3022 may transmit the laser, which irradiated from the transmission module 3010, to the laser detecting array 3021. For example, when the first laser, which is irradiated from the transmission module 3010 in the first direction, is reflected from the object positioned in the first direction, the second lens assembly 3022 may transmit the first laser to the laser detecting array 3021, and when the second laser, which is irradiated in the second direction, is reflected from the object positioned in the second direction, the second lens assembly 3022 may transmit the second laser to the laser detecting array 3021, but the present disclosure is not limited thereto.

Further, the second lens assembly 3022 may distribute the lasers irradiated from the transmission module 3010 to at least two different detectors. For example, when the first laser, which is irradiated from the transmission module 3010 in the first direction, is reflected from the object positioned in the first direction, the second lens assembly 3022 may distribute the first laser to the first detector included in the laser detecting array 3021, and when the second laser, which is irradiated in the second direction, is reflected from the object positioned in the second direction, the second lens assembly 3022 may distribute the second laser to the second detector included in the laser detecting array 3021, but the present disclosure is not limited thereto.

Further, at least a portion of each of the laser emitting array 3011 and the laser detecting array 3021 may match each other. For example, a first laser emitted from a first laser emitting element included in the laser emitting array 3011 may be detected by the first detector included in the laser detecting array 3021, and a second laser emitted from a second laser emitting element included in the laser emitting array 3011 may be detected by the second detector included in the laser detecting array 3021, but the present disclosure is not limited thereto.

Figure 40:
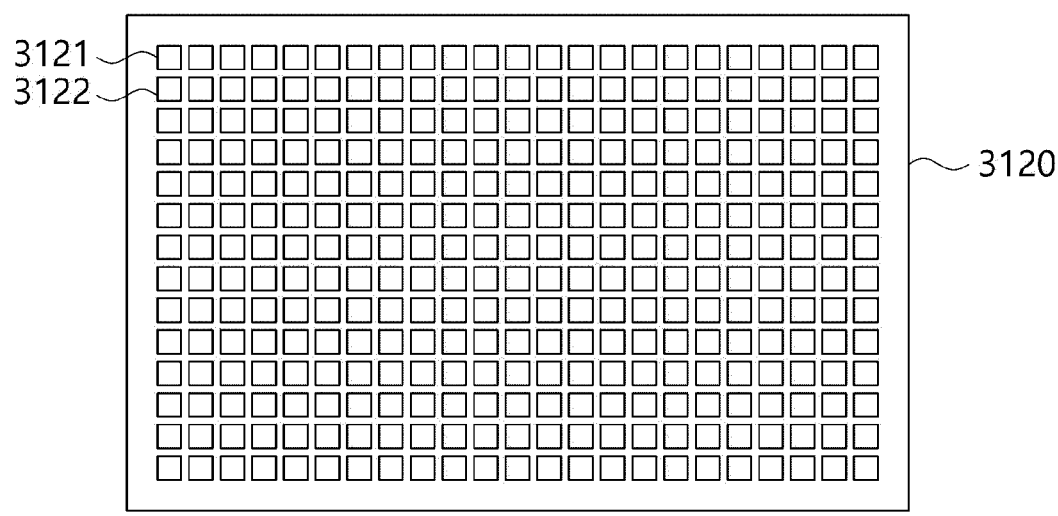
FIG. 40 is a diagram for describing a laser emitting array and a laser detecting array included in a LiDAR device according to one embodiment.
Figure 40:
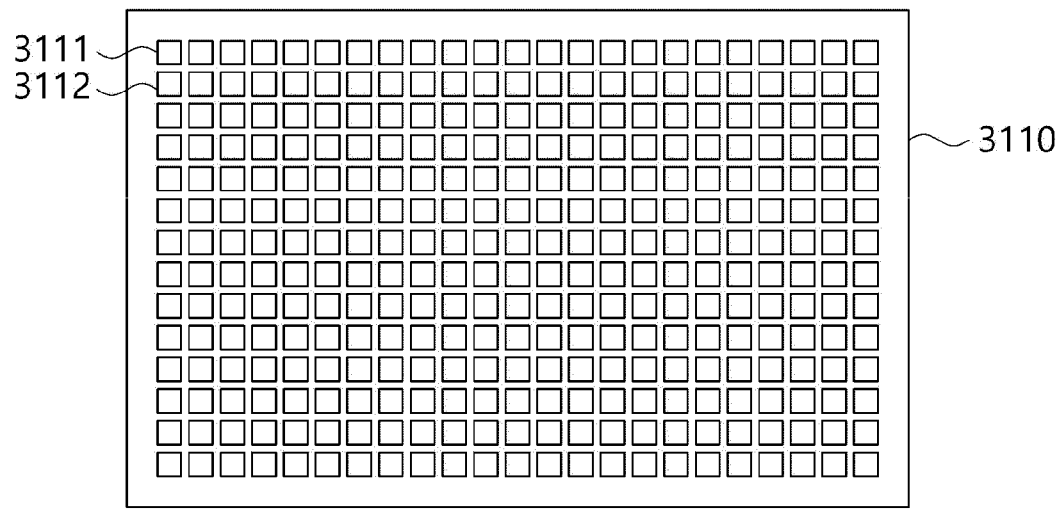

FIG. 40 is a diagram for describing a laser emitting array and a laser detecting array included in a LiDAR device according to one embodiment.

Referring to FIG. 40, a LiDAR device 3100 according to one embodiment may include a laser emitting array 3110 and a laser detecting array 3120.

In this case, since the above-described contents may be applied to the laser emitting array 3110 and the laser detecting array 3120, repetitive descriptions will be omitted.

The laser emitting array 3110 may include a plurality of laser emitting units.

For example, the laser emitting array 3110 may include a first laser emitting unit 3111 and a second laser emitting unit 3112.

In addition, the laser emitting array 3110 may be an array in which the plurality of laser emitting units are arranged in a two-dimensional matrix form.

For example, the laser emitting array 3110 may be an array in which the plurality of laser emitting units are arranged in a two-dimensional matrix form having M rows and N columns, but the present invention is not limited thereto.

In addition, each of the plurality of laser emitting units may include at least one laser emitting element.

For example, the first laser emitting unit 3111 included in the plurality of laser emitting units may include one laser emitting element, and the second laser emitting unit 3112 may include one laser emitting element, but the present invention is not limited thereto.

In addition, for example, the first laser emitting unit 3111 included in the plurality of laser emitting units may include two or more laser emitting elements, and the second laser emitting unit 3112 may include two or more laser emitting elements, but the present invention is not limited thereto.

In addition, lasers emitted from the plurality of laser emitting units may be radiated in different directions.

For example, a first laser emitting from the first laser emitting unit 3111 included in the plurality of laser emitting units may be radiated in a first direction, and a second laser emitting from the second laser emitting unit 3112 may be radiated in a second direction, but the present invention is not limited thereto.

In addition, the lasers emitted from the plurality of laser emitting units may not overlap each other at a target position.

For example, the first laser emitting from the first laser emitting unit 3111 included in the plurality of laser emitting units may not overlap the second laser emitting from the second laser emitting unit 3112 at a distance of 100 m, but the present invention is not limited thereto.

The laser detecting array 3120 may include a plurality of detecting units.

For example, the laser detecting array 3120 may include a first detecting unit 3121 and a second detecting unit 3122.

In addition, the laser detecting array 3120 may be an array in which the plurality of detecting units are arranged in a two-dimensional matrix form.

For example, the laser detecting array 3120 may be an array in which the plurality of detecting units are arranged in a two-dimensional matrix form having M rows and N columns, but the present invention is not limited thereto.

In addition, each of the plurality of detecting units may include at least one laser detecting element.

For example, the first detecting unit 3121 included in the plurality of detecting units may include one laser detecting element, and the second detecting unit 3122 may include one laser detecting element, but the present invention is not limited thereto.

In addition, for example, the first detecting unit 3121 included in the plurality of detecting units may include two or more laser detecting elements, and the second detecting unit 3122 may include two or more laser detecting elements, but the present invention is not limited thereto.

In addition, the plurality of detecting units may detect lasers radiated in different directions.

For example, the first detecting unit 3121 included in the plurality of laser emitting units may detect the first laser radiated in the first direction, and the second detecting unit 3122 may detect the second laser radiated in the second direction, but the present invention is not limited thereto.

In addition, each of the plurality of detecting units may detect a laser emitting from a laser emitting unit disposed to correspond thereto.

For example, the first detecting unit 3121 included in the plurality of detecting units may detect the first laser emitting from the first laser emitting unit 3111 disposed to correspond to the first detecting unit 3121, and the second detecting unit 3122 may detect the second laser emitting from the second laser emitting unit 3112 disposed to correspond to the second detecting unit 3122, but the present invention is not limited thereto.

In addition, each of the plurality of detecting units may detect lasers emitted from two or more laser emitting units according to a position of an object.

For example, when an object is located in a first distance range, the second detecting unit 3122 included in the plurality of detecting units may detect the second laser emitting from the second laser emitting unit 3112, and when an object is located in a second distance range, the second detecting unit 3122 may detect the first laser emitting from the first laser emitting unit 3111, but the present invention is not limited thereto.

In addition, at least one detection value may be generated based on a signal obtained from each of the plurality of detecting units.

In this case, the detection value may include a depth value (distance value), an intensity value, and the like, but the present invention is not limited thereto.

In addition, coordinates of the detection value may be determined based on an arrangement of each of the plurality of detecting units.

For example, the first detecting unit 3121 included in the plurality of detecting units may be disposed at a position of (1,1) in the laser detecting array, and coordinates of a first detection value generated based on a signal obtained from the first detecting unit 3121 may be determined to be (1,1), but the present invention is not limited thereto.

In addition, for example, the second detecting unit 3122 included in the plurality of detecting units may be disposed at a position of (2,1) in the laser detecting array, and coordinates of a second detection value generated based on a signal obtained from the second detecting unit 3122 may be determined to be (2,1), but the present invention is not limited thereto.

In addition, the above-described examples are merely provided to describe examples in which coordinate values corresponding directly to an arrangement position of each of the plurality of detecting units are calculated. The content of the present invention is not limited thereto and may include various rules in which coordinates of the detection value may be determined based on an arrangement of each of the plurality of detecting units.

In addition, the laser emitting array 3110 and the laser detecting array 3120 may be arranged as arrays having the same dimension.

For example, in the laser emitting array 3110 and the laser detecting array 3120, the plurality of laser emitting units and the plurality of detecting units may be arranged in arrays each having M rows and N columns, but the present invention is not limited thereto.

In addition, the laser emitting array 3110 and the laser detecting array 3120 may be arranged as arrays having different dimensions.

For example, in the laser emitting array 3110, the plurality of laser emitting units may be arranged in an array having M rows and N columns, and in the laser detecting array 3120, the plurality of detecting units may be arranged in an array having M+3 rows and N columns, but the present invention is not limited thereto.

In addition, the number of the plurality of laser emitting units included in the laser emitting array 3110 may be the same as the number of the plurality of detecting units included in the laser detecting array 3120.

For example, the laser emitting array 3110 may include M×N laser emitting units, and the laser detecting array 3120 may include M×N detecting units, but the present invention is not limited thereto.

In addition, the number of the plurality of laser emitting units included in the laser emitting array 3110 may be different from the number of the plurality of detecting units included in the laser detecting array 3120.

For example, the laser emitting array 3110 may include M×N laser emitting units, and the laser detecting array 3120 may include (M+3)×N detecting units, but the present invention is not limited thereto.

In addition, for example, the laser emitting array 3110 may include (M×N)/2 laser emitting units, and the laser detecting array 3120 may include M×N detecting units, but the present invention is not limited thereto.

Furthermore, for example, the laser emitting array 3110 may include (M×N)/2 laser emitting units, and the laser detecting array 3120 may include (M+3)×N detecting units, but the present invention is not limited thereto.

Figure 41:
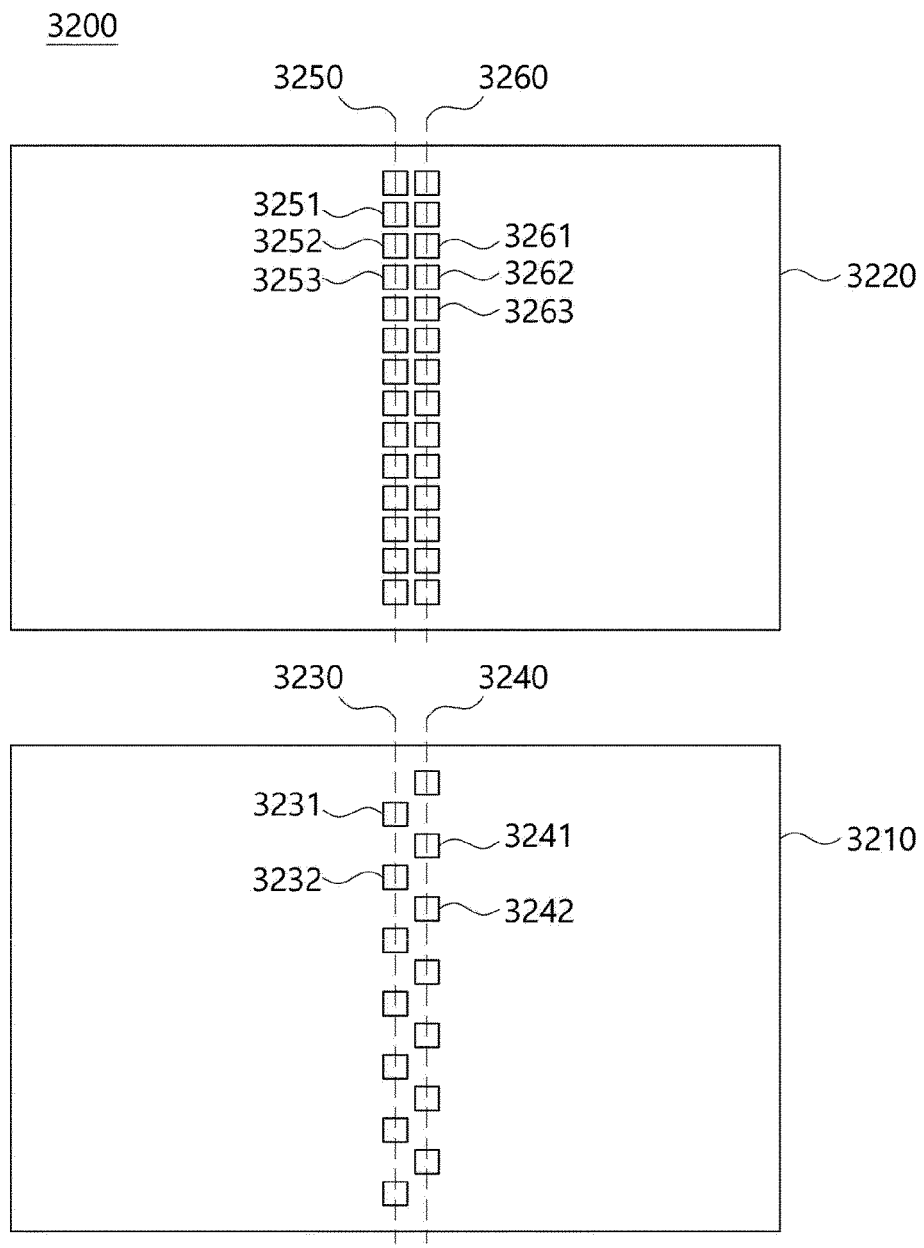
FIG. 41 is a diagram for describing a laser emitting array and a laser detecting array included in a LiDAR device according to one embodiment.

FIG. 41 is diagram for describing a laser emitting array and a laser detecting array included in a LiDAR device according to one embodiment.

Referring to FIG. 41, a LiDAR device 3200 according to one embodiment may include a laser emitting array 3210 and a laser detecting array 3220.

In this case, since the above-described contents may be applied to the laser emitting array 3210 and the laser detecting array 3220, repetitive descriptions will be omitted.

The laser emitting array 3210 may include a plurality of laser emitting units.

For example, the laser emitting array 3210 may include a first laser emitting unit 3231, a second laser emitting unit 3232, a third laser emitting unit 3241, and a fourth laser emitting unit 3242.

In addition, the laser emitting array 3210 may include a plurality of laser emitting unit columns.

For example, the laser emitting array 3210 may include a first laser emitting unit column 3230 and a second laser emitting unit column 3240.

In addition, the first laser emitting unit column 3230 may include the first laser emitting unit 3231 and the second laser emitting unit 3232.

Furthermore, the second laser emitting unit column 3240 may include the third laser emitting unit 3241 and the fourth laser emitting unit 3242.

In addition, the second laser emitting unit 3232 may be disposed adjacent to the first laser emitting unit 3231 in a column direction.

Furthermore, the fourth laser emitting unit 3242 may be disposed adjacent to the third laser emitting unit 3241 in the column direction.

In this case, the above-described laser emitting units being disposed adjacent to each other may mean that other laser emitting units are disposed to not be located between two laser emitting units disposed adjacent to each other, but the present invention is not limited thereto.

In addition, the laser detecting array 3220 may include a plurality of detecting units.

For example, the laser detecting array 3220 may include a first detecting unit 3251, a second detecting unit 3252, a third detecting unit 3253, a fourth detecting unit 3261, a fifth detecting unit 3262, and a sixth detecting unit 3263.

In addition, the laser detecting array 3220 may include a plurality of detecting unit columns.

For example, the laser detecting array 3220 may include a first detecting unit column 3250 and a second detecting unit column 3260.

In addition, the first detecting unit column 3250 may include the first detecting unit 3251, the second detecting unit 3252, and the third detecting unit 3253.

Furthermore, the second detecting unit column 3260 may include the fourth detecting unit 3261, the fifth detecting unit 3262, and the sixth detecting unit 3263.

In addition, the second detecting unit 3252 may be disposed adjacent to the first detecting unit 3251 in the column direction.

Furthermore, the third detecting unit 3253 may be disposed adjacent to the second detecting unit 3252 in the column direction.

In addition, the second detecting unit 3252 may be disposed between the first detecting unit 3251 and the third detecting unit 3253.

Furthermore, the fourth detecting unit 3261 may be disposed adjacent to the second detecting unit 3252 in a row direction.

In addition, the fifth detecting unit 3262 may be disposed adjacent to the fourth detecting unit 3261 in the column direction.

Furthermore, the sixth detecting unit 3263 may be disposed adjacent to the fifth detecting unit 3262 in the column direction.

In addition, the fifth detecting unit 3262 may be disposed between the fourth detecting unit 3261 and the sixth detecting unit 3263.

In this case, the above-described detecting units being disposed adjacent to each other may mean that other detecting units are disposed to not be located between two detecting units disposed adjacent to each other, but the present invention is not limited thereto.

In addition, the plurality of laser emitting units included in the laser emitting array 3210 may be disposed to correspond to at least some of the plurality of detecting units included in the laser detecting array 3220.

For example, the first laser emitting unit 3231 may be disposed to correspond to the first detecting unit 3251.

In addition, for example, the second laser emitting unit 3232 may be disposed to correspond to the third detecting unit 3253.

Furthermore, for example, the third laser emitting unit 3241 may be disposed to correspond to the fourth detecting unit 3261.

In addition, for example, the fourth laser emitting unit 3242 may be disposed to correspond to the sixth detecting unit 3263.

Furthermore, at least some of the plurality of detecting units included in the laser detecting array 3220 may be disposed to correspond to the plurality of laser emitting units included in the laser emitting array 3210.

For example, the first detecting unit 3251 may be disposed to correspond to the first laser emitting unit 3231.

In addition, for example, the third detecting unit 3253 may be disposed to correspond to the second laser emitting unit 3232.

Furthermore, for example, the second detecting unit 3252 may be disposed to correspond to a first area of the laser emitting array 3210 which is defined by an area between the first laser emitting unit 3231 and the second laser emitting unit 3232.

In addition, for example, the fourth detecting unit 3261 may be disposed to correspond to the third laser emitting unit 3241.

Furthermore, for example, the sixth detecting unit 3263 may be disposed to correspond to the fourth laser emitting unit 3242.

In addition, for example, the fifth detecting unit 3262 may be disposed to correspond to a second area of the laser emitting array 3210 which is defined by an area between the third laser emitting unit 3241 and the fourth laser emitting unit 3242.

In this case, a meaning that the above-described laser emitting unit and detecting unit are disposed to correspond to each other may include a corresponding physical relationship in which the laser emitting unit and the detecting unit are disposed at positions corresponding to each other in the laser emitting array and the laser detecting array, but the present invention is not limited thereto.

In addition, a meaning that the above-described laser emitting unit and detecting unit are disposed to correspond to each other may include a corresponding optical relationship in which the laser emitting unit and the detecting unit are disposed such that a laser emitting from the laser emitting unit is detected by the detecting unit disposed to correspond to the laser emitting unit when reflected in a target distance range, but the present invention is not limited thereto.

In this case, the target distance range may be a distance range derived through physical or optical alignment of a LiDAR device, may be a distance range set for physical or optical alignment, and may include a specific distance.

For example, physical or optical alignment of a LiDAR device may be made by targeting a distance of 200 m, and in this case, the target distance range may be a distance range including 200 m.

In addition, the first laser emitting unit column 3230 and the second laser emitting unit column 3240 may be disposed adjacent to each other in the row direction.

Furthermore, the first detecting unit column 3250 and the second detecting unit column 3260 may be disposed adjacent to each other in the row direction.

In addition, a separation distance between the first laser emitting unit 3231 and the second laser emitting unit 3232 in the column direction may be the same as a separation distance between the first detecting unit 3251 and the third detecting unit 3253 in the column direction.

Furthermore, a separation distance between the third laser emitting unit 3241 and the fourth laser emitting unit 3242 in the column direction may be the same as a separation distance between the fourth detecting unit 3261 and the sixth detecting unit 3263 in the column direction.

In addition, a separation distance between the second laser emitting unit 3232 and the third laser emitting unit 3241 in the row direction may be the same as a separation distance between the second detecting unit 3252 and the fourth detecting unit 3261 in the row direction.

Figure 42:
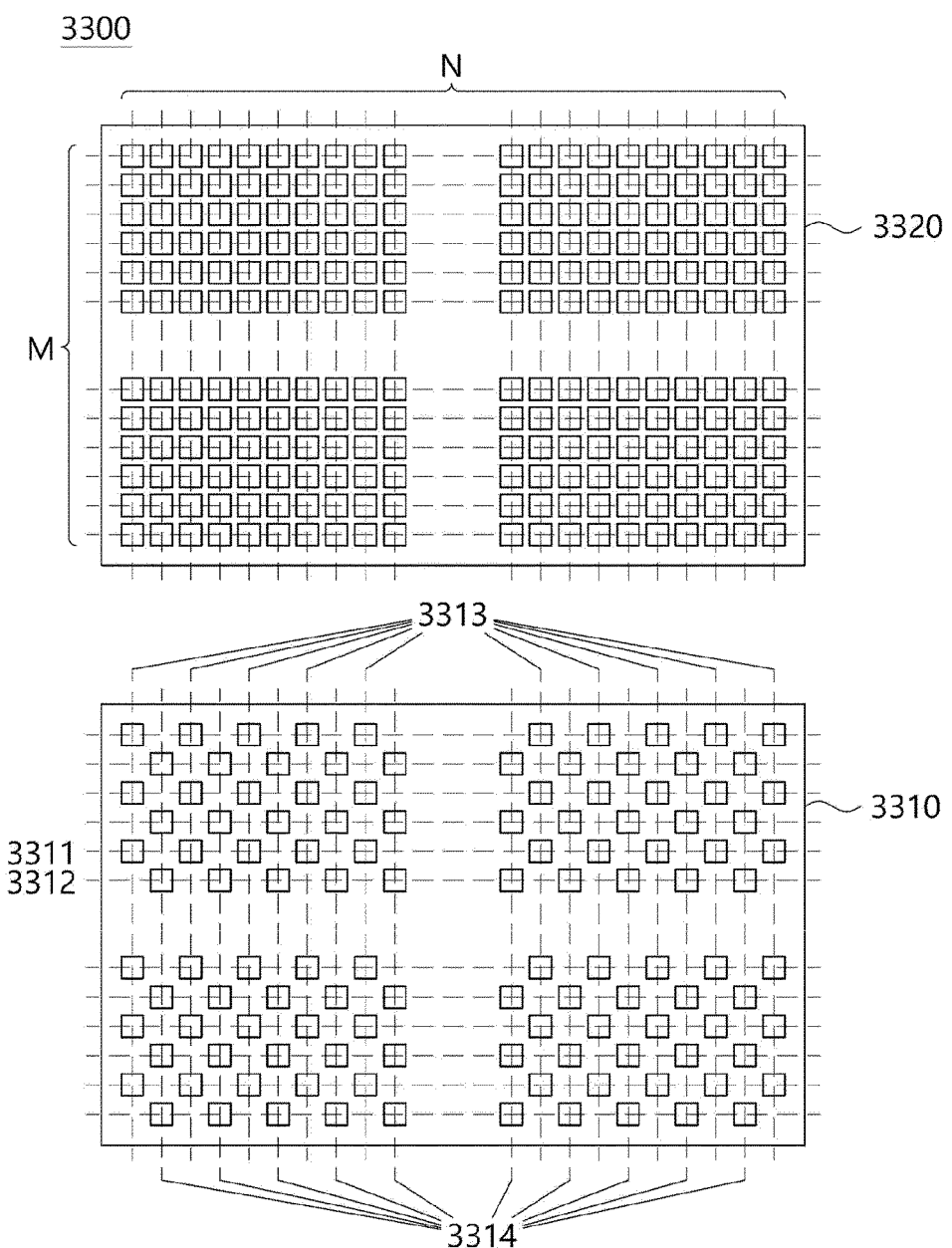
FIG. 42 is a diagram for describing a laser emitting array and a laser detecting array included in a LiDAR device according to one embodiment.

FIG. 42 is a diagram for describing a laser emitting array and a laser detecting array included in a LiDAR device according to one embodiment.

Referring to FIG. 42, a LiDAR device 3300 according to one embodiment may include a laser emitting array 3310 and a laser detecting array 3320.

In this case, since the above-described contents may be applied to the laser emitting array 3310 and the laser detecting array 3320, repetitive descriptions will be omitted.

The laser emitting array 3310 may include a plurality of laser emitting units.

In addition, the laser emitting array 3310 may be an array in which the plurality of laser emitting units are arranged in a two-dimensional matrix form.

For example, the laser emitting array 3310 may be an array in which the plurality of laser emitting units are arranged in a two-dimensional matrix form having K rows and L columns, but the present invention is not limited thereto.

In addition, the laser emitting array 3310 may include a plurality of laser emitting unit columns and a plurality of laser emitting unit rows, but the present invention is not limited thereto.

For example, the laser emitting array 3310 may include L laser emitting unit columns and K laser emitting unit rows, but the present invention is not limited there In addition, in order to describe the laser emitting array 3310 in more detail, an order may be described in the plurality of laser emitting unit columns and the plurality of laser emitting unit rows.

For example, an uppermost laser emitting unit row of the laser emitting array 3310 may be described as a first row, a laser emitting unit row located below the uppermost laser emitting unit row may be described as a second row, and a last row may be described as a $K^{th}$ row. However, the present invention is not limited thereto.

In addition, for example, a leftmost laser emitting unit column of the laser emitting array 3310 may be described as a first column, a laser emitting unit column located on the right of the leftmost laser emitting unit column may be described as a second column, and a last column may be described as an $L^{th}$ column. However, the present invention is not limited thereto.

In addition, a laser emitting unit column including laser emitting units disposed in an $X^{th}$ row 3311 included in the laser emitting array 3310 may be different from a laser emitting unit column including laser emitting units disposed in an $(X+1)^{th}$ row 3312.

For example, each of the laser emitting units disposed in the $X^{th}$ row 3311 included in the laser emitting array 3310 may be disposed at one of intersections of the $X^{th}$ row 3311 and odd-numbered columns 3313.

In addition, for example, each of the laser emitting units disposed in the $(X+1)^{th}$ row 3312 included in the laser emitting array 3310 may be disposed at one of intersections of the $(X+1)^{th}$ row 3312 and even-numbered columns 3314.

Furthermore, the laser detecting array 3320 may include a plurality of detecting units.

In addition, the laser detecting array 3320 may be an array in which the plurality of detecting units are arranged in a two-dimensional matrix form.

For example, the laser detecting array 3320 may be an array in which the plurality of detecting units are arranged in a two-dimensional matrix form having M rows and N columns, but the present invention is not limited thereto.

In addition, the laser detecting array 3320 may include a plurality of detecting unit columns and a plurality of detecting unit rows, but the present invention is not limited thereto.

For example, the laser detecting array 3320 may include N detecting unit columns and M detecting unit rows, but the present invention is not limited thereto.

In addition, in order to describe the laser detecting array 3320 in more detail, an order may be described in the plurality of detecting unit columns and the plurality of detecting unit rows.

For example, an uppermost detecting unit row of the laser detecting array 3320 may be described as a first row, a detecting unit row located below the uppermost detecting unit row may be described as a second row, and a last row may be described as an $M^{th}$ row. However, the present invention is not limited thereto.

In addition, for example, a leftmost detecting unit column of the laser detecting array 3320 may be described as a first column, a detecting unit column located on the right of the leftmost detecting unit column may be described as a second column, and a last column may be described as an $N^{th}$ column. However, the present invention is not limited thereto.

In addition, each of the plurality of detecting units included in the laser detecting array 3320 may be disposed to correspond to one of intersections of the detecting unit rows and the detecting unit columns.

Furthermore, lasers emitted from the plurality of laser emitting units included in the laser emitting array 3310 may be detected by at least some of the plurality of detecting units included in the laser detecting array 3320.

For example, a first laser emitting from a first laser emitting unit included in the laser emitting array 3310 and disposed to correspond to an intersection of an $X^{th}$ laser emitting unit row and a $Y^{th}$ laser emitting unit column may be detected by a first detecting unit included in the laser detecting array 3320, but the present invention is not limited thereto.

In addition, for example, the first laser emitting from the first laser emitting unit included in the laser emitting array 3310 and disposed to correspond to the intersection of the $X^{th}$ laser emitting unit row and the $Y^{th}$ laser emitting unit column may be detected by the first detecting unit or a second detecting unit included in the laser detecting array 3320, but the present invention is not limited thereto.

In this case, the first detecting unit may be disposed to correspond to the intersection of the $X^{th}$ detecting unit row and the $Y^{th}$ detecting unit column, and the second detecting unit may be disposed to correspond to an intersection of an $(X+1)^{th}$ detecting unit row and the $Y^{th}$ detecting unit column, but the present invention is not limited thereto.

In addition, the first detecting unit may be disposed to correspond to an intersection of a $W^{th}$ detecting unit row and a $Z^{th}$ detecting unit column, and the second detecting unit may be disposed to correspond to an intersection of a $(W+1)^{th}$ detecting unit row and the $Z^{th}$ detecting unit column, but the present invention is not limited thereto.

Furthermore, a laser emitting from each of the plurality of laser emitting units included in the laser emitting array 3310 may be detected by different detecting units according to a position of an object from which a laser is reflected.

In addition, for example, the first laser emitting from the first laser emitting unit included in the laser emitting array 3310 and disposed to correspond to the intersection of the $X^{th}$ laser emitting unit row and the $Y^{th}$ laser emitting unit column may be detected by the first detecting unit when an object from which the first laser is reflected is in a first distance range and may be detected by the second detecting unit when the object from which the first laser is reflected is in a second distance range, but the present invention is not limited thereto.

In this case, the first distance range may include a distance range of 15 m or more, and the second distance range may include a distance range of 7 m to 15 m, but the present invention is not limited thereto.

In addition, since the first and second distance ranges may be changed according to components such as a laser emitting unit, an optic unit, and a detecting unit included in a LiDAR device and an arrangement relationship between the components, the technical idea of the present invention is not limited to the above-described examples.

Figure 43:
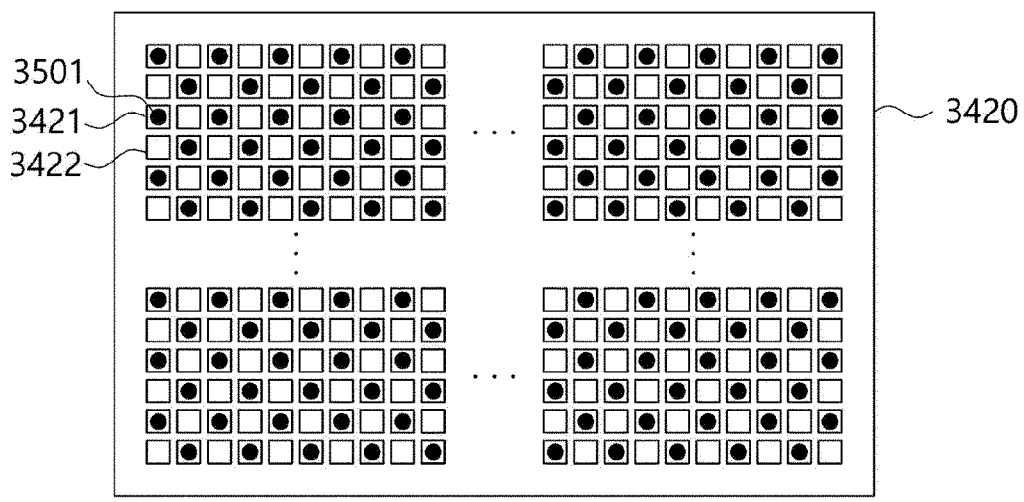
FIGS. 43 and 44 are diagrams for describing lasers emitted from a laser emitting array and detected by a laser detecting array according to one exemplary embodiment.
Figure 43:
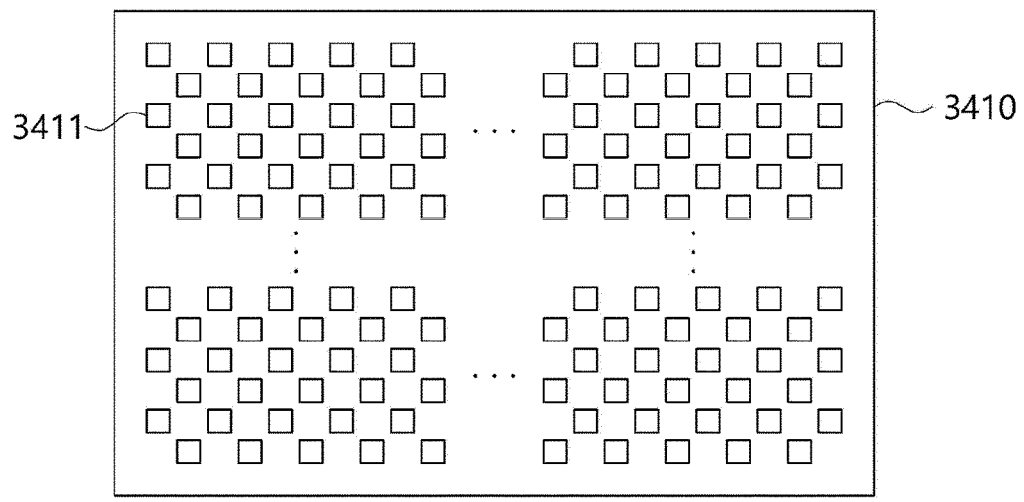
Figure 44:
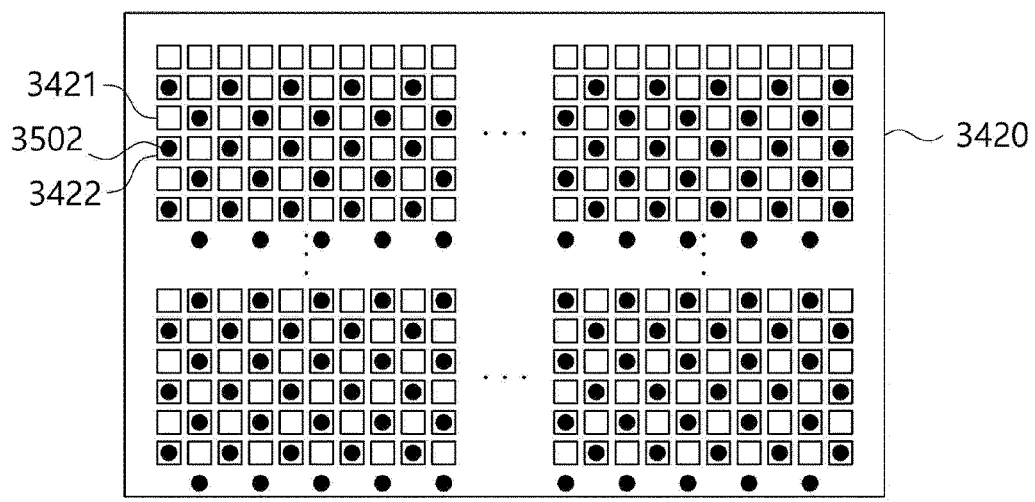
Figure 44:
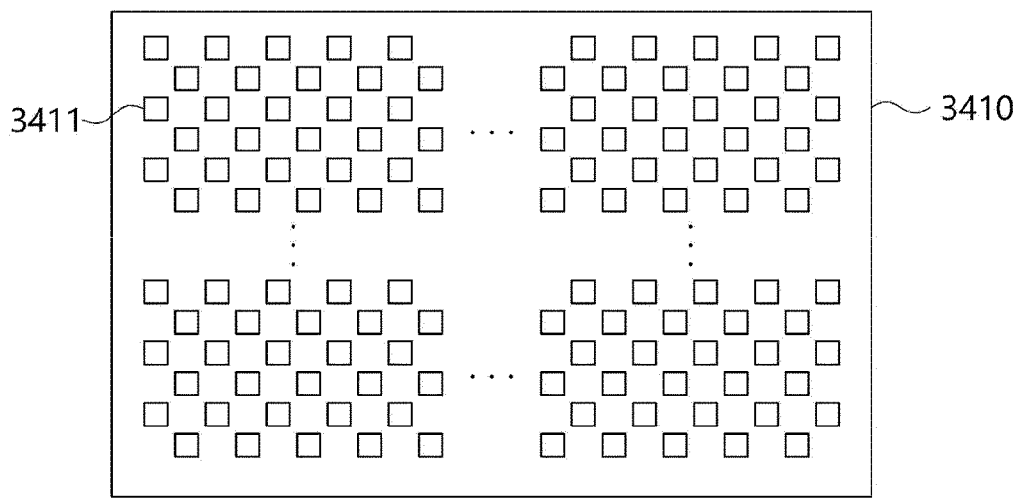

FIGS. 43 and 44 are diagrams for describing lasers emitted from a laser emitting array and detected by a laser detecting array according to one exemplary embodiment.

Referring to FIGS. 43 and 44, a LiDAR device 3400 according to one embodiment may include a laser emitting array 3410 and a laser detecting array 3420.

In this case, since the above-described contents may be applied to the laser emitting array 3410 and the laser detecting array 3420, repetitive descriptions will be omitted.

In addition, the laser emitting array 3410 may include a plurality of laser emitting units including a first laser emitting unit 3411.

Furthermore, the laser detecting array 3420 may include a plurality of detecting units including a first detecting unit 3421 and a second detecting unit 3422.

In addition, a laser emitting from the laser emitting array 3410 may be reflected from an object located outside the LiDAR device 3400 and detected by the laser detecting array 3420.

In this case, FIG. 43 is a diagram exemplarily illustrating an area in which a laser emitting from the laser emitting array 3410 and reflected from an object located in a first distance range is detected by the laser detecting array 3420.

In addition, FIG. 44 is a diagram exemplarily illustrating an area in which a laser emitting from the laser emitting array 3410 and reflected from an object located in a second distance range is detected by the laser detecting array 3420.

First, referring to FIG. 43, the laser emitting from the laser emitting array 3410 and reflected from the object located in the first distance range may be detected by the laser detecting array 3420.

For example, when a first laser emitting from the first laser emitting unit 3411 included in the laser emitting array 3410 is reflected from the object located in the first distance range, the first laser may be received in a first area 3501 of the laser detecting array 3420 and detected by the first detecting unit 3421 disposed to correspond to the first area 3501, but the present invention is not limited thereto.

In this case, the first detecting unit 3421 may be a detecting unit disposed to correspond to the first laser emitting unit 3411, but the present invention is not limited thereto.

In addition, referring to FIG. 44, the laser emitting from the laser emitting array 3410 and reflected from the object located in the second distance range may be detected by the laser detecting array 3420.

For example, when the first laser emitting from the first laser emitting unit 3411 included in the laser emitting array 3410 is reflected from the object located in the second distance range, the first laser may be received in a second area 3502 of the laser detecting array 3420 and detected by the second detecting unit 3422 disposed to correspond to the second area 3502, but the present invention is not limited thereto.

In addition, referring to FIGS. 43 and 44, a laser emitting from the laser emitting array 3410 may be detected by two or more different detecting units according to a position of an object from which a laser is reflected.

For example, when a laser emitting from the laser emitting array 3410 is reflected from the object located in the first distance range, the laser emitting from the laser emitting array 3410 may be detected by a detecting unit disposed to correspond to each of the plurality of laser emitting units included in the laser emitting array 3410, and when a laser emitting from the laser emitting array 3410 is reflected from the object located in the second distance range, the laser emitting from the laser emitting array 3410 may be detected by a detecting unit disposed so as to not correspond to each of the plurality of laser emitting units included in the laser emitting array 3410, but the present invention is not limited thereto.

Accordingly, a probability that each detecting unit included in the laser detecting array 3420 may generate valid data may be changed according to an arrangement of the laser emitting array 3410 and a distance to an object, and by using the above-described contents, invalid data may be restored.

A data correcting method that may be expressed as a data restoring method, a data filling method, or the like will be described in more detail below using FIGS. 47 to 57.

Figure 45:
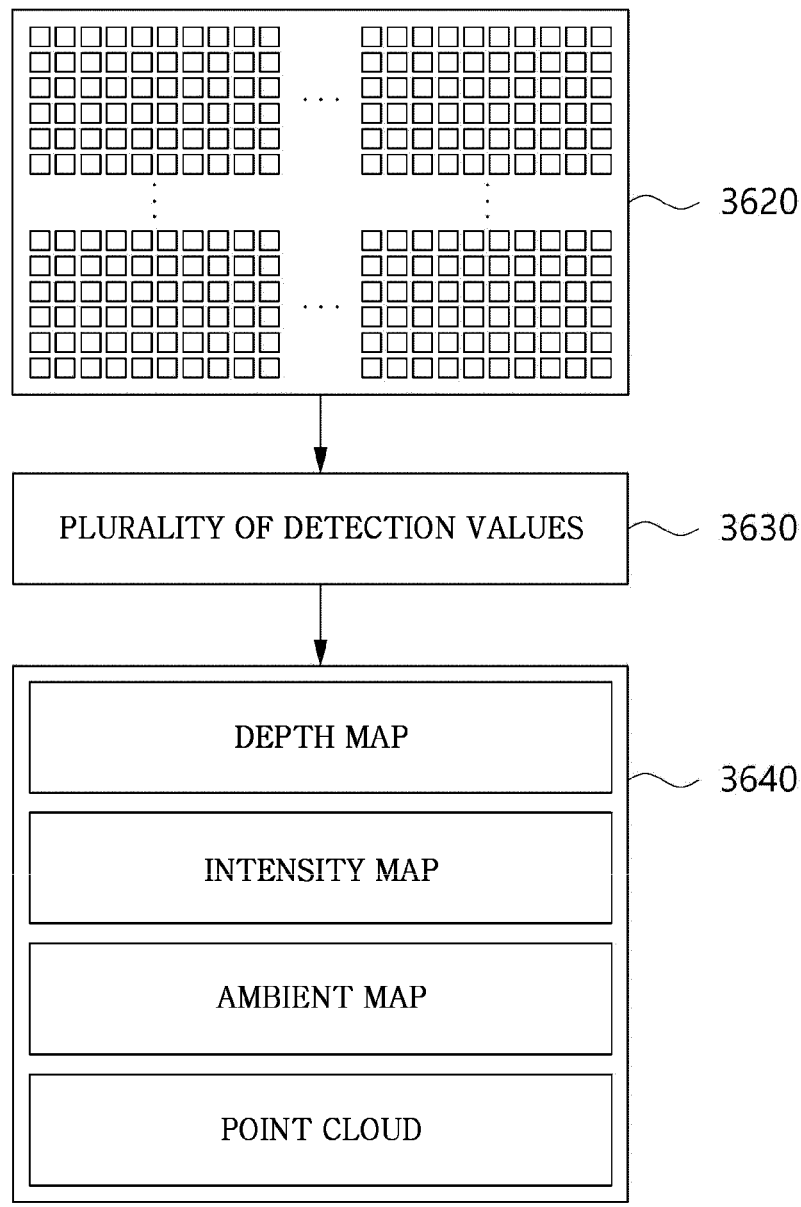
FIG. 45 shows diagrams for describing pieces of LiDAR data according to one embodiment.

FIG. 45 shows diagrams for describing pieces of LiDAR data according to one embodiment.

Referring to FIG. 45, a LiDAR device 3600 according to one embodiment may include a laser detecting array 3620.

In this case, since the above-described contents may be applied to the laser detecting array 3620, repetitive descriptions will be omitted.

In addition, the laser detecting array 3620 may include a plurality of detecting units.

In this case, each of the plurality of detecting units may detect light such as a laser and may generate a detection signal based on a detection result.

In addition, the detection signal may be understood as a concept including both a digital signal and an analog signal.

Furthermore, a detection value 3630 may be generated based on the detection signal generated from each of the plurality of detecting units.

In this case, an operation of generating the detection value may be implemented through at least one processor, but the present invention is not limited thereto.

In addition, the operation of generating the detection value may include various operations of generating a detection value in a LiDAR device, such as an operation of processing an analog detection signal to generate a detection value, an operation of processing a digital detection signal to generate a detection value, and an operation of accumulating a digital signal to generate histogram data and then, generating a detection value based on the generated histogram data.

In addition, the detection value 3630 may include a distance value, a depth value, an intensity value, an ambient value, and the like, but the present invention is not limited thereto.

In this case, the distance value or depth value may be obtained using various methods such as a time-of-flight (ToF) method and a phase shift method which are used to obtain a distance or depth value in a LiDAR device. The distance value or depth value may be understood as a concept including those generally understood as a distance value or depth value in a field related to a LiDAR device.

In addition, the intensity value may be obtained based on a pulse width, peak power, or the like of a detected signal and may be understood as a concept including those generally understood as an intensity value in a field related to a LiDAR device.

In addition, the ambient value 3630 may be obtained based on a signal obtained in a time period in which a laser is not emitted or detected or may be obtained as the sum of all signals obtained within a detecting window for detecting a laser, but the present invention is not limited thereto. The ambient value may be understood as a concept including those generally understood as an ambient value in a field related to a LiDAR device.

In addition, the detection value may be a value corresponding to each of the plurality of detecting units included in the laser detecting array 3620 and may be a value obtained based on a detection signal obtained from each of the plurality of detecting units included in the laser detecting array 3620, but the present invention is not limited thereto.

In addition, at least one piece of LiDAR data 3640 may be acquired based on a plurality of detection values.

In this case, the at least one piece of LiDAR data may include depth map data, intensity map data, ambient map data, point cloud data, and the like, but the present invention is not limited thereto.

In addition, the depth map data may be data in which depth values for a plurality of coordinate values corresponding to the plurality of detecting units are stored in the form of a two-dimensional map.

In this case, the plurality of coordinate values corresponding to the plurality of detecting units may be understood as pixel coordinates, and depth values for the plurality of coordinate values may be understood as pixel values for the pixel coordinates, but the present invention is not limited thereto.

In addition, the intensity map data may be data in which intensity values for a plurality of coordinate values corresponding to the plurality of detecting units are stored in the form of a two-dimensional map.

In this case, the plurality of coordinate values corresponding to the plurality of detecting units may be understood as pixel coordinates, and intensity values for the plurality of coordinate values may be understood as pixel values for the pixel coordinates, but the present invention is not limited thereto.

In addition, the ambient map data may be data in which ambient values for a plurality of coordinate values corresponding to the plurality of detecting units are stored in the form of a two-dimensional map.

In this case, the plurality of coordinate values corresponding to the plurality of detecting units may be understood as pixel coordinates, and ambient values for the plurality of coordinate values may be understood as pixel values for the pixel coordinates.

In addition, the point cloud data may be data in which three-dimensional position coordinate values calculated based on a plurality of coordinate values corresponding to the plurality of detecting units and depth values for the plurality of coordinate values, and intensity values or ambient values for the three-dimensional position coordinate values are stored.

In this case, the three-dimensional position coordinate values may be understood as position values for point data, and the intensity value or ambient value may be understood as an intensity value or an ambient value for a point.

The above-described contents are merely provided to briefly describe embodiments of LiDAR data, and the present invention is not limited to the above-described contents. LiDAR data may include those generally understood as LiDAR data.

Figure 46:
FIG. 46 is a diagram illustrating acquired LiDAR data according to one embodiment.

FIG. 46 is a diagram illustrating acquired LiDAR data according to one embodiment.

More specifically, FIG. 46 is a diagram illustrating intensity map data of LiDAR data acquired from the LiDAR device described with reference to FIG. 42.

Referring to FIG. 46, the intensity map data according to one embodiment may be stored as coordinate values corresponding to a plurality of detecting units and intensity values corresponding to the coordinate values, and stored data may be expressed as in FIG. 46 when illustrated in an image form.

In addition, the stored data may be expressed using various color tables according to a magnitude of intensity.

Furthermore, referring to FIG. 46, a detecting unit in which a laser is obtained and a detecting unit in which a laser is not obtained may be present according to a hardware configuration of a LiDAR device, and thus, invalid intensity values may be included.

Accordingly, a method of, when an invalid detection value is obtained by a hardware configuration of a LiDAR device, selecting and correcting the invalid detection value to generate at least one piece of LiDAR data will be described in more detail below.

Figure 47:
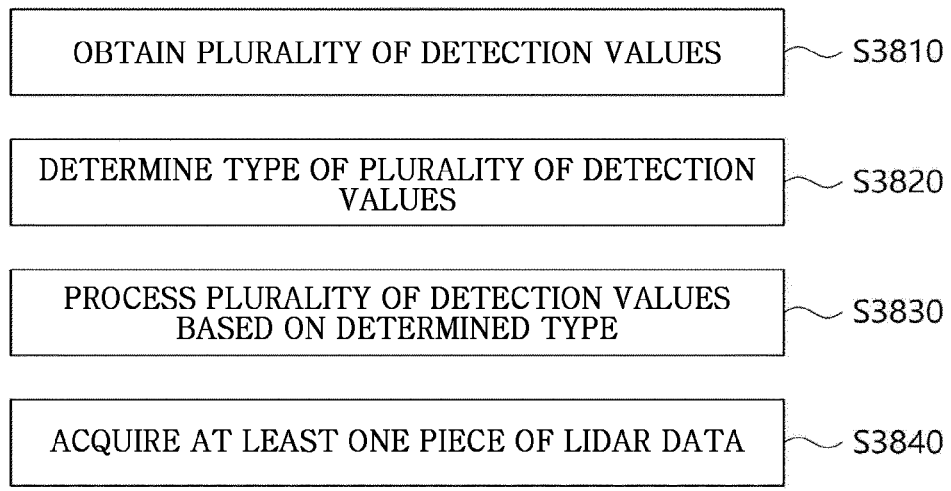
FIG. 47 is a diagram for describing a method of acquiring at least one piece of LiDAR data according to one embodiment.

FIG. 47 is a diagram for describing a method of acquiring at least one piece of LiDAR data according to one embodiment.

Referring to FIG. 47, a method 3800 of acquiring at least one piece of LiDAR data according to one embodiment may include operation S3810 of obtaining a plurality of detection values, operation S3820 of determining a type of the plurality of detection values, operation S3830 of processing the plurality of detection values based on the determined type, and operation S3840 of acquiring at least one piece of LiDAR data.

In this case, in operation S3810 of acquiring the plurality of detection values, the plurality of detection values may be values corresponding to a plurality of detecting units included in a LiDAR device.

For example, the plurality of detection values may include at least one value of a depth value, an intensity value, and an ambient value calculated based on a detection signal obtained from each of the plurality of detecting units included in the LiDAR device, but the present invention is not limited thereto.

In addition, in order to describe operation S3810 of obtaining the plurality of detection values, it is possible to apply a concept of a pixel including coordinate values, which are allocated to each of the plurality of detecting units included in the LiDAR device, as pixel coordinates and including a detection value, which is calculated based on a detection signal obtained from each of the plurality of detecting units, as a pixel value.

In this case, operation S3810 of obtaining the plurality of detection values may be described as an operation of obtaining a pixel value of each of a plurality of pixels including coordinate values, which are allocated to each of the plurality of detecting units included in the LiDAR device, as pixel coordinates.

In this case, the pixel value may include at least one value of the depth value, the intensity value, and the ambient value.

In addition, operation S3820 of determining the type of the plurality of detection values may include an operation of determining the plurality of detection values to be a first type detection value or a second type detection value.

In this case, the first type detection value may refer to a valid detection value, and the second type detection value may refer to an invalid detection value, but the present invention is not limited thereto.

In addition, the valid detection value may refer to a detection value obtained based on a physically and validly detected laser and may refer to a detection value for a detecting unit in which there is a high probability that a laser is validly detected under a certain condition, but the present invention is not limited thereto.

Furthermore, the invalid detection value may refer to a detection value obtained even when a laser is not physically detected and may refer to a detection value for a detecting unit in which there is a low probability that a laser is validly detected under a certain condition, but the present invention is not limited thereto.

In addition, in order to describe operation S3820 of determining the type of the plurality of detection values, it is possible to apply a concept of a pixel including coordinate values, which are allocated to each of the plurality of detecting units included in the LiDAR device, as pixel coordinates and including a detection value, which is calculated based on a detection signal obtained from each of the plurality of detecting units, as a pixel value.

In this case, operation S3820 of determining the type of the plurality of detection values may be described as an operation of determining a type of each of a plurality of pixels including coordinate values, which are allocated to each of the plurality of detecting units included in the LiDAR device, as pixel coordinates.

For example, operation S3820 of determining the type of the plurality of detection values may be described as an operation of determining each of the plurality of pixels to be a first type pixel or a second type pixel.

In this case, the first type pixel may refer to a pixel having a valid pixel value, and the second type pixel may refer to a pixel having an invalid pixel value, but the present invention is not limited thereto.

In addition, the valid pixel value may refer to a pixel value obtained based on a physically and validly detected laser and may refer to a pixel value for a detecting unit in which there is a high probability that a laser is validly detected under a certain condition, but the present invention is not limited thereto.

Furthermore, the invalid pixel value may refer to a pixel value obtained even when a laser is not physically detected and may refer to a pixel value for a detecting unit in which there is a low probability that a laser is validly detected under a certain condition, but the present invention is not limited thereto.

In addition, operation S3820 of determining the type of the plurality of detection values will be described in more detail below with reference to FIGS. 48 and 49.

In addition, operation S3830 of processing the plurality of detection values based on the determined type may include an operation of, when the determined type is the first type detection value, maintaining a detection value, and when the determined type is the second type detection value, correcting the detection value.

For example, operation S3830 of processing the plurality of detection values based on the determined type may include an operation of, when a first detection value included in the plurality of detection values is determined to be the first type detection value, maintaining the first detection value, and when the first detection value is determined to be the second type detection value, correcting the first detection value.

In addition, for example, operation S3830 of processing the plurality of detection values based on the determined type may include an operation of, when the first detection value included in the plurality of detection values is determined to be the first type detection value, maintaining the first detection value, and when the first detection value is determined to be the second type detection value, replacing the first detection value.

In addition, in operation S3830 of processing the plurality of detection values based on the determined type, surrounding detection values may be used to process the plurality of detection values.

For example, when the first detection value included in the plurality of detection values is a value obtained based on a first detection signal obtained from a first detecting unit, detection values calculated based on detection signals obtained from detecting units disposed around the first detecting unit may be used to process the first detection value, but the present invention is not limited thereto.

In addition, in operation S3830 of processing the plurality of detection values based on the determined type, at least one filter or kernel may be used to process the plurality of detection values.

In this case, the at least one filter or kernel may correspond to a concept of a filter or kernel understood in an image processing field and may be used to correct or generate a detection value using surrounding detection values.

In addition, in order to describe operation S3830 of processing the plurality of detection values based on the determined type, it is possible to apply a concept of a pixel including coordinate values, which are allocated to each of the plurality of detecting units included in the LiDAR device, as pixel coordinates and including a detection value, which is calculated based on a detection signal obtained from each of the plurality of detecting units, as a pixel value.

In this case, the operation S3830 of processing the plurality of detection values based on the determined type may be described as an operation of differently processing each of a plurality of pixels according to the determined type, wherein the plurality of pixels include coordinate values, which are allocated to each of the plurality of detecting units included in the LiDAR device, as pixel coordinates For example, operation S3830 of processing the plurality of detection values based on the determined type may include an operation of, when a first pixel is determined to be the first type pixel, maintaining a first pixel value corresponding to the first pixel, and when the first pixel is determined to be the second type pixel, correcting the first pixel value corresponding to the first pixel.

In addition, for example, operation S3830 of processing the plurality of detection values based on the determined type may include an operation of, when the first pixel is determined to be the first type pixel, maintaining the first pixel value corresponding to the first pixel, and when the first pixel is determined to be the second type pixel, replacing the first pixel value corresponding to the first pixel.

Furthermore, in operation S3830 of processing the plurality of detection values based on the determined type, surrounding pixel values may be used to process each of the plurality of pixels.

For example, when the first pixel included in the plurality of pixels is a pixel corresponding to the first detecting unit, pixel values for detecting units disposed around the first detecting unit may be used to process the first pixel value for the first pixel, but the present invention is not limited thereto.

In addition, operation S3830 of processing the plurality of detection values based on the determined type will be described in more detail below with reference to FIGS. 51 to 56.

Furthermore, since the above-described contents may be applied to the LiDAR data in operation S3840 of acquiring the at least one piece of LiDAR data, repetitive descriptions will be omitted.

In addition, operation S3840 of acquiring the at least one piece of LiDAR data may include an operation of acquiring the at least one piece of LiDAR data based on the plurality of processed detection values.

Figure 48:
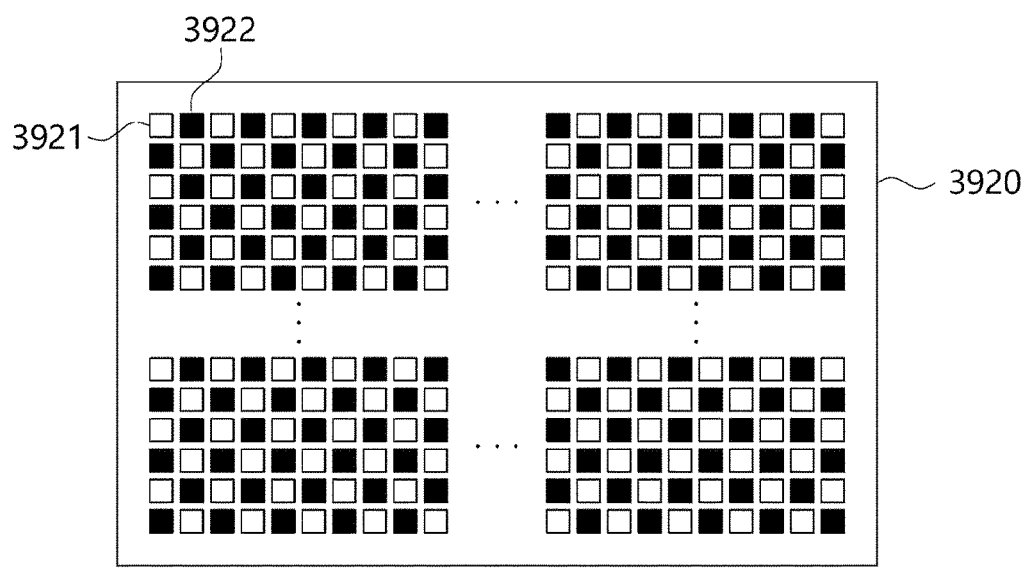
FIG. 48 is a diagram for describing a LiDAR device according to one embodiment.
Figure 48:
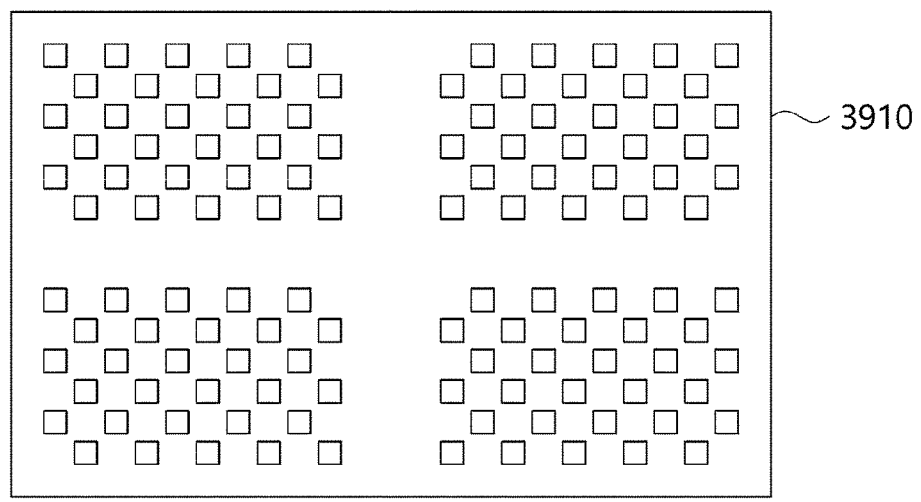

FIG. 48 is a diagram for describing a LiDAR device according to one embodiment.

Referring to FIG. 48, a LiDAR device 3900 according to one embodiment may include a laser emitting array 3910 and a laser detecting array 3920.

In this case, since the above-described contents may be applied to the laser emitting array 3910 and the laser detecting array 3920, repetitive descriptions will be omitted.

The laser detecting array 3920 according to one embodiment may include a first detecting unit group including a first detecting unit 3921 and a second detecting unit group including a second detecting unit 3922.

In this case, each of a plurality of detecting units included in the first detecting unit group may be disposed to correspond to one of a plurality of laser emitting units included in the laser emitting array 3910.

For example, each of the plurality of detecting units included in the first detecting unit group may be disposed at a position of (odd number, odd number) or a position of (even number, even number even), but the present invention is not limited thereto.

In one embodiment, the first detecting unit 3921 may be disposed at a position of (1,1).

In this case, since the above-described contents may be applied to a meaning that each of the detecting units is disposed to correspond to one of the laser emitting units, repetitive descriptions will be omitted.

In addition, each of a plurality of detecting units included in the second detecting unit group may be disposed to not correspond to one of the plurality of laser emitting units included in the laser emitting array 3910.

For example, each of the plurality of detecting units included in the second detecting unit group may be disposed at a position of (odd number, even number) or a position (even number, odd number), but the present invention is not limited thereto.

In one embodiment, the second detecting unit 3922 may be disposed at a position of (1,2).

In this case, since the above-described contents may be applied to a meaning that each of the detecting units is disposed to not correspond to one of the laser emitting units, repetitive descriptions will be omitted.

Hereinafter, a method of determining a type of detection values for the above-described first and second detecting unit groups using different conditions will be described in detail.

Figure 49:
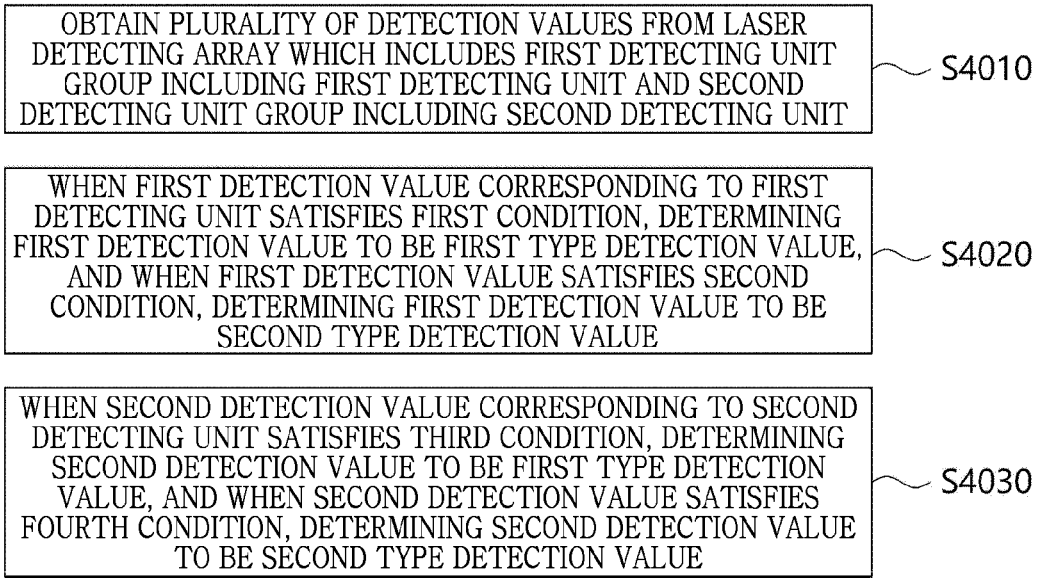
FIG. 49 is a diagram for describing a method of determining a type of a plurality of detection values according to one embodiment.

FIG. 49 is a diagram for describing a method of determining a type of a plurality of detection values according to one embodiment.

Referring to FIG. 49, a method 4000 of determining a type of a plurality of detection values according to one embodiment may include at least one operation of operation S4010 of obtaining a plurality of detection values from a laser detecting array which includes a first detecting unit group including a first detecting unit and a second detecting unit group including a second detecting unit, operation S4020 of, when a first detection value corresponding to the first detecting unit satisfies a first condition, determining the first detection value to be a first type detection value, and when the first detection value satisfies a second condition, determining the first detection value to be a second type detection value, and operation S4030 of, when a second detection value corresponding to the second detecting unit satisfies a third condition, determining the second detection value to be the first type detection value, and when the second detection value satisfies a fourth condition, determining the second detection value to be the second type detection value.

In this case, since the above-described contents may be applied to operation S4010 of obtaining the plurality of detection values from the laser detecting array, repetitive descriptions will be omitted.

In this case, since the contents described with reference to FIG. 48 may be applied to the first detecting unit group and the second detecting unit group, repetitive descriptions will be omitted.

In addition, operation S4020 of, when the first detection value corresponding to the first detecting unit satisfies the first condition, determining the first detection value to be the first type detection value, and when the first detection value satisfies the second condition, determining the first detection value to be the second type detection value may include an operation of selecting the first detection value corresponding to the first detecting unit.

In this case, a meaning that the first detection value corresponding to the first detecting unit is selected may include reading the first detection value for comparison with at least one condition.

In addition, the first condition and the second condition may be conditions related to a first depth value included in the first detection value but are not limited thereto.

For example, the first condition may be a condition related to whether the first depth value included in the first detection value is included in a first distance range, and the second condition may be a condition related to whether the first depth value included in the first detection value is included in a second distance range.

In addition, the first condition and the second condition may be opposing conditions.

For example, the first condition may be a condition in which the first depth value included in the first detection value is 15 m or more or less than 7 m, and the second condition may be a condition in which the first depth value included in the first detection value is 7 m or more and less than 15 m, but the present invention is not limited thereto.

In addition, conditions for a plurality of detecting units included in the first detecting unit group may be the same as the first condition and the second condition which are conditions for the first detecting unit but are not limited thereto.

For example, when a third detection value corresponding to a third detecting unit included in the first detecting unit group satisfies the first condition, the third detection value may be determined to be the first type detection value, and when the third detection value satisfies the second condition, the third detection value may be determined to be the second type detection value, but the present invention is not limited thereto.

In addition, the conditions for the plurality of detecting units included in the first detecting unit group may be different from the first condition and the second condition which are the conditions for the first detecting unit but are not limited thereto.

For example, values for conditions for determining a type of the third detection value corresponding to the third detecting unit included in the first detecting unit group may be adjusted according to a position of the third detecting unit.

For a more specific example, when the first condition is a condition in which a depth value is 15 m or more or less than 7 m, and the second condition is a condition in which a depth value is 7 m or more and less than 15 m, the conditions for determining the type of the third detection value may include a condition in which a depth value is 16 m or more or less than 9 m and a condition in which a depth value is 9 m or more and less than 16 m, but the present invention is not limited thereto.

In addition, for a more specific example, when the first condition is a condition in which a depth value is 15 m or more or less than 7 m, and the second condition is a condition in which a depth value is 7 m or more and less than 15 m, the conditions for determining the type of the third detection value may include a condition in which a depth value is 17 m or more or less than 5 m and a condition in which a depth value is 5 m or more and less than 17 m, but the present invention is not limited thereto.

Furthermore, since the above-described contents may be applied to the first type detection value and the second type detection value, repetitive descriptions will be omitted.

In addition, operation S4030 of, when the second detection value corresponding to the second detecting unit satisfies the third condition, determining the second detection value to be the first type detection value, and when the second detection value satisfies the fourth condition, determining the second detection value to be the second type detection value may include an operation of selecting the second detection value corresponding to the second detecting unit.

In this case, a meaning that the second detection value corresponding to the second detecting unit is selected may include reading the second detection value for comparison with at least one condition.

In addition, the third condition and the fourth condition may be conditions related to a second depth value included in the second detection value but are not limited thereto.

For example, the third condition may be a condition related to whether the second depth value included in the second detection value is included in a third distance range, and the fourth condition may be a condition related to whether the second depth value included in the second detection value is included in a fourth distance range.

In addition, the third condition and the fourth condition may be opposing conditions.

For example, the third condition may be a condition in which the second depth value included in the second detection value is 7 m or more and less than 15 m, and the fourth condition may be a condition in which the second depth value included in the second detection value is 15 m or more or less than 7 m, but the present invention is not limited thereto.

In addition, conditions for a plurality of detecting units included in the second detecting unit group may be the same as the third condition and the fourth condition which are conditions for the second detecting unit but are not limited thereto.

For example, when a fourth detection value corresponding to a fourth detecting unit included in the second detecting unit group satisfies the third condition, the fourth detection value may be determined to be the first type detection value, and when the fourth detection value satisfies the fourth condition, the fourth detection value may be determined to be the second type detection value, but the present invention is not limited thereto.

In addition, the conditions for the plurality of detecting units included in the second detecting unit group may be different from the third condition and the fourth condition which are conditions for the second detecting unit but are not limited thereto.

For example, values for conditions for determining a type of the fourth detection value corresponding to the fourth detecting unit included in the second detecting unit group may be adjusted according to a position of the fourth detecting unit.

For a more specific example, when the third condition is a condition in which a depth value is 7 m or more and less than 15 m, and the fourth condition is a condition in which a depth value is 15 m or more or less than 7 m, the conditions for determining the type of the fourth detection value may include a condition in which a depth value is 9 m or more and less than 16 m and a condition in which a depth value is 16 m or more or less than 9 m, but the present invention is not limited thereto.

In addition, since the above-described contents may be applied to the first type detection value and the second type detection value, repetitive descriptions will be omitted.

Furthermore, the first condition which is a condition for determining the first detection value for the first detecting unit included in the first detecting unit group to be the first type detection value may be different from the third condition which is a condition for determining the second detection value for the second detecting unit included in the second detecting unit group to be the first type detection value.

For example, the first condition and the third condition may be opposing conditions.

For a more specific example, the first condition may be a condition in which a depth value is 15 m or more or less than 7 m, and the third condition may be a condition in which a depth value is 7 m or more and less than 15 m, but the present invention is not limited thereto.

In addition, the second condition which is a condition for determining the first detection value for the first detecting unit included in the first detecting unit group to be the second type detection value may be different from the fourth condition which is a condition for determining the second detection value for the second detecting unit included in the second detecting unit group to be the second type detection value.

For example, the second condition and the fourth condition may be opposing conditions.

For a more specific example, the second condition may be a condition in which a depth value is 7 m or more and less than 15 m, and the fourth condition may be a condition in which a depth value is 15 m or more or less than 7 m, but the present invention is not limited thereto.

Figure 50:
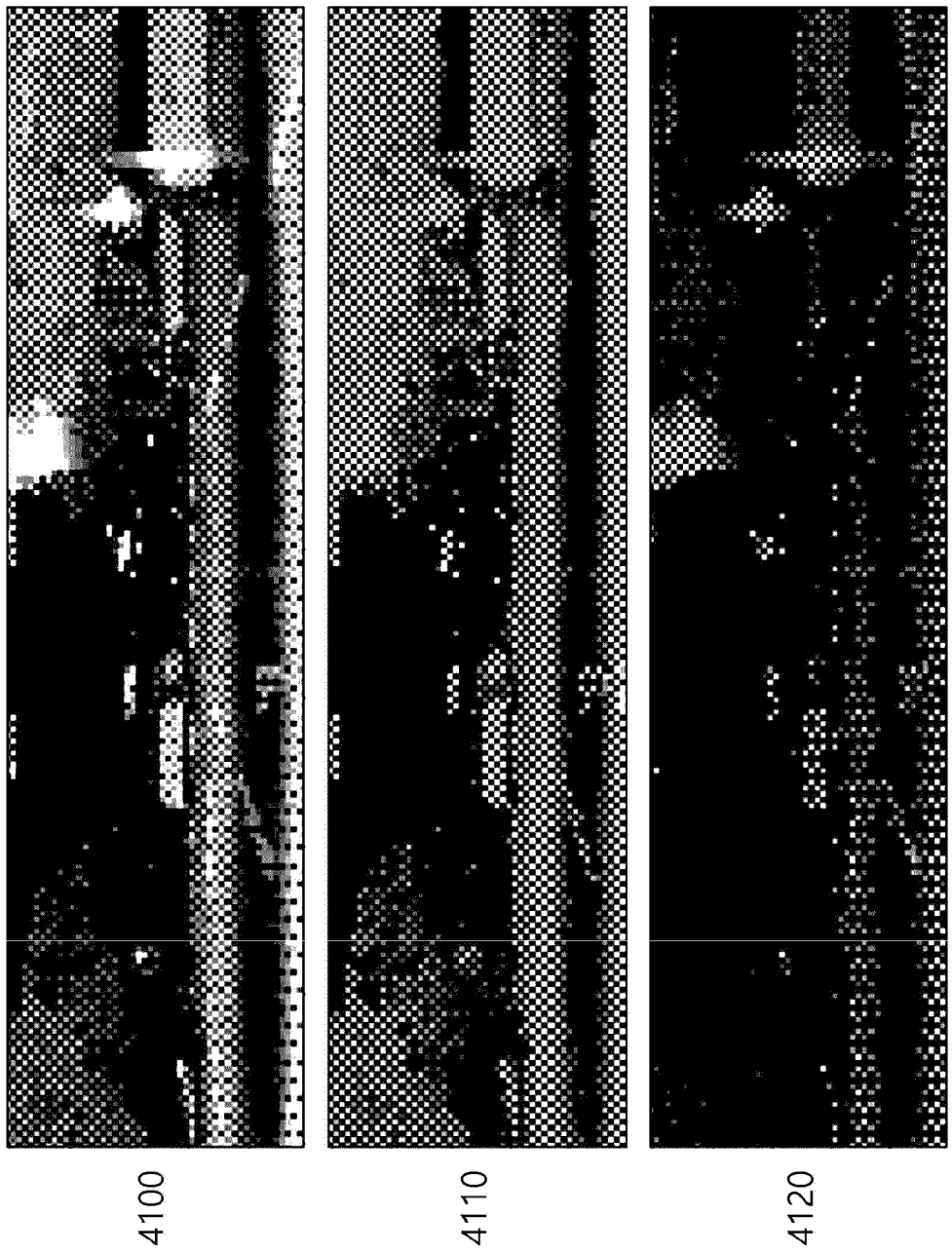
FIG. 50 shows diagrams illustrating LiDAR data according to one embodiment.

FIG. 50 shows diagrams illustrating LiDAR data according to one embodiment.

Referring to FIG. 50, it is possible to confirm first LiDAR data 4100 generated based on a plurality of detection values obtained according to one embodiment, second LiDAR data 4110 generated based on a first type detection value among the plurality of detection values, and third LiDAR data 4120 generated based on a second type detection value among the plurality of detection values.

In this case, the first LiDAR data 4100, the second LiDAR data 4110, and the third LiDAR data 4120 are expressed in the above-described image form of an intensity map.

The second LiDAR data 4110 may be an intensity map generated based on detection values determined to be the first type detection value among the plurality of detection values, and it can be seen that the second LiDAR data 4110 has mostly similar values when compared with the first LiDAR data 4100.

In addition, the third LiDAR data 4120 may be an intensity map generated based on detection values determined to be the second type detection value among the plurality of detection values, and it can be seen that validity of data is lower when compared with the second LiDAR data 4110.

That is, validity of the detection values determined to be the first type detection value among the plurality of detection values may be higher than validity of the detection values determined to be the second type detection value, and accordingly, there may a need for an operation of correcting or replacing the detection values determined to be the second type detection value to process the detection values.

Hereinafter, an operation of correcting or replacing the detection values determined to be the second type detection value to process the detection values or an operation of correcting or replacing pixel values of pixels determined to be a second type pixel to process the pixel values will be described in more detail.

Figure 51:
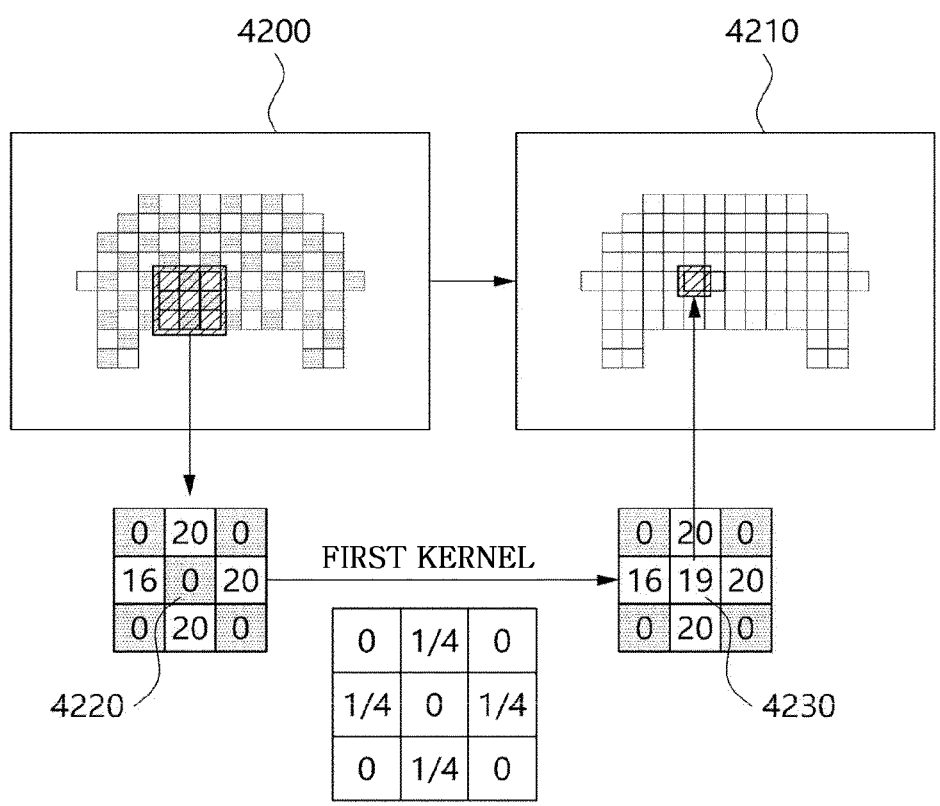
FIGS. 51 and 52 show diagrams for describing an operation of processing a detection value according to one embodiment.
Figure 52:
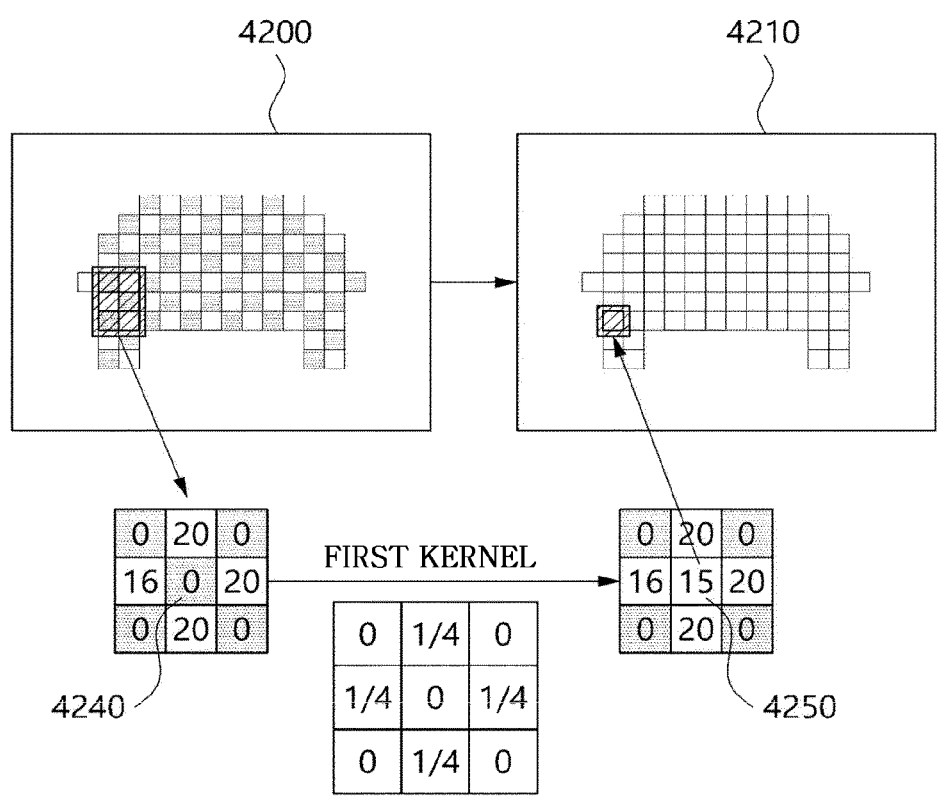

FIGS. 51 and 52 show diagrams for describing an operation of processing a detection value according to one embodiment.

Prior to description with reference to FIGS. 51 and 52, a concept of a pixel will be introduced for convenience of description.

First, a pixel may be understood as a concept including coordinate values and specific values corresponding to the coordinate values.

In addition, a pixel may include coordinate values according to a position at which a detecting unit is disposed in a laser detecting array.

For example, when a first detecting unit is disposed at (1,1) in the laser detecting array, coordinate values of a first pixel corresponding to the first detecting unit may be (1,1).

However, for convenience of description, the above-described example is merely provided to introduce a case in which that the position of the first detecting unit is the same as the coordinate values of the first pixel in the laser detecting array, and the concept described in the present invention is not limited thereto. The concept of the present invention may include a case in which the position of the first detecting unit is different from the coordinate values of the first pixel in the laser detecting array and also may include a concept in which the position of the first detecting unit is different from the coordinate values of the first pixel within a certain rule in the laser detecting array.

In addition, a pixel value may correspond to the above-described detection value and may include a depth value, an intensity value, an ambient value, and the like.

Referring to FIGS. 51 and 52, according to one embodiment, a plurality of detection values obtained from a plurality of detecting units may be stored in the form of a pixel image 4200.

In this case, the pixel image 4200 is only drawn as a picture for convenience of description and may be stored in various data formats.

In addition, referring to FIGS. 51 and 52, in the pixel image 4200, pixels expressed in a dark color may be pixels determined to be a second type pixel through the above-described methods, and pixels expressed in a white color may be pixels determined to be a first type pixel through the above-described methods.

In addition, a pixel value of the pixel determined to be the second type pixel through the above-described methods may be changed into a reference value and then may be corrected based on surrounding values.

For example, an intensity value of the pixel determined to be the second type pixel through the above-described methods may be changed to 0 and then may be corrected based on intensity values of surrounding pixels, but the present invention is not limited thereto.

In addition, for example, a depth value of the pixel determined to be the second type pixel through the above-described methods may be changed to 0 and then may be corrected based on depth values of surrounding pixels, but the present invention is not limited thereto.

In addition, a filter or kernel may be used to correct the pixel value of the pixel determined to be the second type pixel using surrounding pixel values.

For example, when a first pixel 4220 is a pixel determined to be the second type pixel, a first kernel may be used to correct a pixel value of the first pixel 4220 using surrounding pixel values of the first pixel 4220, but the present invention is not limited thereto.

In this case, the first kernel may be a kernel designed to multiply each of pixel values of pixels located at upper, lower, left, and right sides of the first pixel 4220 by a weight of ¼ and total the pixel values, but the present invention is not limited thereto.

Accordingly, when the first kernel is used, referring to FIG. 51, the pixel value of the first pixel 4220 may be corrected to 19 (a pixel 4230).

In addition, when a second pixel 4240 is a pixel determined to be the second type pixel, the first kernel may be used to correct a pixel value of the second pixel 4240 using surrounding pixel values of the second pixel 4240, but the present invention is not limited thereto.

In this case, the first kernel may be a kernel designed to multiply each of pixel values of pixels located at upper, lower, left, and right sides of the second pixel 4240 by a weight of ¼ and total the pixel values, but the present invention is not limited thereto.

Accordingly, when the first kernel is used, referring to FIG. 52, the pixel value of the second pixel 4240 may be corrected to 15 (a pixel 4250).

In addition, the pixel values corrected as described above may be included in LiDAR data 4210.

In this case, since the above-described contents may be applied to the LiDAR data 4210, repetitive descriptions will be omitted.

In addition, referring to FIGS. 51 and 52, when the first kernel is used, it can be seen that, in the case of the first pixel 4220 which is a pixel located at a central portion of an object, the pixel value thereof is restored similarly to surrounding values, but in the case of the second pixel 4240 which is a pixel located at an edge of the object, the pixel value thereof is restored differently from surrounding values.

Accordingly, a kernel for restoring a pixel value of a pixel determined to be the second type pixel through the above-described methods needs to be designed in more various ways.

Figure 53:
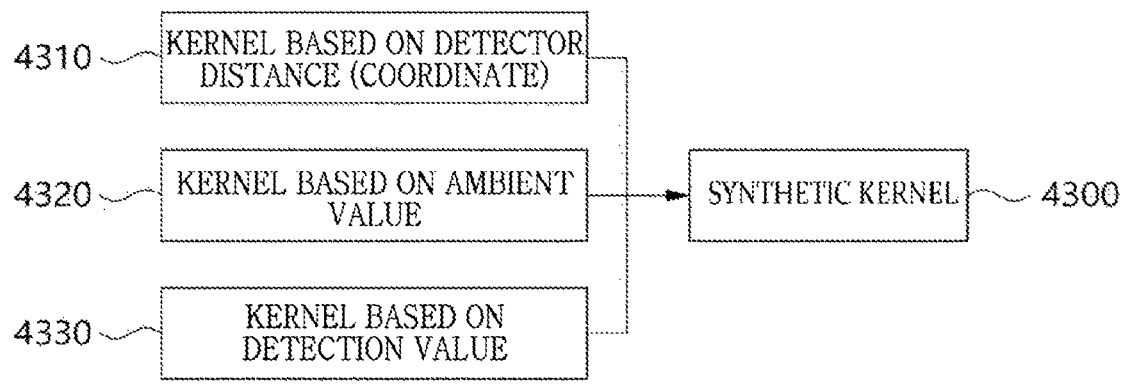
FIG. 53 is a diagram for describing various kernels for correcting a detection value according to one embodiment.

FIG. 53 is a diagram for describing various kernels for correcting a detection value according to one embodiment.

Referring to FIG. 53, kernels for correcting a detection value according to one embodiment may include a synthetic kernel 4300, a kernel 4310 designed based on a distance between detecting units, a kernel 4320 designed based on an ambient value, a kernel 4330 designed based on a detection value, and the like.

In this case, the synthetic kernel 4300 may be a kernel in which two or more kernels are combined.

In addition, the kernel 4310 designed based on the distance between the detecting units may be a kernel of which a weight is designed based on a physical distance between the detecting units, but the present invention is not limited thereto.

Furthermore, the kernel 4310 designed based on the distance between the detecting units may be a kernel of which a weight is designed based on position coordinates at which the detecting units are arranged in a laser detecting array, but the present invention is not limited thereto.

In addition, the kernel 4310 designed based on the distance between the detecting units may be a kernel of which a weight is designed based on pixel coordinates corresponding to the detecting units, but the present invention is not limited thereto.

Furthermore, the kernel 4310 designed based on the distance between the detecting units will be described in more detail with reference to FIG. 54.

In addition, the kernel 4320 designed based on the ambient value may be a kernel of which a weight is designed based on an ambient value of an area corresponding to the kernel, but the present invention is not limited thereto.

Furthermore, the kernel 4320 designed based on the ambient value may be a kernel of which a weight is designed based on ambient values for a pixel to be corrected and surrounding pixels, but the present invention is not limited thereto.

In addition, the kernel 4320 designed based on the ambient value will be described in more detail with reference to FIG. 55.

Furthermore, the kernel 4330 designed based on the detection value may be a kernel of which a weight is designed based on a detection value of an area corresponding to the kernel, but the present invention is not limited thereto.

In addition, the kernel 4330 designed based on the detection value may be a kernel of which a weight is designed based on detection values for surrounding pixels of a pixel to be corrected, but the present invention is not limited thereto.

Furthermore, the kernel 4330 designed based on the detection value will be described in more detail with reference to FIG. 56.

Figure 54:
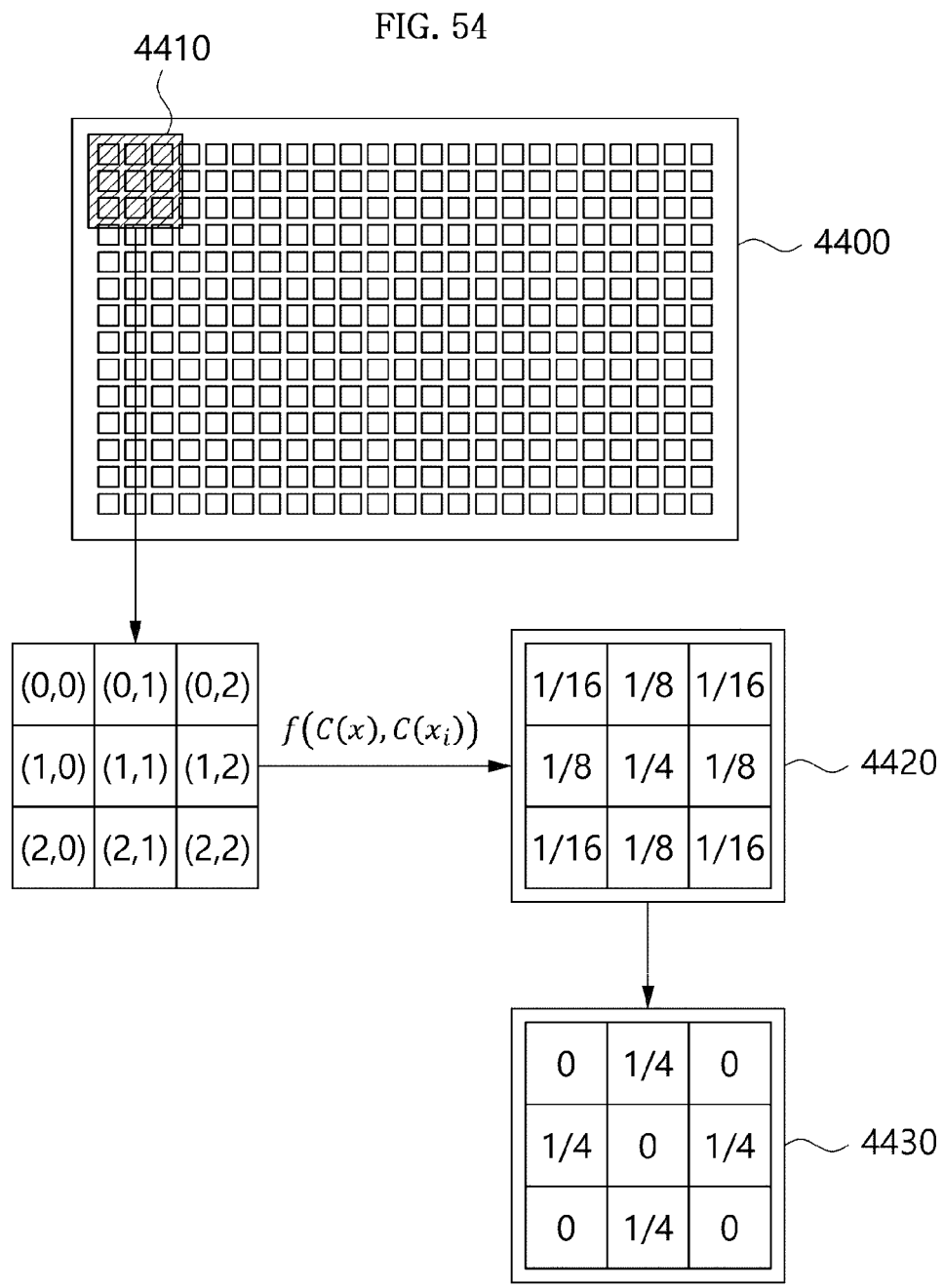
FIG. 54 shows diagrams for describing a kernel designed based on a distance between detecting units according to one embodiment.

FIG. 54 shows diagrams for describing a kernel designed based on a distance between detecting units according to one embodiment.

Referring to FIG. 54, a LiDAR device according to one embodiment may include a laser detecting array 4400, and the laser detecting array may include a first area 4410.

In this case, detecting units disposed in the first area may be disposed at (0,0), (0,1), (0,2), (1,0), (1,1), (1,2), (2,0), (2,1), and (2,2).

In addition, (0,0), (0,1), (0,2), (1,0), (1,1), (1,2), (2,0), (2,1), and (2,2) may refer to coordinates of the detecting units and may refer to coordinates of pixels corresponding to the detecting units.

Referring to FIG. 54, the kernel designed based on the distance between the detecting units according to one embodiment may be defined as a function of coordinate values of a pixel (or a detecting unit) to be corrected and coordinate values of surrounding pixels (or detecting units).

For example, a weight of the kernel designed based on the distance between the detecting units according to one embodiment may be determined by the Equation below.

$$\text{Equation: weight} = \text{Exp}\left(\frac{-(PixelDistance)^2}{2\sigma_{spatial}^2}\right)$$

In this case, PixelDistance may be calculated based on coordinates of a pixel to be corrected and coordinate values of surrounding pixels.

For example, when a pixel to be corrected is at (1,1), PixelDistance for calculating a weight for a pixel at (0,0) may be 2 (1 squared plus 1 squared) but is not limited thereto.

In addition, referring to FIG. 54, the kernel designed based on the distance between the detecting units according to one embodiment may be designed like a first kernel 4420, but the present invention is not limited thereto.

Furthermore, the kernel designed based on the distance between the detecting units according to one embodiment may be designed in consideration of a hardware configuration of a LiDAR device.

For example, in a LiDAR device having a configuration as shown in FIG. 44, there may be a high probability that valid pixels are located at upper, lower, left, and right sides of a pixel to be corrected, and there may be a high probability that invalid pixels are located at positions of (0,0), (0,2), (2,0), and (2,2), and thus, the kernel designed based on the distance between the detecting units according to one embodiment may be designed like a second kernel 4430 in which a weight of ¼ is given to each of upper, lower, left, and right sides as shown in FIG. 54. However, the present invention is not limited thereto.

However, the above-described examples are merely provided to describe specific examples for convenience of description, and the present invention is not limited to the above-described examples.

Figure 55:
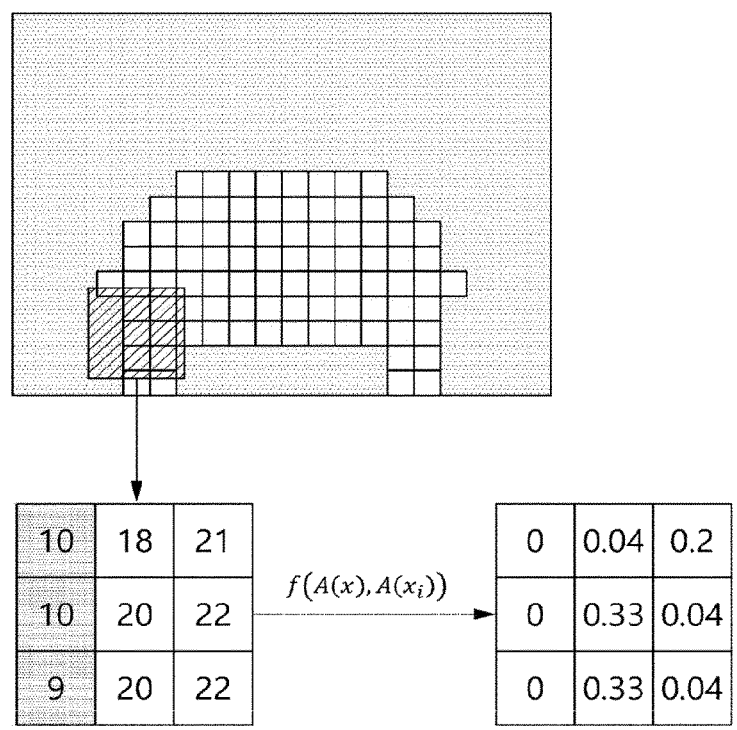
FIG. 55 shows diagrams for describing a kernel designed based on an ambient value according to one embodiment.

FIG. 55 shows diagrams for describing a kernel designed based on an ambient value according to one embodiment.

Referring to FIG. 55, the kernel designed based on the ambient value according to one embodiment is designed as a function of an ambient value for a pixel (or a detecting unit) to be corrected and ambient values for surrounding pixels (or detecting units).

For example, a weight of the kernel designed based on the ambient value according to one embodiment may be determined by the Equation below.

$$\text{Equation: weight} = \text{Exp}\left(\frac{-(A(x_i) - A(x))^2}{2\sigma_{range1}^2}\right)$$

In this case, x may denote a pixel 4510 to be corrected, and $x_i$ may denote surrounding pixels of the pixel to be corrected.

That is, an ambient value for each of a plurality of detecting units may be a value that is irrelevant to or has low relevance to a laser emitting and may be a value that is irrelevant to an arrangement of a laser emitting array.

Accordingly, the ambient value for each of the plurality of detecting units may reflect the similarity to a surrounding environment. Accordingly, when the kernel designed based on the ambient value is used, a depth value or intensity value of a pixel to be corrected may be corrected or restored to be more closely match the surrounding environment.

As a result, the contents described with reference to FIG. 55 are contents related to designing a kernel based on similarity of ambient values for pixels, and the contents of the present invention are not limited to specific examples such as the Equation.

Figure 56:
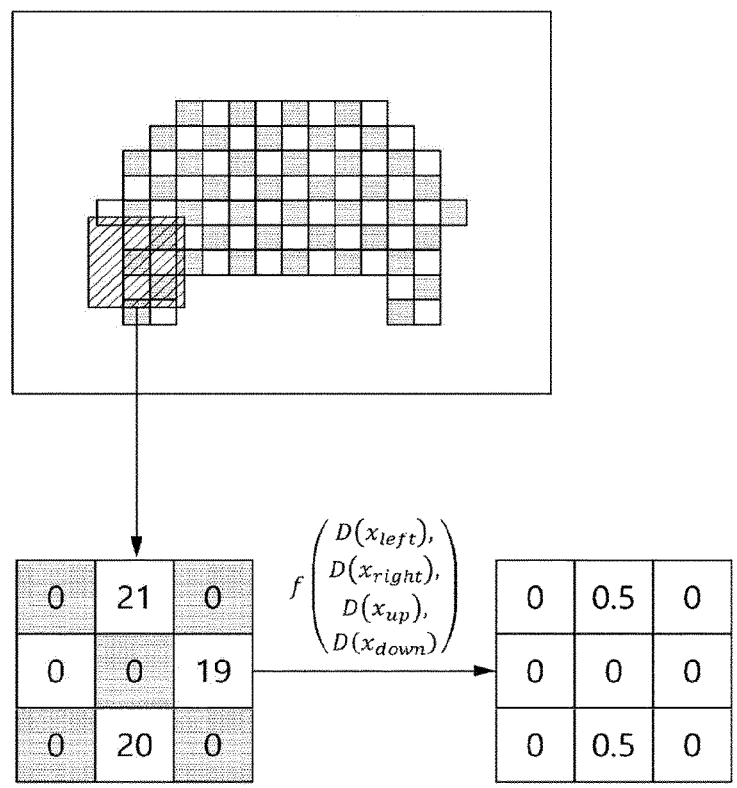
FIG. 56 shows diagrams for describing a kernel designed based on a detection value according to one embodiment.

FIG. 56 shows diagrams for describing a kernel designed based on a detection value according to one embodiment.

Referring to FIG. 56, the kernel designed based on the detection value according to one embodiment may be designed as a function of detection values for surrounding pixels (or detecting units) of a pixel (or a detecting unit) to be corrected.

For example, the kernel designed based on the detection value according to one embodiment may be designed as a function of a detection value for a pixel (or a detecting unit) located at a left side of the pixel to be corrected (or the detecting unit), a detection value for a pixel (or a detecting unit) located at a right side thereof, a detection value for a pixel (or a detecting unit) located at an upper side thereof, and a detection value for a pixel (or a detecting unit) located at a lower side thereof, but the present invention is not limited thereto.

In addition, the detection value may include a depth value or an intensity value.

Furthermore, for example, a weight of the kernel designed based on the detection value according to one embodiment may be determined by the Equation below.

$$\text{Equation: weight} = \text{Exp}\left(\frac{-(I(\text{left, up}) - I(\text{right, down}))^2}{2\sigma_{range2}^2}\right)$$

Here, I(left) may denote an intensity value of a pixel located at a left side of a pixel to be corrected, I(right) may denote an intensity value of a pixel located at a right side of the pixel to be corrected, I(up) may denote an intensity value of a pixel located at an upper side of the pixel to be corrected, and I(down) may denote an intensity value of a pixel located at a lower side of the pixel to be corrected.

That is, since a difference in pixel value (intensity value or depth value) between pixels located at left and right sides or between pixels located at upper and lower sides may become large in an edge area that is a boundary area between an object and a surrounding area, the kernel designed based on the detection value may be used to more accurately restore a pixel value (intensity value or depth value) at the edge that is the boundary area between the object and the surrounding area.

As a result, the contents described with reference to FIG. 56 are contents related to a kernel designed based on detection values for pixels (or detecting units) located around a pixel (or a detecting unit) to be corrected so as to more accurately restore a value in a boundary area between an object and a surrounding area, and the contents of the present invention are not limited to specific examples such as the Equation.

Referring to FIG. 53 again, the synthetic kernel 4300 may be a kernel designed based on the above-described kernels.

For example, an intensity value corrected using the synthetic kernel 4300 may be represented by the Equation below.

$$I^{filtered}(x) = \frac{1}{W_p} \sum_{x_i \in \Omega} I(x_i) g_s(x) f_{r1}(\|A(x_i) - A(x)\|) f_{r2}(x)$$

Here, $I^{filtered}(x)$ may denote a corrected intensity value, x may denote a pixel to be corrected, $x_i$ may denote surrounding pixels of the pixel to be corrected, $g_s(x)$ may denote a function for a kernel designed based on a distance between detecting units, $f_{r1}$ may denote a function for a kernel designed based on an ambient value, and $f_{r2}$ may denote a function for a kernel designed based on a detection value.

However, the above-described contents are merely described to describe one embodiment, and a synthetic kernel may refer to a kernel designed using one or more kernels designed in various ways.

Figure 57:
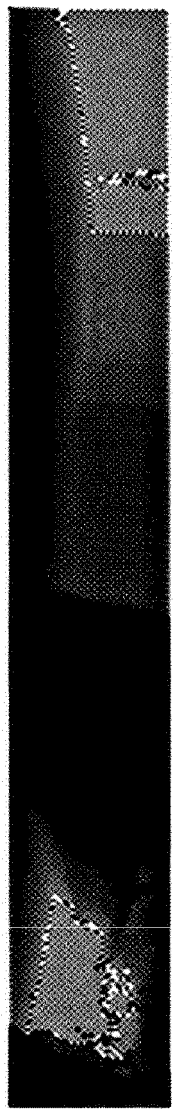
FIG. 57 shows diagrams illustrating a depth map obtained from a LiDAR device according to one embodiment.
Figure 57:
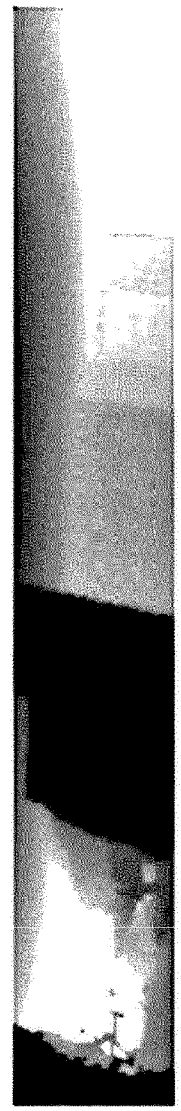

FIG. 57 shows diagrams illustrating a depth map obtained from a LiDAR device according to one embodiment.

Referring to FIG. 57, a first depth map 4710 may be obtained based on a plurality of detection values obtained from the LiDAR device according to one embodiment.

In addition, referring to FIG. 57, a second depth map 4720 may be obtained by processing the plurality of detection values obtained from the LiDAR device according to one embodiment.

In this case, the second depth map 4720 may be a map generated based on a result of processing detection values determined to be a second type detection value according to the contents described with reference to FIGS. 49 to 56.

Accordingly, referring to the first depth map 4710 and the second depth map 4720, it can be seen that portions of the first depth map 4710 which are viewed to have invalid detection values are restored based on surrounding detection values in the second depth map 4720.

As a result, according to the contents of the present invention described with reference to FIGS. 40 to 56, a density of a plurality of laser emitting units included in a laser emitting array may be decreased, and concurrently, the number of the laser emitting units configured to emit a laser may be reduced to increase the power of a laser emitting from each of the laser emitting units under an eye-safety condition of a LiDAR device, and invalid detection values generated due to the reduction in the number of the laser emitting units may be processed so that loss of resolution may not practically occur.

Figure 58:
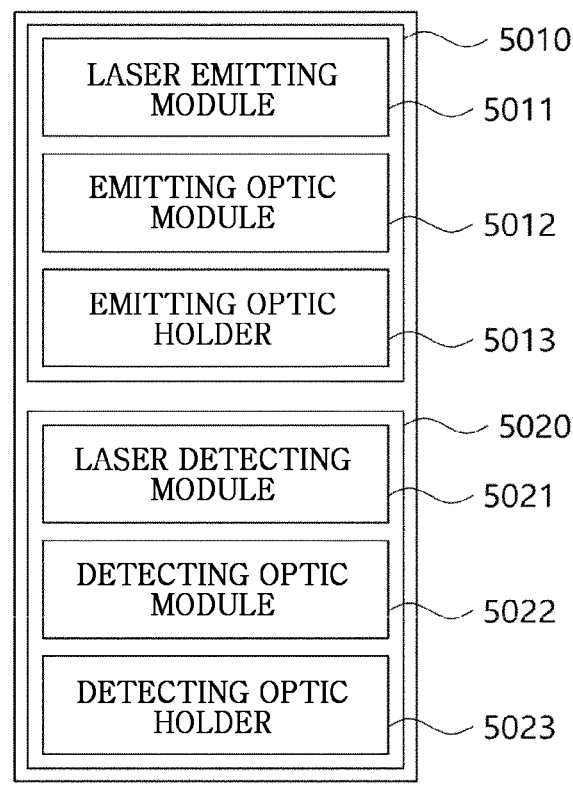
FIG. 58 is a diagram for describing a LiDAR device according to one embodiment.

FIG. 58 is a diagram for describing a LiDAR device according to one embodiment.

Referring to FIG. 58, a LiDAR device 5000 according to one embodiment may include a transmitting module 5010 and a receiving module 5020.

In addition, referring to FIG. 58, the transmitting module 5010 may include a laser emitting module 5011, an emitting optic module 5012, and an emitting optic holder 5013.

In this case, the laser emitting module 5011 may include a laser emitting array, and since the above-described contents may be applied to the laser emitting array, repetitive descriptions will be omitted.

In addition, the emitting optic module 5012 may include a lens assembly, and since the above-described contents of the first lens assembly and the like may be applied to the lens assembly, repetitive descriptions will be omitted.

Furthermore, the emitting optic holder 5013 may be located between the laser emitting module 5011 and the emitting optic module 5012.

For example, the emitting optic holder 5013 may be located between the laser emitting module 5011 and the emitting optic module 5012 so as to fix a relative positional relationship between the laser emitting module 5011 and the emitting optic module 5012, but the present invention is not limited thereto.

In addition, the emitting optic holder 5013 may be formed to fix movement of the emitting optic module 5012.

For example, the emitting optic holder 5013 may be formed to include a hole into which at least a portion of the emitting optic module 5012 is inserted such that movement of the emitting optic module 5012 is restricted, but the present invention is not limited thereto.

In addition, referring to FIG. 58, the receiving module 5020 according to one embodiment may include a laser detecting module 5021, a detecting optic module 5022, and a detecting optic holder 5023.

In this case, the laser detecting module 5021 may include a laser detecting array, and since the above-described contents may be applied to the laser detecting array, repetitive descriptions will be omitted.

In addition, the detecting optic module 5022 may include a lens assembly, and since the above-described contents of the second lens assembly or the like may be applied to the lens assembly, repetitive descriptions will be omitted.

Furthermore, the detecting optic holder 5023 may be located between the laser detecting module 5021 and the detecting optic module 5022.

For example, the detecting optic holder 5023 may be located between the laser detecting module 5021 and the detecting optic module 5022 so as to fix a relative positional relationship between the laser detecting module 5021 and the detecting optic module 5022, but the present invention is not limited thereto.

In addition, the detecting optic holder 5023 may be formed to fix movement of the detecting optic module 5022.

For example, the detecting optic holder 5023 may be formed to include a hole into which at least a portion of the detecting optic module 5022 is inserted such that movement of the detecting optic module 5022 is restricted, but the present invention is not limited thereto.

In addition, the emitting optic holder 5013 and the detecting optic holder 5023 may be integrally formed.

For example, the emitting optic holder 5013 and the detecting optic holder 5023 may be integrally formed, and thus, two holes of one optic holder are formed such that at least portions of the emitting optic module 5012 and the detecting optic module 5022 are inserted thereinto, but the present invention is not limited thereto.

In addition, the emitting optic holder 5013 and the detecting optic holder 5023 may not be physically separated and may conceptually refer to a first part and a second part of one optic holder, but the present invention is not limited thereto.

Figure 59:
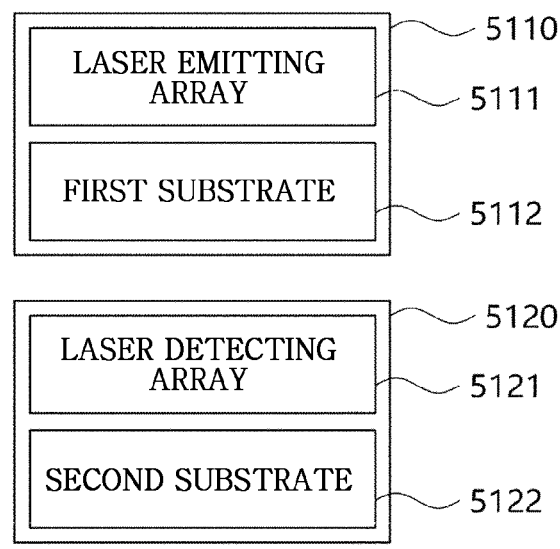
FIGS. 59 and 60 are diagrams for describing a laser emitting module and a laser detecting module according to one embodiment.
Figure 60:
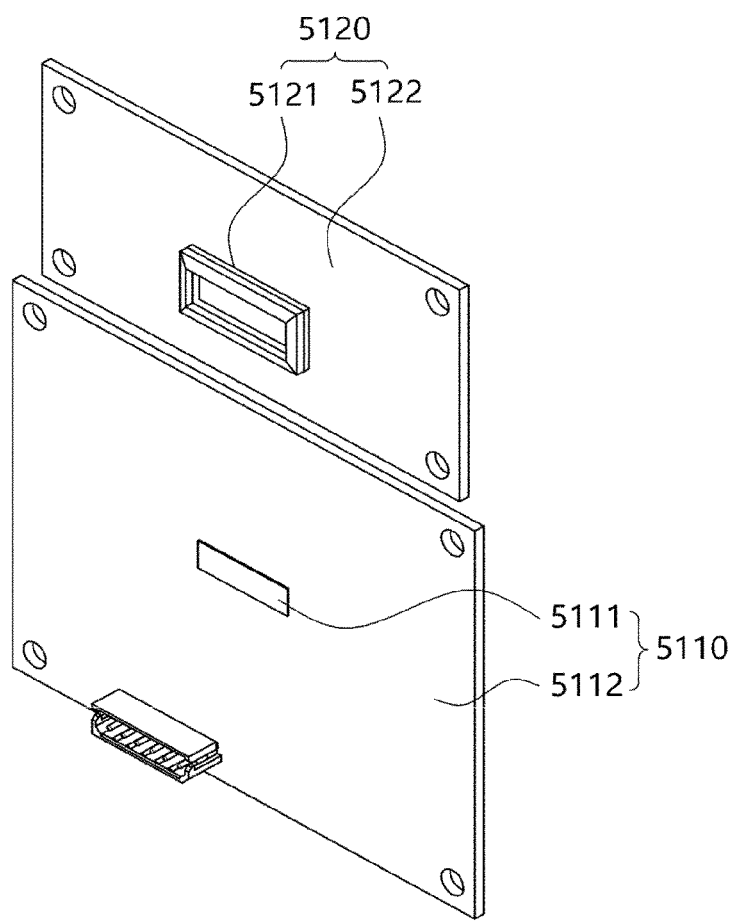

FIGS. 59 and 60 are diagrams for describing a laser emitting module and a laser detecting module according to one embodiment.

Referring to FIGS. 59 and 60, a LiDAR device 5100 according to one embodiment may include a laser emitting module 5110 and a laser detecting module 5120.

In addition, referring to FIGS. 59 and 60, the laser emitting module 5110 according to one embodiment may include a laser emitting array 5111 and a first substrate 5112.

In this case, since the above-described contents may be applied to the laser emitting array 5111, repetitive descriptions will be omitted.

The laser emitting array 5111 according to one embodiment may be provided in the form of a chip in which a plurality of laser emitting units are arranged in an array form, but the present invention is not limited thereto.

For example, the laser emitting array 5111 may be provided in the form of a laser emitting chip, but the present invention is not limited thereto.

In addition, the laser emitting array 5111 may be located on the first substrate 5112, but the present invention is not limited thereto.

Furthermore, the first substrate 5112 may include a laser emitting driver for controlling the operation of the laser emitting array 5111, but the present invention is not limited thereto.

In addition, referring to FIGS. 59 and 60, the laser detecting module 5120 according to one embodiment may include a laser detecting array 5121 and a second substrate 5122.

In this case, since the above-described contents may be applied to the laser detecting array 5121, repetitive descriptions will be omitted.

The laser detecting array 5121 according to one embodiment may be provided in the form of a chip in which a plurality of laser detecting units are arranged in an array form, but the present invention is not limited thereto.

For example, the laser detecting array 5121 may be provided in the form of a laser detecting chip, but the present invention is not limited thereto.

In addition, the laser detecting array 5121 may be located on the second substrate 5122, but the present invention is not limited thereto.

Furthermore, the second substrate 5122 may include a laser detecting driver for controlling the operation of the laser detecting array 5121, but the present invention is not limited thereto.

In addition, the first substrate 5112 and the second substrate 5122 may be provided separately from each other as shown in FIG. 60, but the present invention is not limited thereto. The first substrate 5112 and the second substrate 5122 may be provided as one substrate.

In addition, FIG. 60 is a diagram for describing one embodiment of the LiDAR device of FIG. 59, and the contents in FIG. 59 and the present invention are not limited to the shape shown in FIG. 60.

Figure 61:
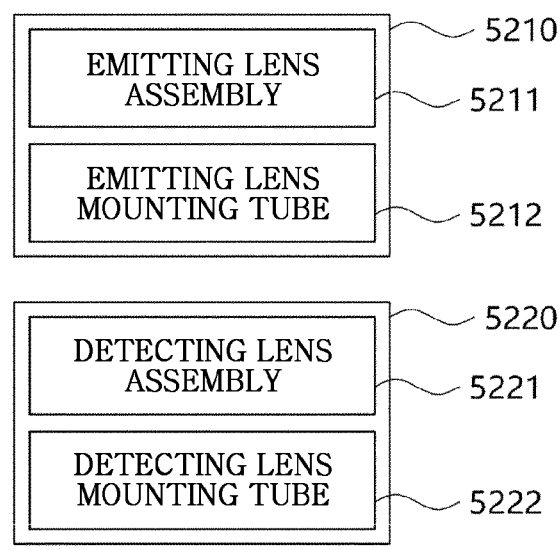
FIGS. 61 and 62 are diagrams for describing an emitting lens module and a detecting lens module according to one embodiment.
Figure 62:
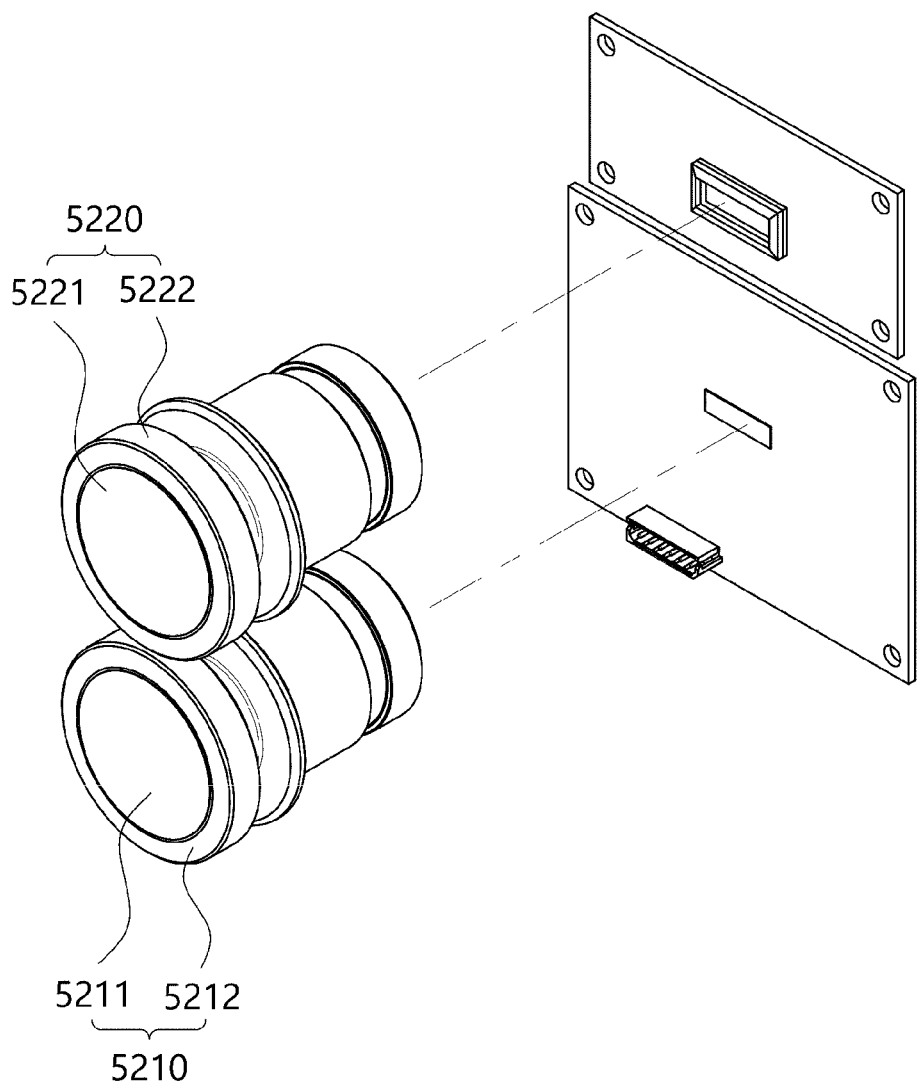

FIGS. 61 and 62 are diagrams for describing an emitting lens module and a detecting lens module according to one embodiment.

Referring to FIGS. 61 and 62, a LiDAR device 5200 according to one embodiment may include an emitting lens module 5210 and a detecting lens module 5220.

In addition, referring to FIGS. 61 and 62, the emitting lens module 5210 according to one embodiment may include an emitting lens assembly 5211 and an emitting lens mounting tube 5212.

In this case, since the above-described contents may be applied to the emitting lens assembly 5211, repetitive descriptions will be omitted.

The emitting lens assembly 5211 according to one embodiment may be disposed in the emitting lens mounting tube 5212.

In addition, the emitting lens mounting tube 5212 may refer to a body tube surrounding the emitting lens assembly 5211, but the present invention is not limited thereto.

Furthermore, referring to FIGS. 61 and 62, the detecting lens module 5220 according to one embodiment may include a detecting lens assembly 5221 and a detecting lens mounting tube 5222.

In this case, since the above-described contents may be applied to the detecting lens assembly 5221, repetitive descriptions will be omitted.

The detecting lens assembly 5221 according to one embodiment may be disposed in the detecting lens mounting tube 5222.

In addition, the detecting lens mounting tube 5222 may refer to a body tube surrounding the detecting lens assembly 5221, but the present invention is not limited thereto.

Furthermore, referring to FIG. 62, the emitting optic module 5012 may be disposed to be aligned with the above-described laser emitting module.

In this case, a meaning that the emitting optic module 5012 is disposed to be aligned with the above-described laser emitting module may include a meaning that the emitting optic module 5012 is disposed to have a physically preset relative positional relationship and a meaning that the emitting optic module 5012 is aligned to radiate a laser at an optically targeted angle, but the present invention is not limited thereto.

Furthermore, referring to FIG. 62, the detecting optic module 5022 may be disposed to be aligned with the above-described laser detecting module.

In this case, a meaning that the detecting optic module 5022 is disposed to be aligned with the above-described laser detecting module may include a meaning that the detecting optic module 5022 is disposed to have a physically preset relative positional relationship and a meaning that the detecting optic module 5022 is aligned to detect a laser received at an optically targeted angle.

In addition, FIG. 62 is a diagram for describing one embodiment of the LiDAR device of FIG. 61, and the contents described in FIG. 61 and the present invention are not limited to the shape shown in FIG. 62.

Figure 63:
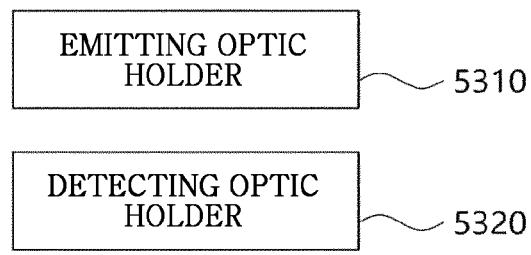
FIGS. 63 and 64 are diagrams for describing an emitting optic holder and a detecting optic holder according to one embodiment.
Figure 64:
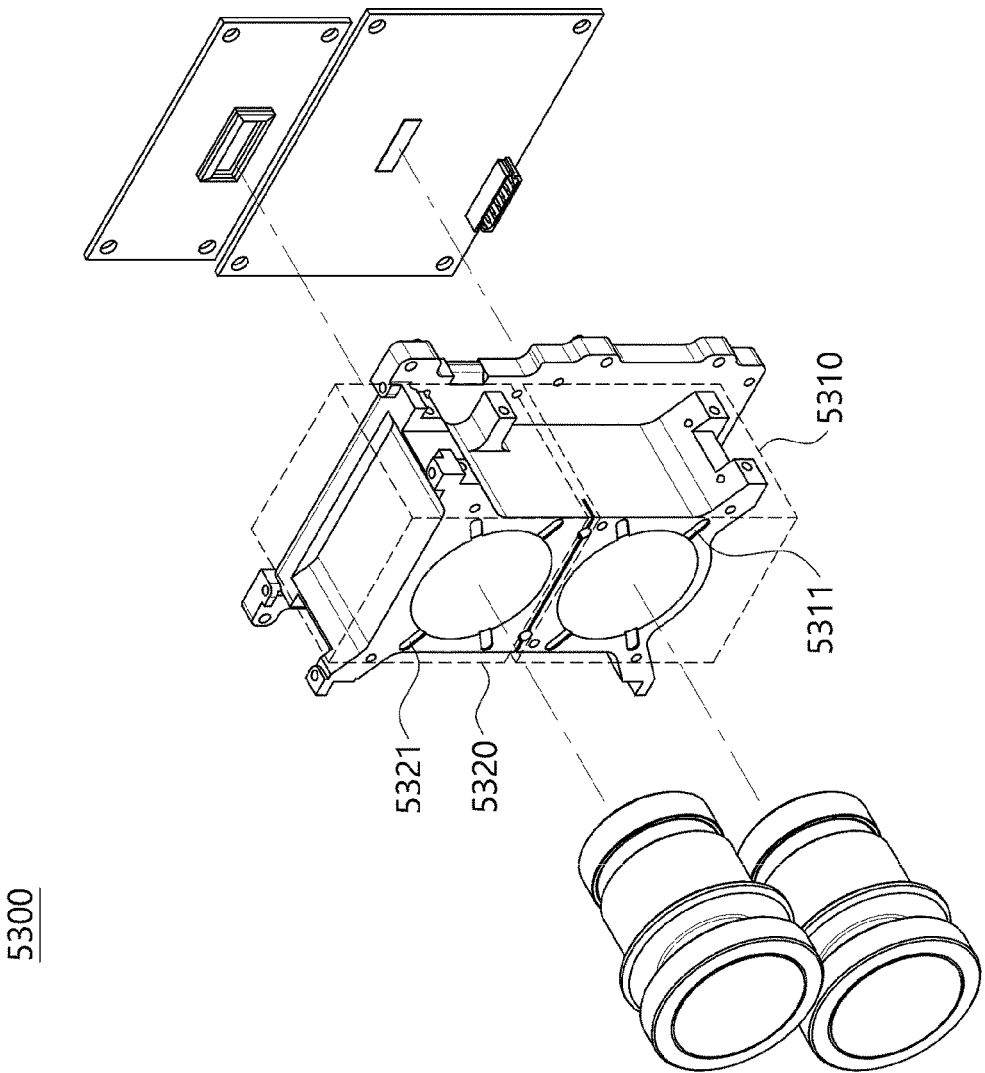

FIGS. 63 and 64 are diagrams for describing an emitting optic holder and a detecting optic holder according to one embodiment.

Referring to FIGS. 63 and 64, a LiDAR device 5300 according to one embodiment may include an emitting optic holder 5310 and a detecting optic holder 5320.

In this case, since the above-described contents may be applied to the emitting optic holder 5310 and the detecting optic holder 5320, repetitive descriptions will be omitted.

The emitting optic holder 5310 according to one embodiment may include one or more sliding grooves 5311.

For example, the emitting optic holder 5310 according to one embodiment may include an insertion hole into which at least a portion of an emitting optic module is inserted, and the one or more sliding grooves 5311 may be formed around the insertion hole, but the present invention is not limited thereto.

The sliding grooves 5311 may be grooves in which one or more fixers are located.

In this case, the one or more fixers will be described in more detail below.

In addition, the detecting optic holder 5320 according to one embodiment may include one or more sliding grooves 5321.

For example, the detecting optic holder 5320 according to one embodiment may include an insertion hole into which at least a portion of a detecting optic module is inserted, and the one or more sliding grooves 5321 may be formed around the insertion hole, but the present invention is not limited thereto.

The sliding grooves 5321 may be grooves in which one or more fixers are located.

In this case, the one or more fixers will be described in more detail below.

In addition, FIG. 64 is a diagram for describing one embodiment of the LiDAR device of FIG. 63, and the contents described in FIG. 63 and the present invention are not limited to the shape shown in FIG. 64.

Figure 65:
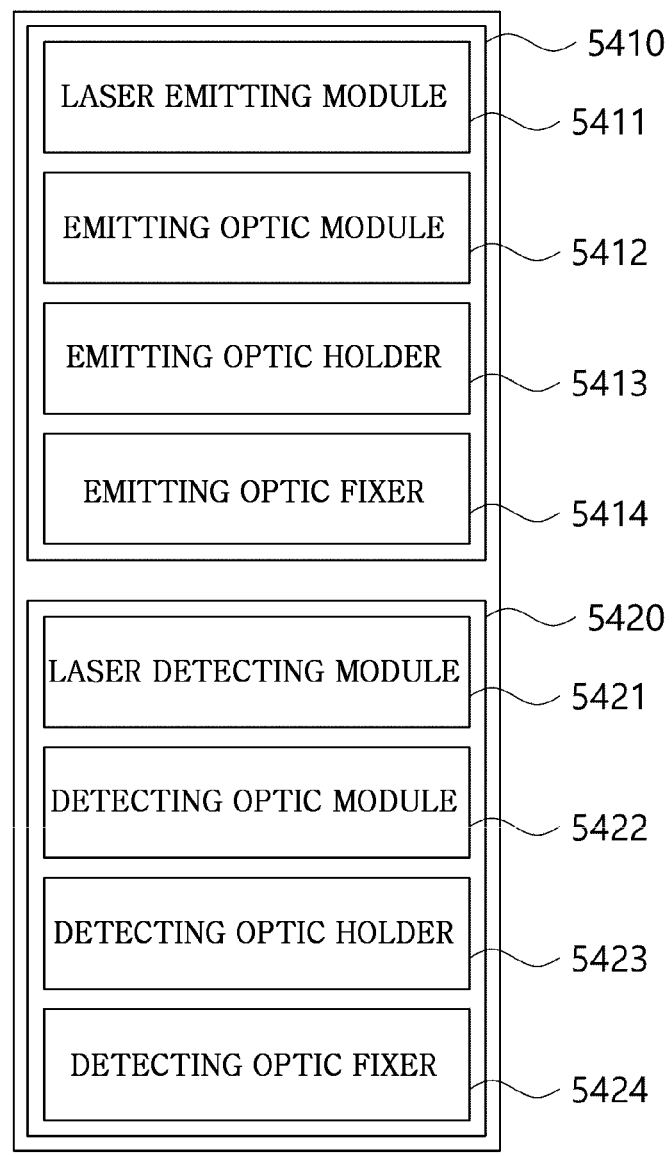
FIGS. 65 and 66 are diagrams for describing a LiDAR device according to one embodiment.
Figure 66:
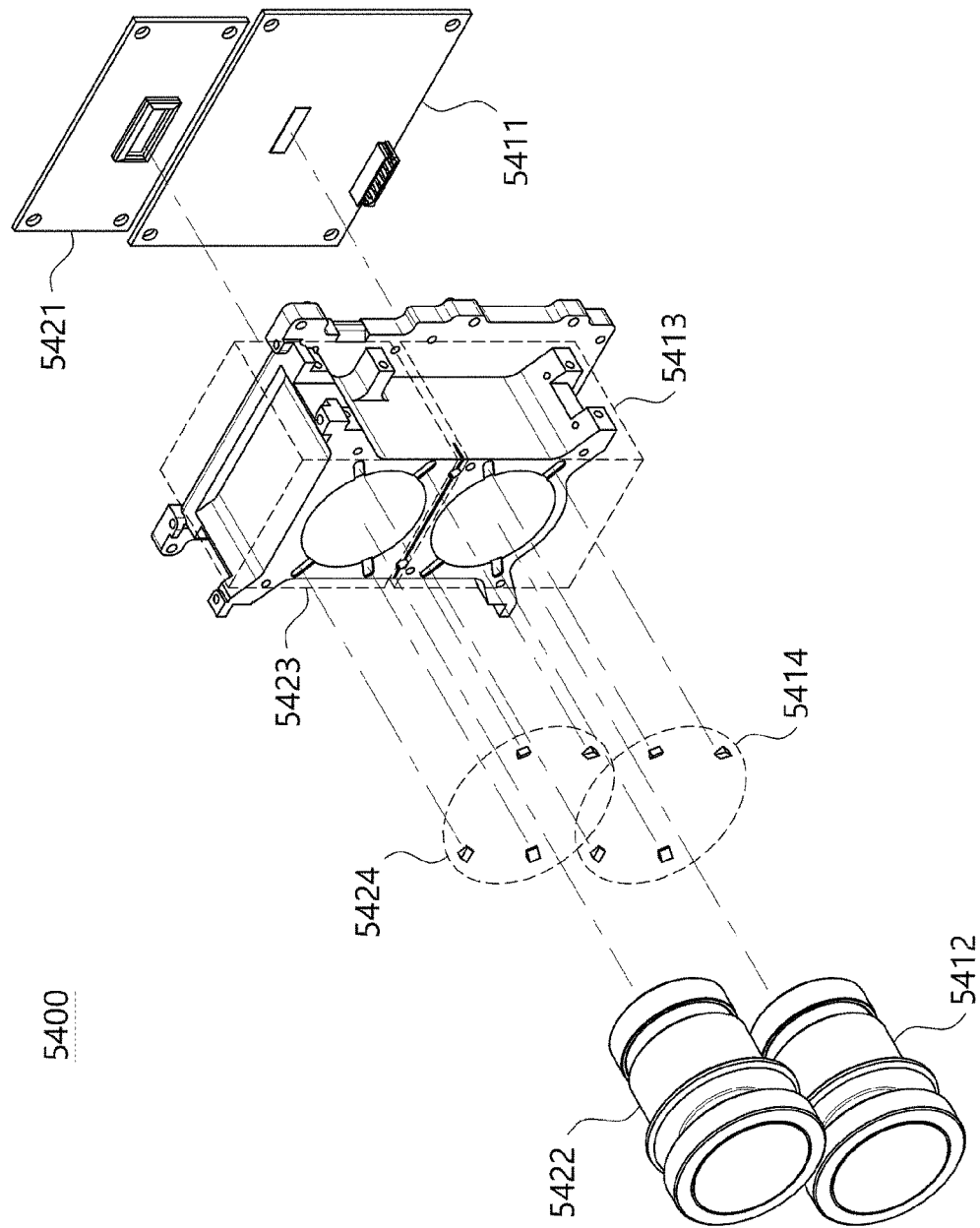

FIGS. 65 and 66 are diagrams for describing a LiDAR device according to one embodiment.

Referring to FIGS. 65 and 66, a LiDAR device 5400 according to one embodiment may include a transmitting module 5410 and a receiving module 5420.

The transmitting module 5410 according to one embodiment may include a laser emitting module 5411, an emitting optic module 5412, an emitting optic holder 5413, and emitting optic fixers 5414.

In this case, since the above-described contents may be applied to the transmitting module 5410, the laser emitting module 5411, the emitting optic module 5412, and the emitting optic holder 5413, repetitive descriptions will be omitted.

The emitting optic fixer 5414 according to one embodiment may be disposed to fix a relative position between the laser emitting module 5411 and the emitting optic module 5412.

In addition, the emitting optic fixer 5414 according to one embodiment may be located between the laser emitting module 5411 and the emitting optic module 5412.

Furthermore, the emitting optic fixer 5414 according to one embodiment may be located between the emitting optic holder 5413 and the emitting optic module 5412.

For example, the emitting optic fixer 5414 according to one embodiment may be located between the emitting optic holder 5413 and the emitting optic module 5412 such that one end thereof is contact with the emitting optic holder 5413, and the other end thereof is in contact with the emitting optic module 5412.

In addition, the emitting optic fixers 5414 according to one embodiment may include two or more emitting optic fixers.

For example, as shown in FIG. 66, the emitting optic fixers 5414 may include four emitting optic fixers, but the present invention is not limited thereto.

In this case, intervals between the emitting optic fixers 5414 may be the same.

In addition, the intervals between the emitting optic fixers 5414 may be different from each other.

For example, as shown in FIG. 66, in the intervals between the emitting optic fixers 5414, an interval between an upper optic fixer and a lower emitting optic fixer may be less than an interval between a left optic fixer and a right emitting optic fixer, but the present invention is not limited thereto.

In addition, the emitting optic fixers 5414 may be located in one or more sliding grooves included in the emitting optic holder 5413.

For example, when the emitting optic fixers 5414 include four emitting optic fixers and the emitting optic holder 5413 includes four sliding grooves, each of the four emitting optic fixers may be located in each of the four sliding grooves, but the present invention is not limited thereto.

In addition, at least a portion of the emitting optic fixer 5414 may be impregnated with a curing material (not shown).

For example, after a curing material is applied between the emitting optic holder 5413 and the emitting optic module 5412, when the emitting optic fixer 5414 slides toward the emitting optic module 5412 along the sliding groove of the emitting optic holder 5413 and the emitting optic fixer 5414 supports the emitting optic module 5412, the curing material may be cured so that at least a portion of the emitting optic fixer 5414 may be impregnated with the curing material, but the present invention is not limited thereto.

In this case, the curing material may be a material for fixing a relative positional relationship between the laser emitting module 5411 and the emitting optic module 5412.

In addition, the curing material may include an epoxy or the like, but the present invention is not limited thereto.

Furthermore, the curing material may be located between the emitting optic holder 5413 and the emitting optic module 5412.

In addition, the receiving module 5420 according to one embodiment may include a laser detecting module 5421, a detecting optic module 5422, a detecting optic holder 5423, and detecting optic fixers 5424.

In this case, since the above-described contents may be applied to the receiving module 5420, the laser detecting module 5421, the detecting optic module 5422, and the detecting optic holder 5423, repetitive descriptions will be omitted.

The detecting optic fixer 5424 according to one embodiment may be disposed to fix a relative position between the laser detecting module 5421 and the detecting optic module 5422.

In addition, the detecting optic fixer 5424 according to one embodiment may be located between the laser detecting module 5421 and the detecting optic module 5422.

Furthermore, the detecting optic fixer 5424 according to one embodiment may be located between the detecting optic holder 5423 and the detecting optic module 5422.

For example, the detecting optic fixer 5424 according to one embodiment may be located between the detecting optic holder 5423 and the detecting optic module 5422 such that one end thereof is in contact with the detecting optic holder 5423 and the other end thereof is in contact with the detecting optic module 5422, but the present invention is not limited thereto.

In addition, the detecting optic fixers 5424 according to one embodiment may include two or more detecting optic fixers.

For example, as shown in FIG. 66, the detecting optic fixers 5424 may include four detecting optic fixers, but the present invention is not limited thereto.

In this case, intervals between the detecting optic fixers 5424 may be the same.

Furthermore, the intervals between the detecting optic fixers 5424 may be different from each other.

For example, as shown in FIG. 66, in the intervals between the detecting optic fixers 5424, an interval between an upper detecting optic fixer and a lower detecting optic fixer may be less than an interval between a left detecting optic fixer and a right detecting optic fixer, but the present invention is not limited thereto.

In addition, the detecting optic fixers 5424 may be located in one or more sliding grooves included in the detecting optic holder 5423.

For example, when the detecting optic fixers 5424 includes four detecting optic fixers and the detecting optic holder 5423 includes four sliding grooves, each of the four detecting optic fixers may be located in each of the four sliding grooves, but the present invention is not limited thereto.

In addition, at least a portion of the detecting optic fixer 5424 may be impregnated with a curing material (not shown).

For example, after a curing material is applied between the detecting optic holder 5423 and the detecting optic module 5422, when the detecting optic fixer 5424 slides toward the detecting optic module 5422 along the sliding groove of the detecting optic holder 5423 and the detecting optic fixer 5424 supports the detecting optic module 5422, the curing material may be cured so that at least a portion of the detecting optic fixer 5424 may be impregnated with the curing material, but the present invention is not limited thereto.

In this case, the curing material may be a material for fixing a relative positional relationship between the laser detecting module 5421 and the detecting optic module 5422.

In addition, the curing material may include an epoxy or the like, but the present invention is not limited thereto.

In addition, the curing material may be located between the detecting optic holder 5423 and the detecting optic module 5422.

Furthermore, FIG. 66 is a diagram for describing one embodiment of the LiDAR device of FIG. 65, and the contents described in FIG. 65 and the present invention are not limited to the shape shown in FIG. 66.

Figure 67:
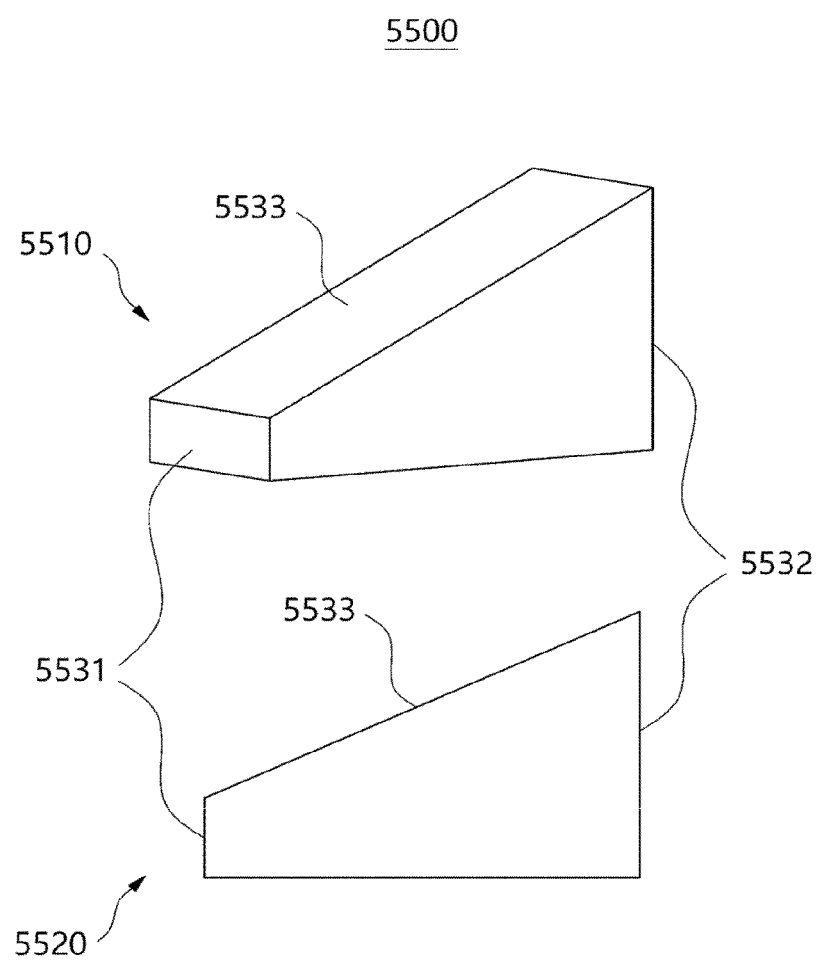
FIG. 67 shows views for describing a fixer according to one embodiment.

FIG. 67 shows views for describing a fixer according to one embodiment.

Referring to FIG. 67, a perspective view 5510 and a side view 5520 of a fixer 5500 according to one exemplary embodiment are shown.

In this case, the fixer 5500 may correspond to the above-described emitting optic fixer and detecting optic fixer.

Referring to FIG. 67, the fixer 5500 according to one embodiment may be provided in a hexahedral shape.

For example, referring to FIG. 67, the fixer 5500 according to one embodiment may be provided in a hexahedral shape in which a size of a first surface 5531 is different from a size of a second surface 5532 opposite to the first surface 5531, but the present invention is not limited thereto.

In addition, for example, referring to FIG. 67, the fixer 5500 according to one embodiment may be provided in the hexahedral shape in which the size of the first surface 5531 is smaller than the size of the second surface 5532, but the present invention is not limited thereto.

Furthermore, the fixer 5500 according to one embodiment may include an inclined surface 5533.

In this case, the inclined surface 5533 is formed to cover various distances according to a relative positional relationship between an optic holder (an emitting optic holder or a detecting optic holder) and an optic module (an emitting optic module or a detecting optic module).

In addition, the fixer 5500 according to the embodiment is disposed such that the first surface 5531, which has a size smaller than that of the second surface 5532, faces the above-described optic module (the emitting optic module or the detecting optic module).

Figure 68:
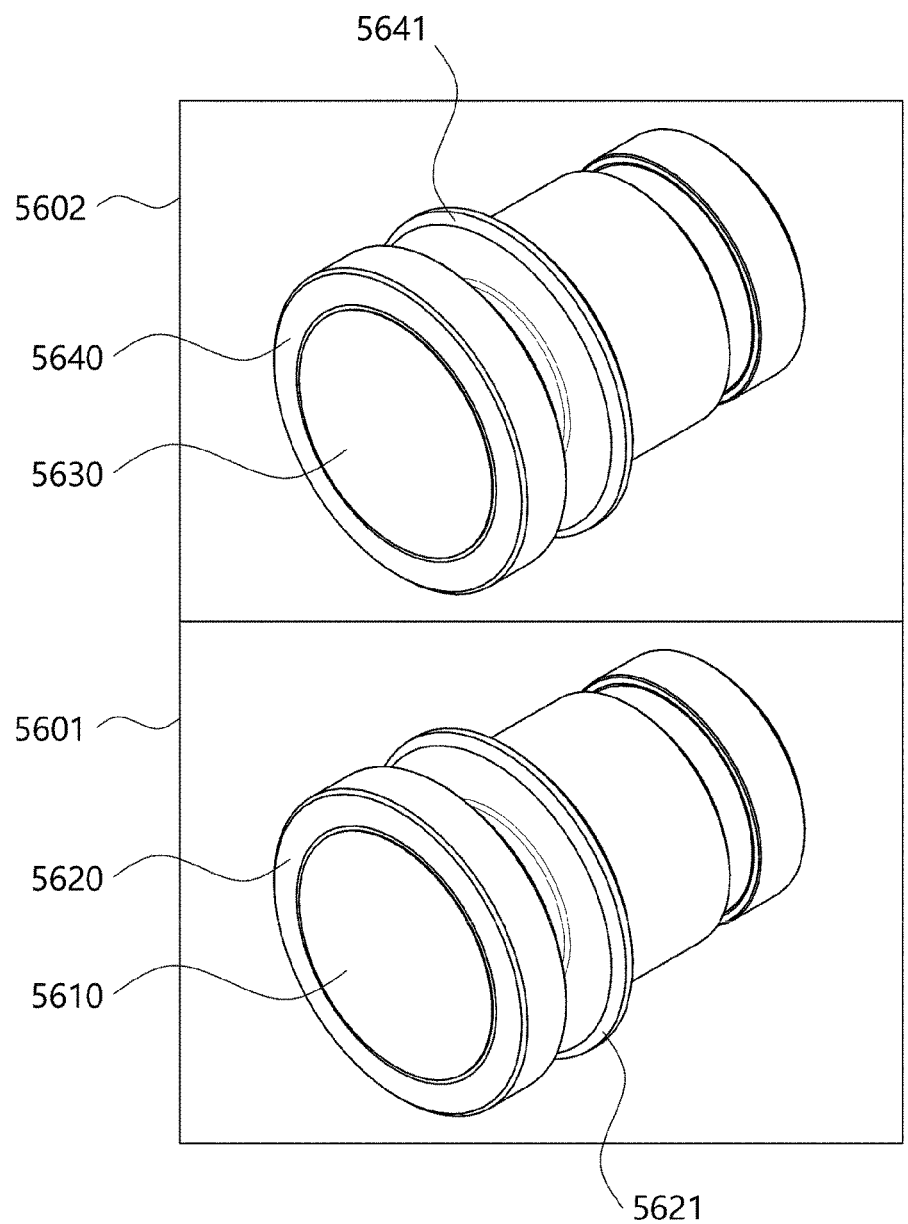
FIG. 68 is a diagram for describing an emitting optic module and a detecting optic module according to one embodiment.

FIG. 68 is a diagram for describing an emitting optic module and a detecting optic module according to one embodiment.

Referring to FIG. 68, an emitting optic module 5601 according to one embodiment may include an emitting lens assembly 5610 and an emitting lens mounting tube 5620.

In this case, since the above-described contents may be applied to the emitting lens assembly 5610 and the emitting lens mounting tube 5620, repetitive descriptions will be omitted.

The emitting lens mounting tube 5620 according to one embodiment may include a first stopper 5621.

In this case, when the emitting optic module 5601 is inserted into the hole included in the above-described emitting optic holder, the first stopper 5621 may restrict a degree in which the emitting optic module 5601 is inserted.

For example, a diameter of the first stopper 5621 may be formed to be greater than a diameter of the hole included in the emitting optic holder, and thus, the first stopper 5621 may restrict the degree in which the emitting optic module 5601 is inserted such that the emitting optic module 5601 is not inserted beyond a position at which the first stopper 5621 is located, but the present invention is not limited thereto.

In addition, the first stopper 5621 may be formed in various shapes other than the shape shown in FIG. 68 so as to restrict the degree in which the emitting optic module 5601 is inserted into the hole included in the emitting optic holder.

Referring to FIG. 68, a detecting optic module 5602 according to one embodiment may include a detecting lens assembly 5630 and a detecting lens mounting tube 5640.

In this case, since the above-described contents may be applied to the detecting lens assembly 5630 and the detecting lens mounting tube 5640, repetitive descriptions will be omitted.

The detecting lens mounting tube 5640 according to one embodiment may include a second stopper 5641.

In this case, when the detecting optic module 5602 is inserted into the hole included in the above-described detecting optic holder, the second stopper 5641 may restrict a degree in which the detecting optic module 5602 is inserted.

For example, a diameter of the second stopper 5641 may be formed to be greater than a diameter of the hole included in the detecting optic holder, and thus, the second stopper 5641 may restrict the degree in which the detecting optic module 5602 is inserted such that the detecting optic module 5602 is not inserted beyond a position at which the second stopper 5641 is located, but the present invention is not limited thereto.

In addition, the second stopper 5641 may be formed in various shapes other than the shape shown in FIG. 68 so as to restrict the degree in which the detecting optic module 5602 is inserted into the hole included in the detecting optic holder.

Figure 69:
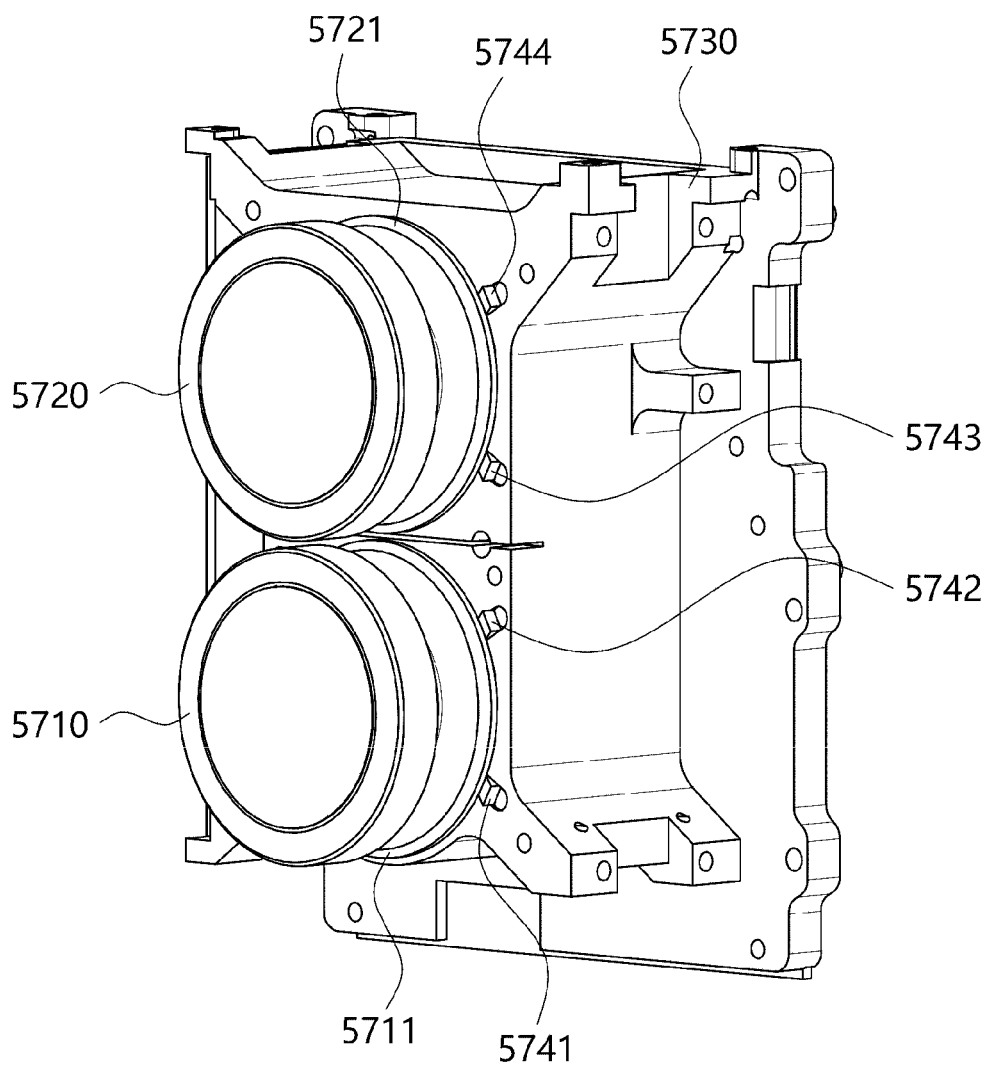
FIG. 69 is a diagram for describing a LiDAR device according to one embodiment.

FIG. 69 is a diagram for describing a LiDAR device according to one embodiment.

Referring to FIG. 69, a LiDAR device 5700 according to one embodiment may include a laser emitting module (not shown), a laser detecting module (not shown), an emitting optic module 5710, a detecting optic module 5720, an optic holder 5730, and fixers 5741 to 5744.

In this case, since the above-described contents may be applied to the laser emitting module (not shown), the laser detecting module (not shown), the emitting optic module 5710, the detecting optic module 5720, the optic holder 5730, and the fixers 5741 to 5744, repetitive descriptions will be omitted.

The laser emitting module (not shown) according to one embodiment may emit a laser.

In addition, the laser detecting module (not shown) according to one embodiment may detect a laser.

Furthermore, the emitting optic module 5710 according to one embodiment may guide light generated from the laser emitting module (not shown) to the outside of the LiDAR device 5700.

In addition, the detecting optic module 5720 according to one embodiment may guide light received from the outside of the LiDAR device 5700 to the laser detecting module (not shown).

Furthermore, the emitting optic module 5710 according to one embodiment may include an emitting lens assembly and an emitting lens mounting tube.

In addition, the detecting optic module 5720 according to one embodiment may include a detecting lens assembly and a detecting lens mounting tube.

Furthermore, the optic holder 5730 according to one embodiment may include a first hole into which the emitting lens mounting tube is inserted.

In addition, the first hole included in the optic holder 5730 according to one embodiment may be aligned with the laser emitting module (not shown).

Furthermore, the optic holder 5730 according to one embodiment may include a second hole into which the detecting lens mounting tube is inserted.

In addition, the second hole included in the optic holder 5730 according to one embodiment may be aligned with the laser detecting module (not shown).

Furthermore, the emitting lens mounting tube according to one embodiment may include a first stopper 5711 for restricting a degree in which the emitting lens mounting tube is inserted into the first hole.

In addition, the detecting lens mounting tube according to one embodiment may include a second stopper 5721 for restricting a degree in which the detecting lens mounting tube is inserted into the second hole.

Furthermore, a first fixer 5741 and a second fixer 5742 may be disposed between the first stopper 5711 and the optic holder 5730.

In addition, the first fixer 5741 and the second fixer 5742 may be provided to maintain a relative positional relationship between the emitting optic module 5710 and the laser emitting module (not shown).

Furthermore, a third fixer 5743 and a fourth fixer 5744 may be disposed between the second stopper 5721 and the optic holder 5730.

In addition, the third fixer 5743 and the fourth fixer 5744 may be provided to maintain a relative positional relationship between the detecting optic module 5720 and the laser detecting module (not shown).

According to one embodiment of the present invention, there can be provided a LiDAR device including a laser emitting array and a laser detecting array that are disposed differently.

According to another embodiment of the present invention, there can be provided a method of processing data of a LiDAR device including a laser emitting array and a laser detecting array that are disposed differently.

According to one embodiment of the present invention, there can be provided a LiDAR device in which the alignment between a laser emitting module and an emitting optic module is maintained and the alignment between a laser detecting module and a detecting optic module is maintained.

Effects of the present invention may not be limited to the above, and other effects which are not described herein should be clearly understood by those skilled in the art, to which the present invention belongs, from the present specification and the accompanying drawings.

Methods according to embodiments may be implemented in the form of program instructions executable through various computing means and may be recorded on computer readable media. The computer-readable media may include, independently or in combination, program instructions, data files, data structures, and so on. Program instructions recorded on the media may be specially designed and configured for the embodiments or may be generally known by those skilled in the computer software field. Computer-readable recording media may include magnetic media such as hard disks, floppy disks, and magnetic tapes, optical media such as a compact disc read only memory (CD-ROM) and a digital versatile disc (DVD), magneto-optical media such as floptical disks, and hardware units, such as a read only memory (ROM), a random access memory (RAM), a flash memory, and so on, which are intentionally formed to store and perform program instructions. Program instructions may include high-class language code executable by computers using interpreters, as well as machine language code such as that made by compilers. The hardware units may be configured to function as one or more software modules for performing the operations according to the embodiments of the present invention, and vice versa.

While embodiments of the present invention have been shown and described with reference to the accompanying drawings thereof, it will be understood by those skilled in the art that various changes and modifications in form and details may be made therein. For example, desired results may be achieved although the embodiments of the present invention are performed in other sequences different from the descriptions, and/or the elements, such as a system, a structure, a device, a circuit, and so on, are combined or assembled in other ways different from the descriptions, or replaced or substituted with other elements or their equivalents.

Therefore, other implementations, other embodiments, and equivalents of the appended claims may be included in the scope of the appended claims.

What is claimed is:

1. A light detection and ranging (LiDAR) device comprising:
   a laser emitting chip configured to emit laser;
   a laser detecting chip configured to detect laser;
   an emitting optic module configured to guide laser generated from the laser emitting chip to the outside of the LiDAR device;
   a detecting optic module configured to guide laser received from the outside of the LiDAR device to the laser detecting chip;
   an emitting optic holder located between the laser emitting chip and the emitting optic module; and
   an at least one emitting optic fixer located between the emitting optic holder and the emitting optic module, wherein the at least one emitting optic fixer is configured to fix a relative position between the laser emitting chip and the emitting optic module;
   wherein the emitting optic holder includes at least one sliding groove,
   wherein the at least one emitting optic fixer is located on the at least one sliding groove of the emitting optic holder,
   wherein the at least one emitting optic fixer includes a first surface and a second surface opposite the first surface,
   wherein a size of the first surface is smaller than a size of the second surface, and
   wherein the first surface included in the at least one emitting optic fixer is located closer to the emitting optic module than the second surface.

2. The LiDAR device of claim 1, wherein the LiDAR device further comprises:
   a first cured material located between the emitting optic holder and the emitting optic module,
   wherein the at least one emitting optic fixer is at least partially impregnated in the first cured material.

3. The LiDAR device of claim 1, wherein the at least one emitting optic fixer include a third surface positioned between the first surface and the second surface,
   wherein the third surface is provided as an inclined surface.

4. The LiDAR device of claim 1, wherein the LiDAR device further comprises:
   a first cured material located between the emitting optic holder and the emitting optic module,
   wherein the first cured material includes epoxy.

5. The LiDAR device of claim 1, wherein the LiDAR device further comprises:
   a detecting optic holder located between the laser detecting chip and the detecting optic module.

6. The LiDAR device of claim 5, wherein the emitting optic holder and the detecting optic holder are integrally formed.

7. The LiDAR device of claim 5, wherein the LiDAR device further comprises:
   a second cured material and an at least one detecting optic fixer located between the detecting optic holder and the detecting optic module,
   wherein the detecting optic holder includes at least one sliding groove,
   wherein the at least one detecting optic fixer is located on the at least one sliding groove of the detecting optic holder.

8. The LiDAR device of claim 7, wherein a number of the at least one emitting optic fixer is the same as a number of the at least one detecting optic fixer.

9. The LiDAR device of claim 1, wherein the at least one emitting optic fixer includes at least three of emitting optic fixer.

10. The LiDAR device of claim 1, wherein the at least one emitting optic fixer includes a first emitting optic fixer, a second emitting optic fixer, a third emitting optic fixer and a fourth emitting optic fixer,
    wherein a distance between the first and the second emitting optic fixers is less than a distance between the second and third emitting optic fixers,
    wherein a distance between the third and fourth emitting optic fixers is less than a distance between the first and fourth emitting optic fixers.

11. The LiDAR device of claim 1, wherein the laser emitting chip includes a laser emitting array,
    wherein the laser detecting chip includes a laser detecting array,
    wherein the emitting optic module includes a first lens assembly and a first lens assembly mounting tube,
    wherein the detecting optic module includes a second lens assembly and a second lens assembly mounting tube.

12. The LiDAR device of claim 1, wherein the laser emitting array is provided as VCSEL (Vertical cavity surface emitting laser) array,
    wherein the laser detecting array is provided as SPAD (Single photon avalanche diode) array.

* * * * *